(12) United States Patent
Tsukidate

(10) Patent No.: US 9,053,962 B2
(45) Date of Patent: Jun. 9, 2015

(54) SEMICONDUCTOR DEVICE AND FABRICATION PROCESS THEREOF

(71) Applicant: FUJITSU SEMICONDUCTOR LIMITED, Yokohama-shi, Kanagawa (JP)

(72) Inventor: Yoshikazu Tsukidate, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 13/862,894

(22) Filed: Apr. 15, 2013

(65) Prior Publication Data

US 2014/0008735 A1    Jan. 9, 2014

(30) Foreign Application Priority Data

Jul. 3, 2012   (JP) ................................ 2012-149745

(51) Int. Cl.

| H01L 27/088 | (2006.01) |
|---|---|
| H01L 29/66 | (2006.01) |
| H01L 29/786 | (2006.01) |
| H01L 27/02 | (2006.01) |
| H01L 27/092 | (2006.01) |
| H01L 29/78 | (2006.01) |
| H01L 21/8238 | (2006.01) |

(52) U.S. Cl.
CPC ........ *H01L 27/088* (2013.01); *H01L 29/66477* (2013.01); *H01L 29/78615* (2013.01); *H01L 21/823871* (2013.01); *H01L 21/823892* (2013.01); *H01L 27/0207* (2013.01); *H01L 27/092* (2013.01); *H01L 29/66575* (2013.01); *H01L 29/783* (2013.01)

(58) Field of Classification Search
CPC ......................... H01L 29/783; H01L 29/78615
USPC ................................................... 257/401, 413
See application file for complete search history.

(56) References Cited

U.S. PATENT DOCUMENTS

| 4,814,294 A | 3/1989 | West et al. |
|---|---|---|
| 6,512,299 B1 * | 1/2003 | Noda ............................ 257/774 |
| 6,927,461 B2 | 8/2005 | Kim et al. |
| 7,064,026 B2 | 6/2006 | Kim et al. |
| 2004/0142522 A1 | 7/2004 | Inoue et al. |
| 2007/0015334 A1 | 1/2007 | Kittl et al. |

FOREIGN PATENT DOCUMENTS

| JP | 2007-027727 A | 2/2007 |
|---|---|---|
| WO | 03/098698 A1 | 11/2003 |

OTHER PUBLICATIONS

G.A. West et al., "Chemical vapor deposition of cobalt silicide", Applied Physics Letters, vol. 53, No. 9, (1988).
Nicolet et al., "VLSI electronics, Microstructure Science, vol. 6", editors N. G. Einspruch and G. B. Larrabee, Academic Press, New York, 1983, chapter 6, pp. 457-458.

* cited by examiner

*Primary Examiner* — Mark Prenty
(74) *Attorney, Agent, or Firm* — Westerman, Hattori, Daniels & Adrian, LLP

(57) ABSTRACT

A disclosed semiconductor device includes a semiconductor substrate including a first area, a gate electrode formed over the first area of the semiconductor substrate, a first active region formed in the first area of the semiconductor substrate at a lateral side of the gate electrode, a first silicide layer formed at least on a sidewall surface of the gate electrode in the first area, the first silicide layer is electrically connected to the first active region.

8 Claims, 62 Drawing Sheets

X1-X1

X2-X2

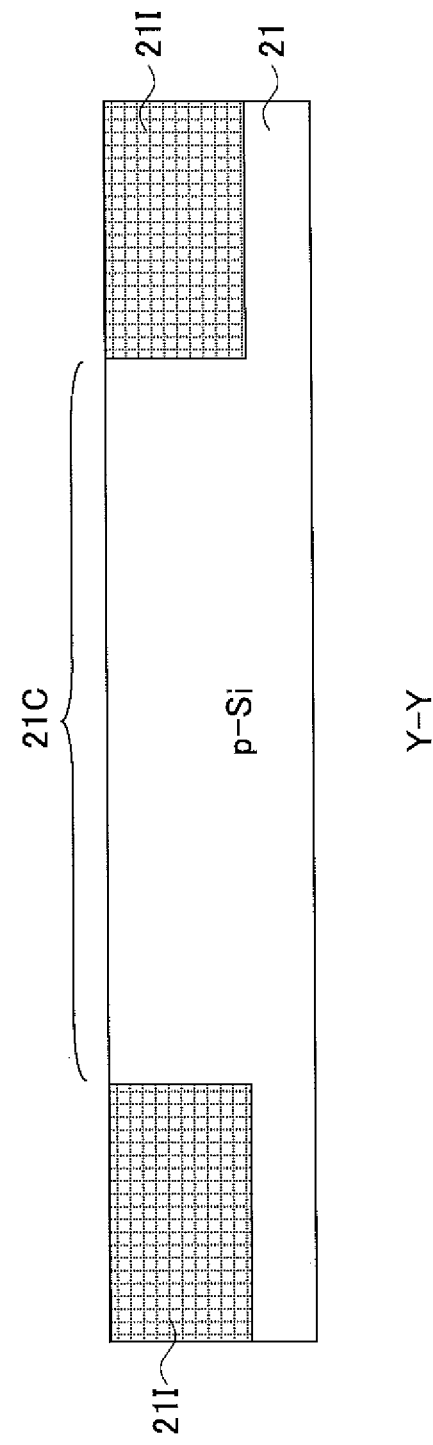

X1-X1

X2-X2

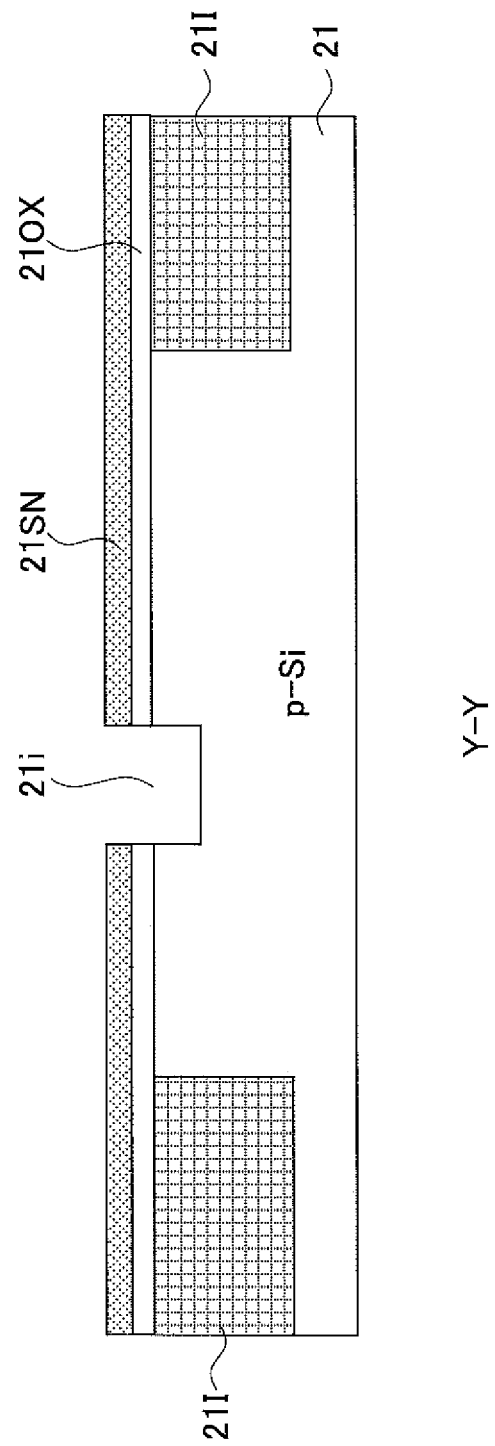

X1-X1

X2-X2

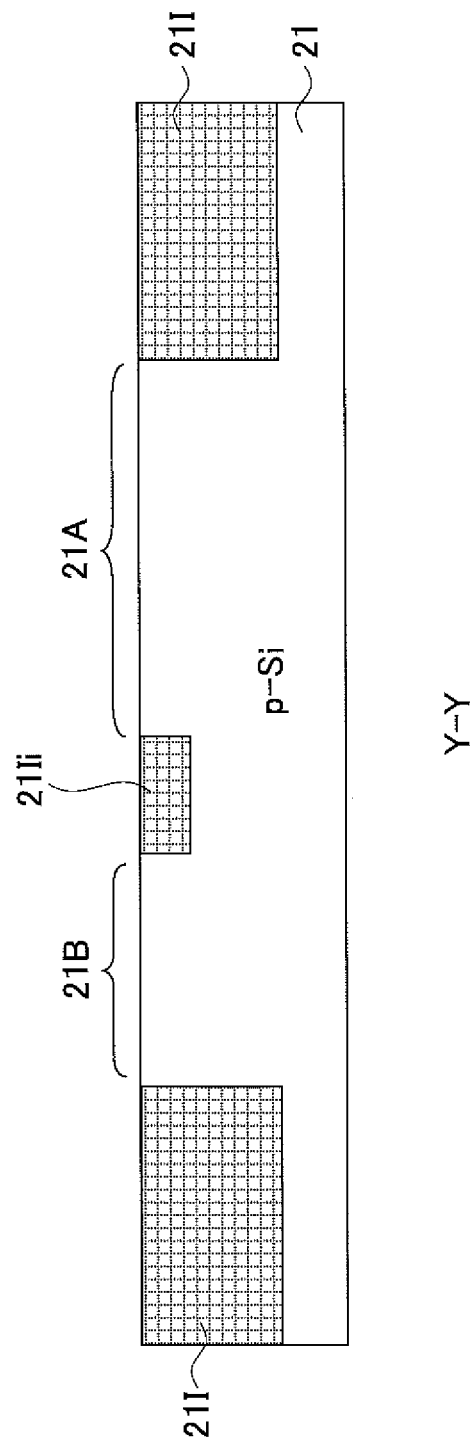

X1-X1

X2-X2

X1-X1

X2-X2

X1-X1

X2-X2

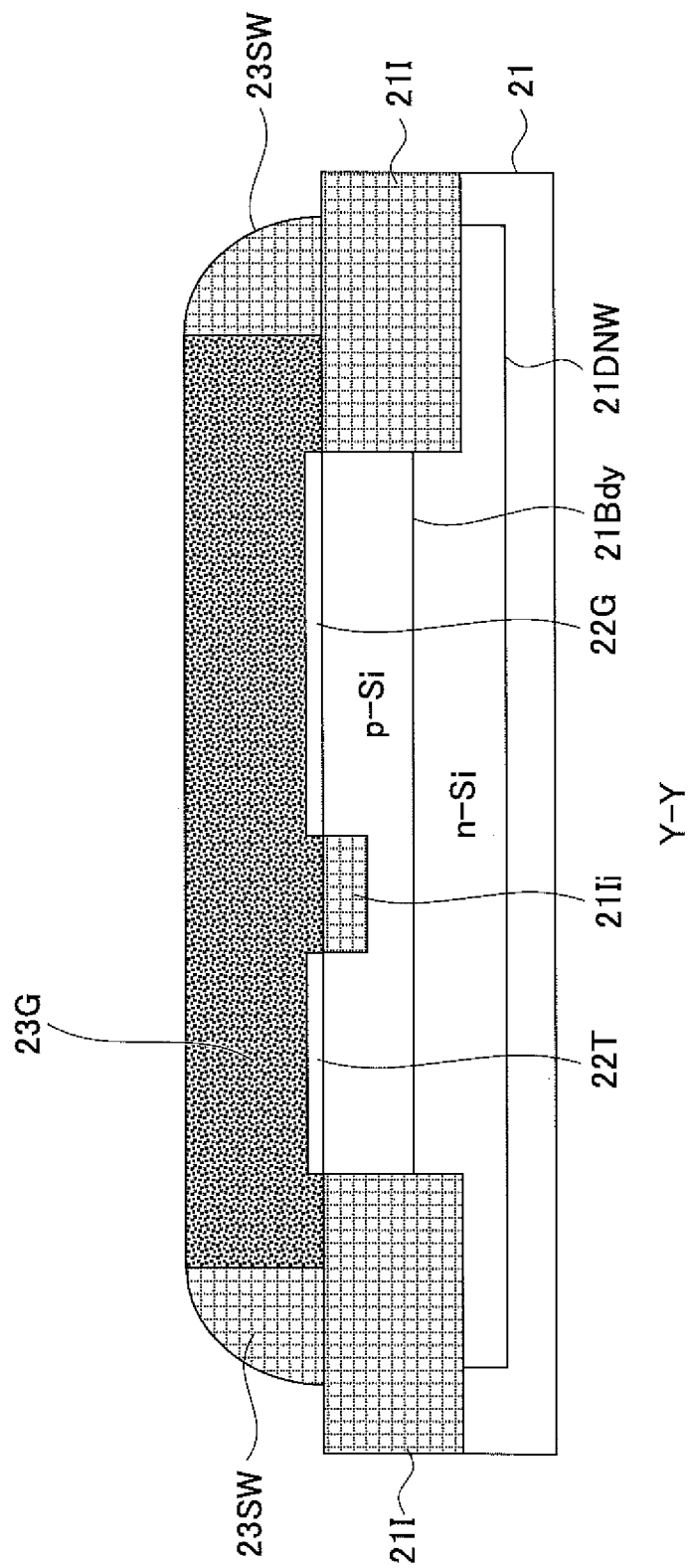

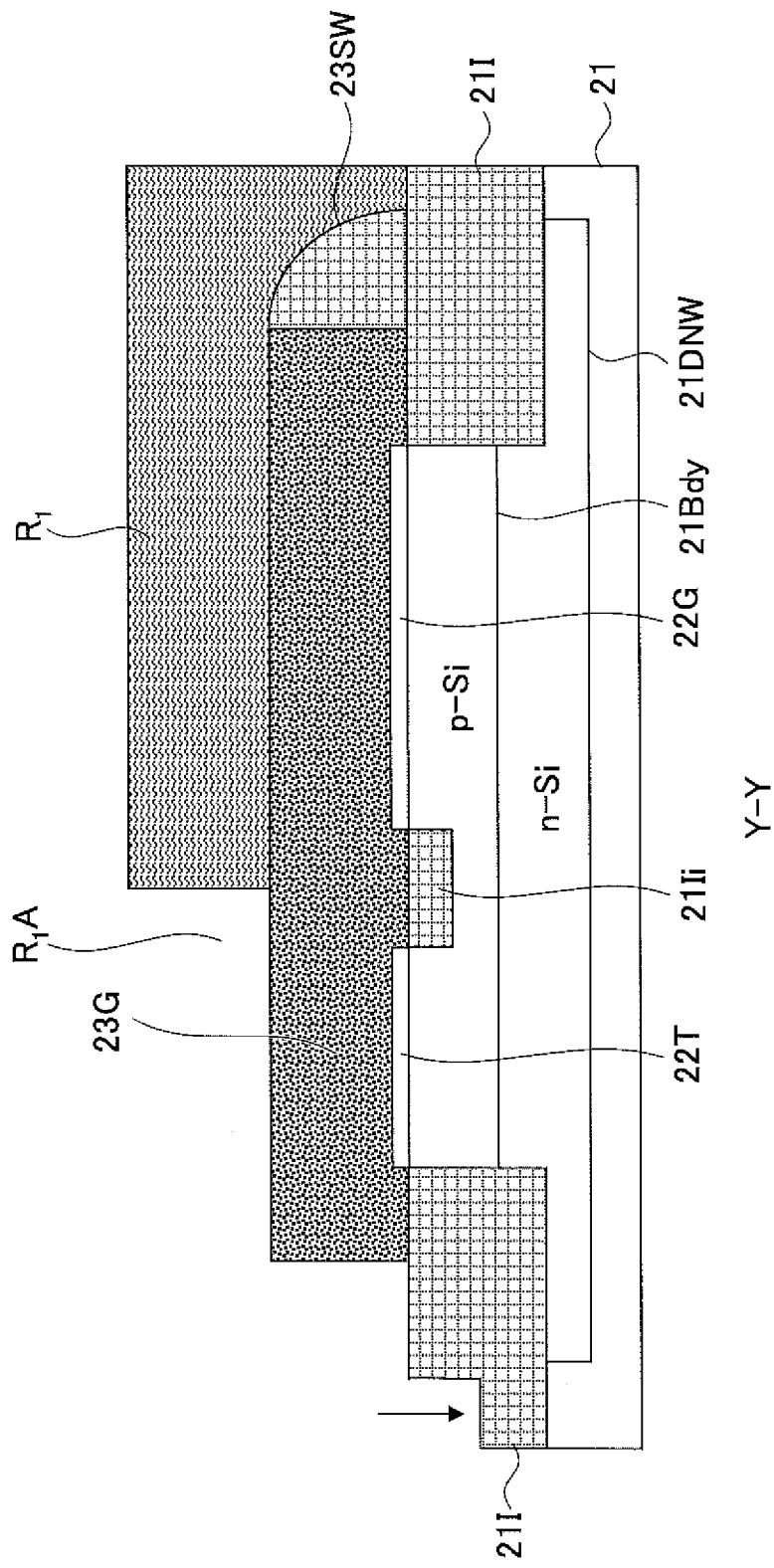

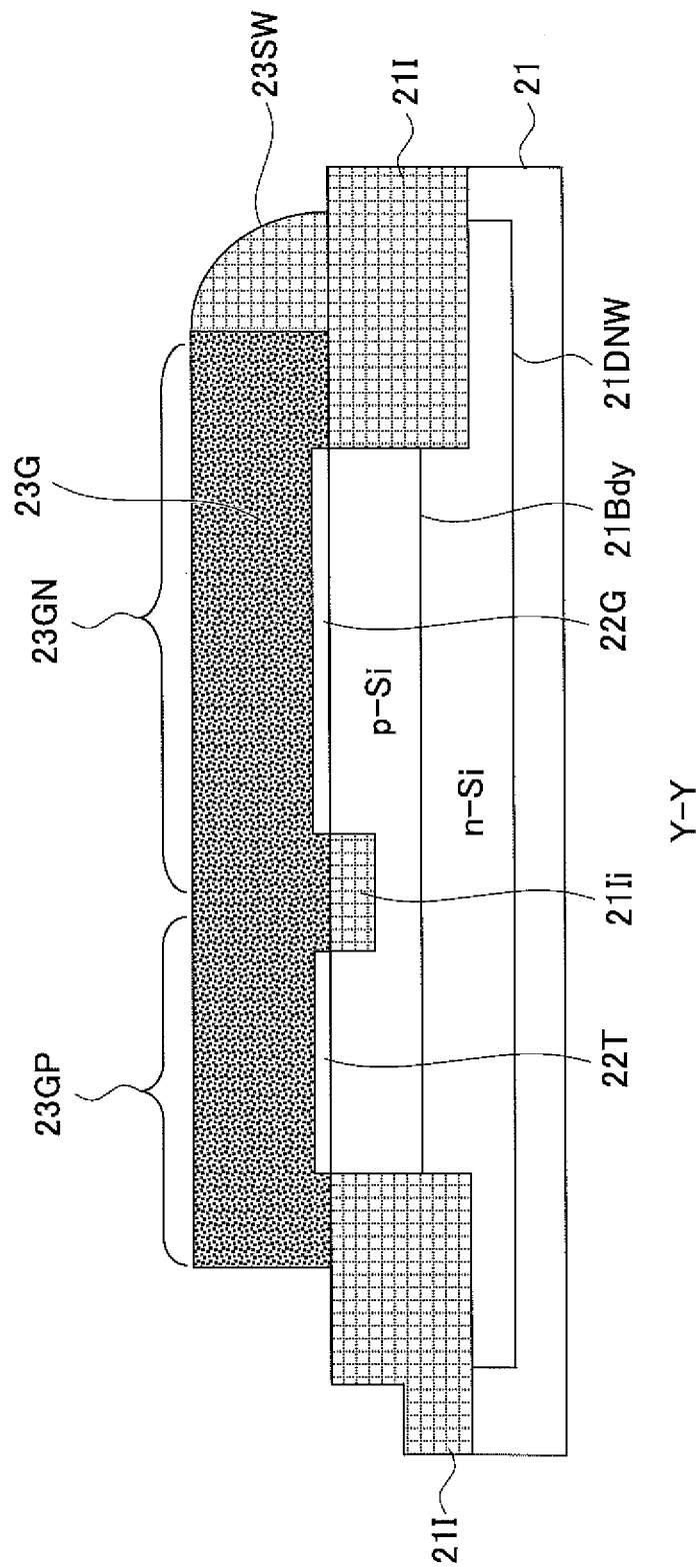

X1-X1

X2-X2

X1–X1

X2–X2

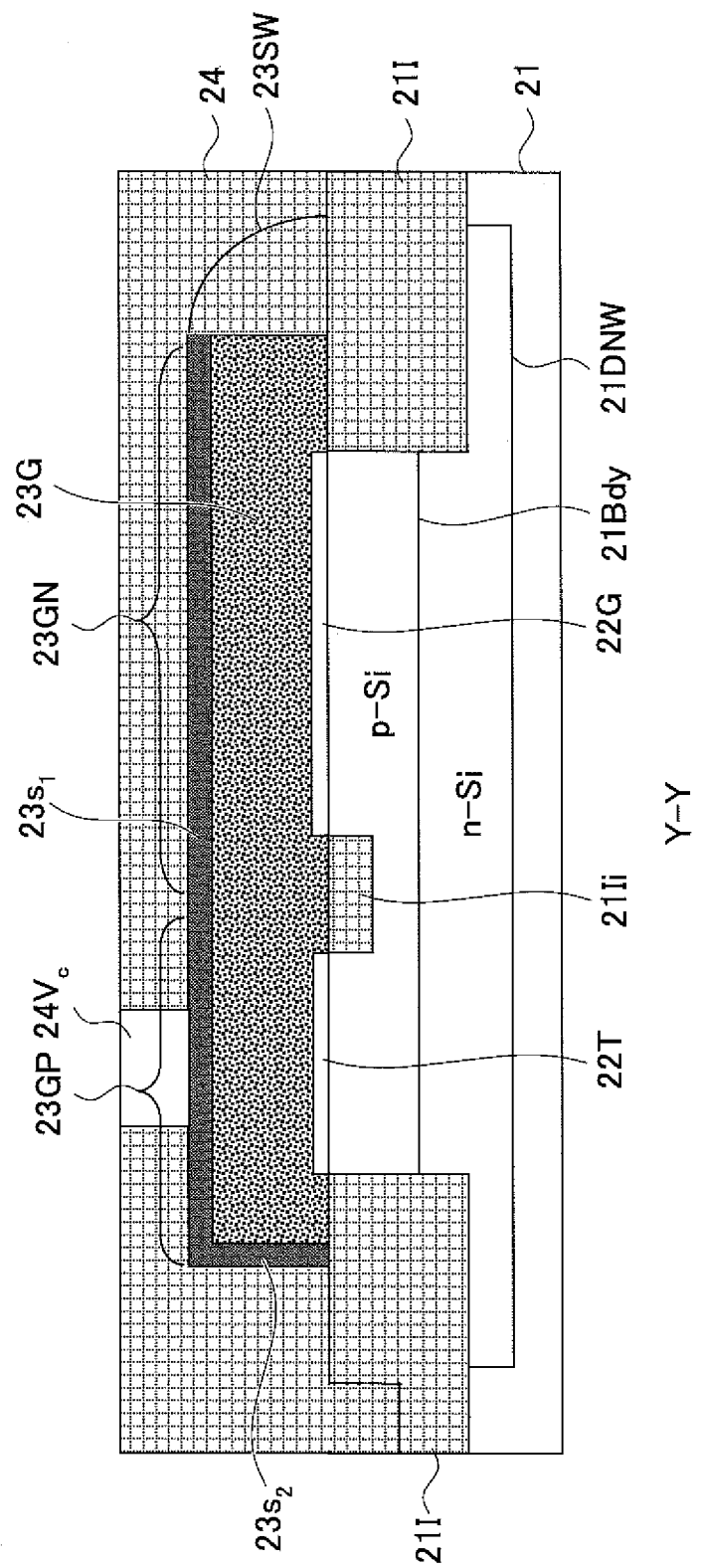

X1–X1

X2–X2

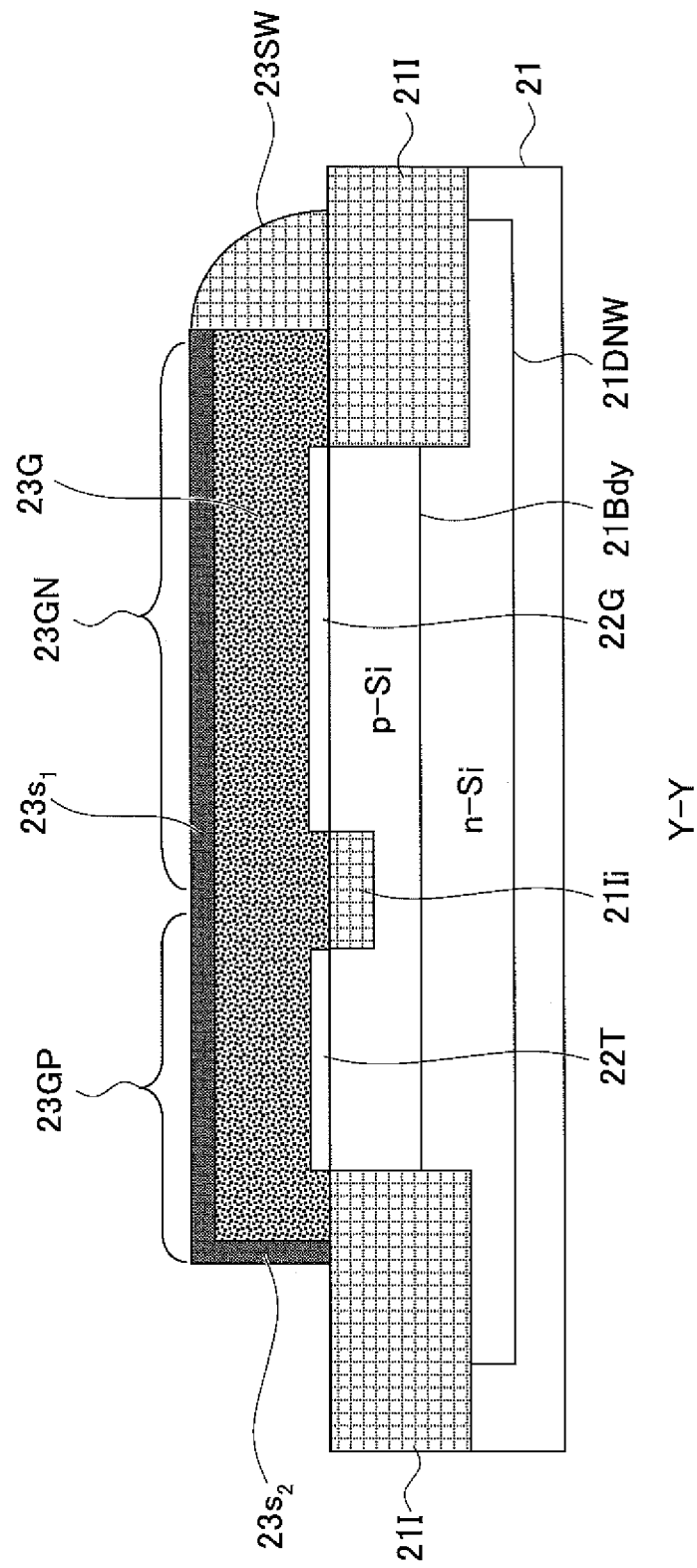

X1-X1

X2-X2

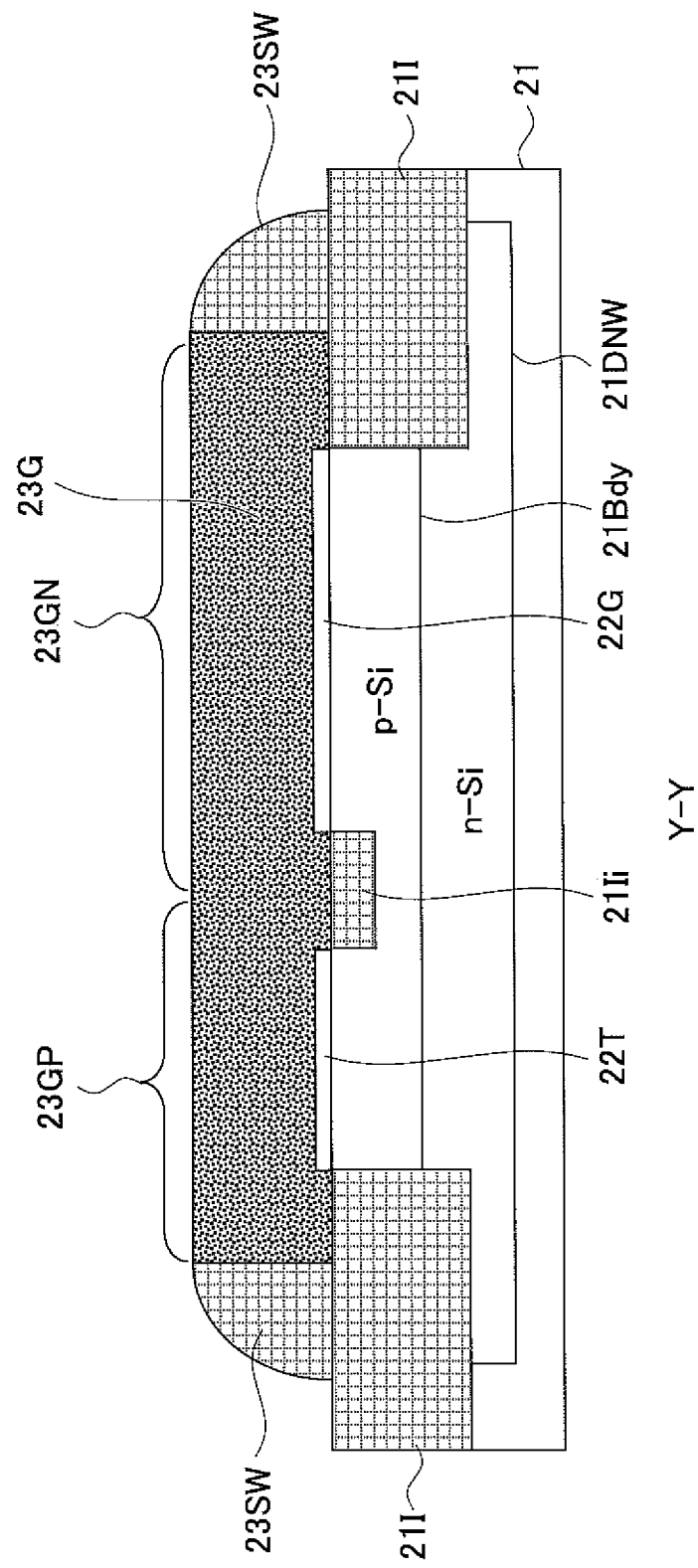

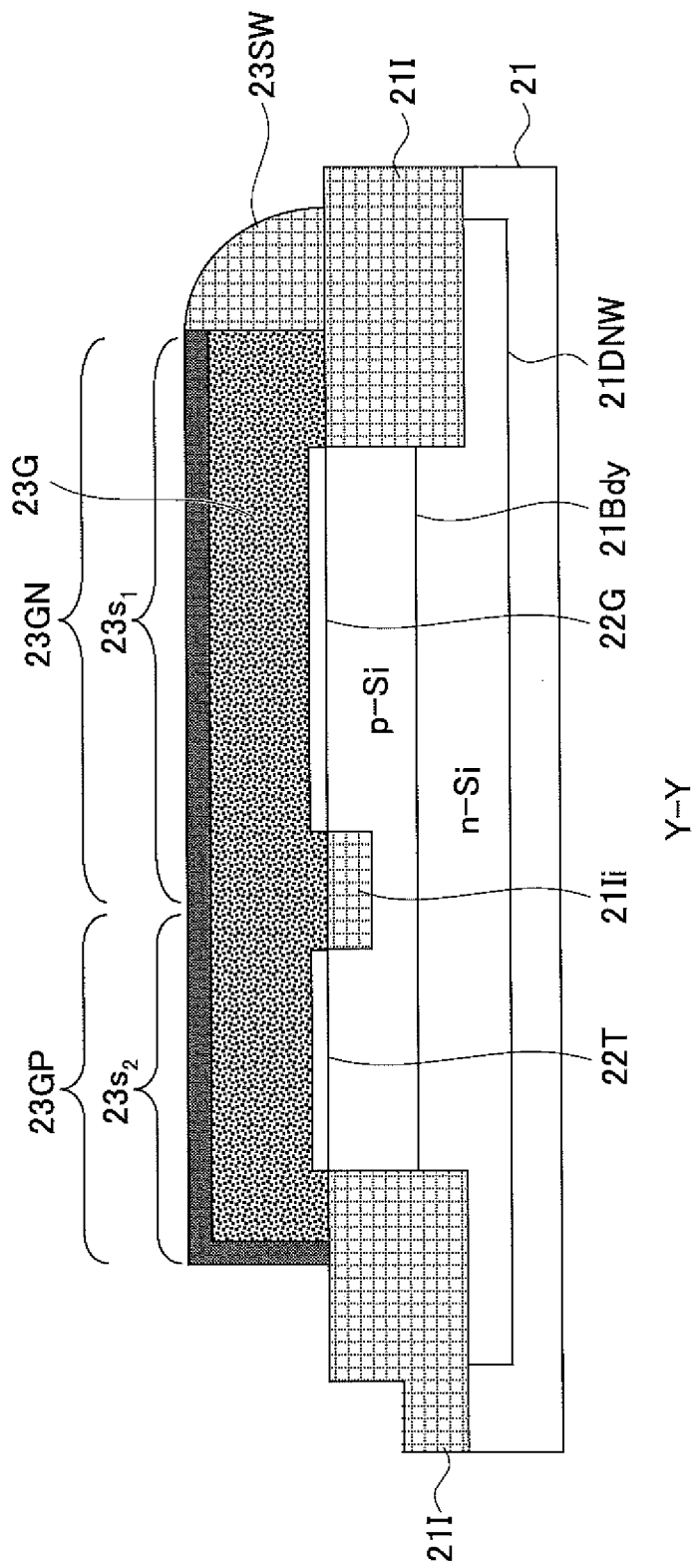

X1-X1

X2-X2

X1-X1

X2-X2

X1-X1

X2-X2

X2-X2

SEMICONDUCTOR DEVICE AND FABRICATION PROCESS THEREOF

CROSS-REFERENCE TO RELATED APPLICATIONS

This application is based upon and claims the benefit of priority of the prior Japanese Patent Application 2012-149745, filed on Jul. 3, 2012, the entire contents of which are hereby incorporated by reference.

FIELD

The embodiments described herein relate to semiconductor devices and fabrication method thereof.

BACKGROUND

In certain semiconductor devices such as dynamic threshold MOS (Dt-MOS) transistors, SRAMs, and the like, there arise cases in which a gate electrode is connected electrically to a surface of a semiconductor substrate by way of so-called shared contact plug.

A shared contact plug is a kind of via-plug usually formed in an elongated opening of an interlayer insulation film covering a gate electrode to electrically connect the gate electrode with the surface of a semiconductor substrate. The elongated opening exposes a top surface of the gate electrode and further a surface of a semiconductor substrate, and because of this, a shared contact plug generally has an elongating shape corresponding to the shape of the elongating opening. Usually, a gate electrode carries sidewall insulation films, and because of this, a shared contact has a tendency to extend from the top surface of the gate electrode to a distance beyond the sidewall insulation film in order to attain the contact with the surface of a semiconductor substrate. Thus, there has been a problem that a shared contact occupies a large area.

REFERENCES

[Patent Reference 1] WO03/098698
[Non-Patent Reference 1] Nicolet M. A. et al. "VLSI electronics, Microstructure Science, Vol. 6", editors N. G. Einspruch and G. B. Larrabee, Academic Press, New York, 1983, chapter 6, pages 457-458

SUMMARY

According to an embodiment, there is provided a semiconductor device that includes a semiconductor substrate including a first area, a gate electrode formed over the first area of the semiconductor substrate, a first active region formed in the first area of the semiconductor substrate at a lateral side of the gate electrode, a first silicide layer formed at least on a sidewall surface of the gate electrode in the first area, the first silicide layer is electrically connected to the first active region.

Additional objects and advantages of the embodiments will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

BRIEF DESCRIPTION OF DRAWINGS

FIGS. 7A-7C are first cross-sectional diagrams explaining the fabrication process of the semiconductor device according to the first embodiment;

FIGS. 8A-8C are second cross-sectional diagrams explaining the fabrication process of the semiconductor device according to the first embodiment;

FIGS. 9A-9C are third cross-sectional diagrams explaining the fabrication process of the semiconductor device according to the first embodiment;

FIGS. 14A-14C are eighth cross-sectional diagrams explaining the fabrication process of the semiconductor device according to the first embodiment.

FIGS. 15A-15C are ninth cross-sectional diagrams explaining the fabrication process of the semiconductor device according to the first embodiment;

FIGS. 16A-16C are tenth cross-sectional diagrams explaining the fabrication process of the semiconductor device according to the first embodiment;

FIGS. 19A-19C are thirteenth cross-sectional diagrams explaining the fabrication process of the semiconductor device according to the first embodiment;

FIGS. 27A-27C are cross-sectional diagrams of the semiconductor device corresponding to the modification of FIG. 26;

FIGS. 28A-28C are first cross-sectional diagrams representing the process of fabricating a semiconductor device according to a second modification of the first embodiment;

FIGS. 30A-30C are third cross-sectional diagrams representing the process of fabricating a semiconductor device according to the second modification of the first embodiment;

DESCRIPTION OF EMBODIMENT

Embodiments that describe the best mode for carrying out the present disclosures are explained next with reference to the drawings.

[First Embodiment]

Figure 1:
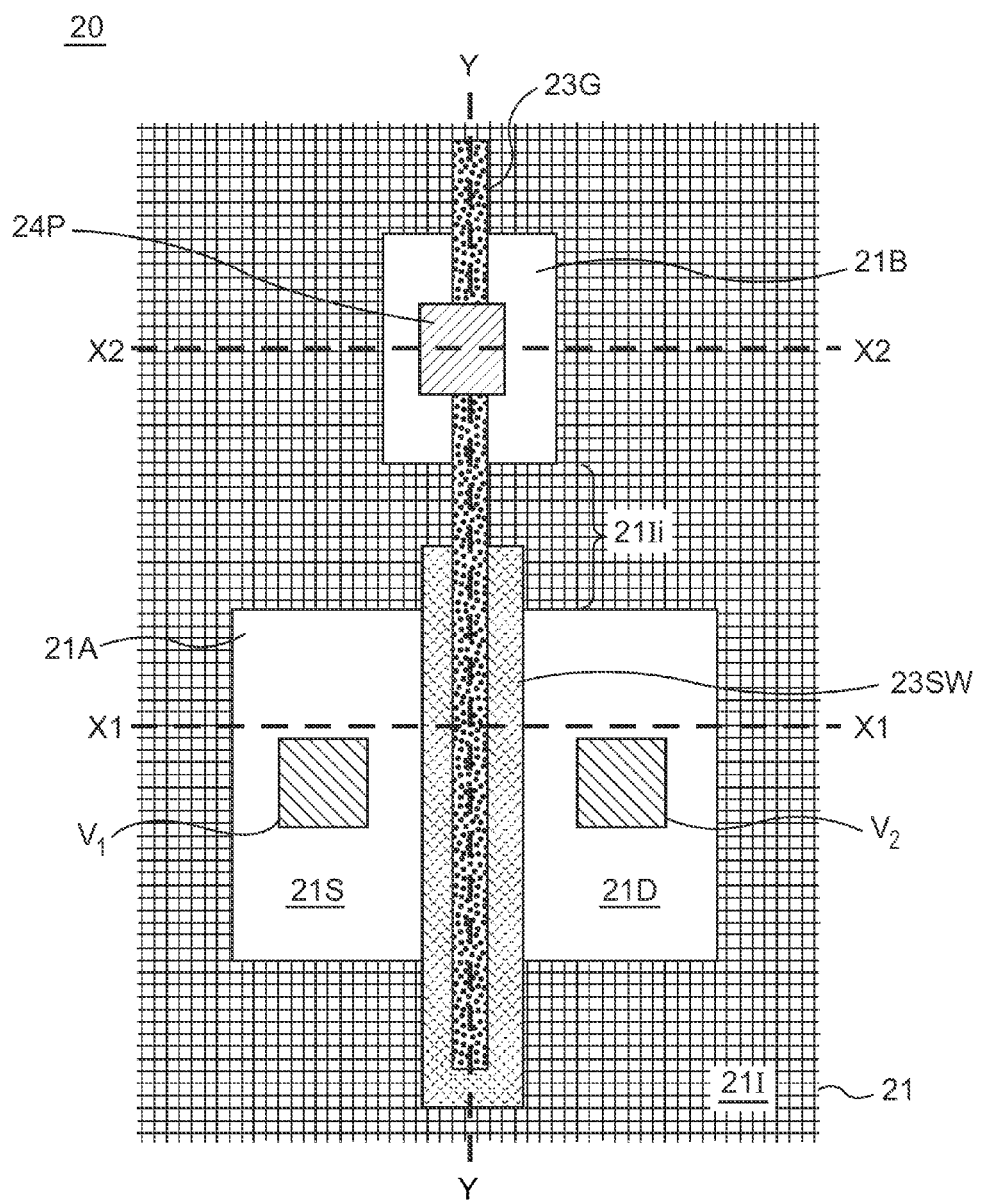
FIG. 1 is a plan-view diagram representing the construction of the semiconductor integrated circuit device according to a first embodiment.
Figure 2A:
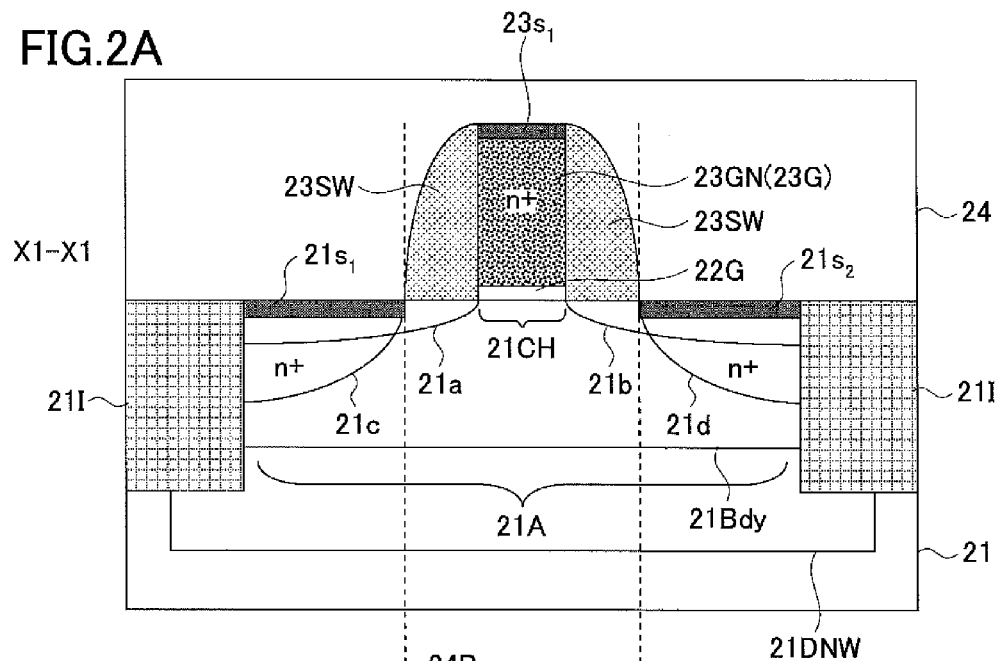
FIGS. 2A and 2B are cross-sectional diagrams of FIG. 1 respectively taken along a line X1-X1 and a line X2-X2.
Figure 2B:
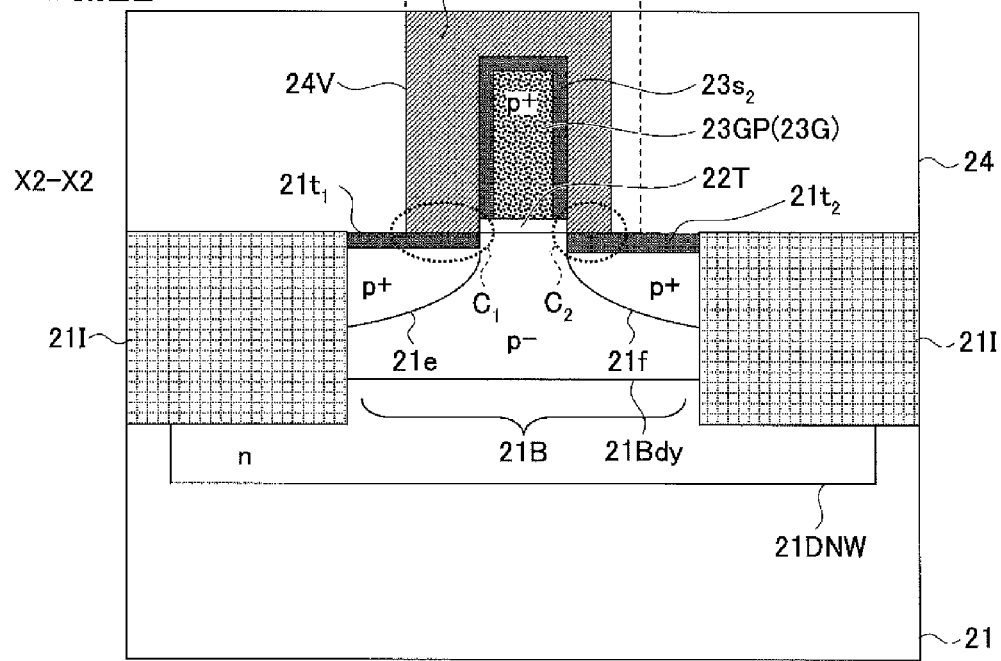
Figure 3:
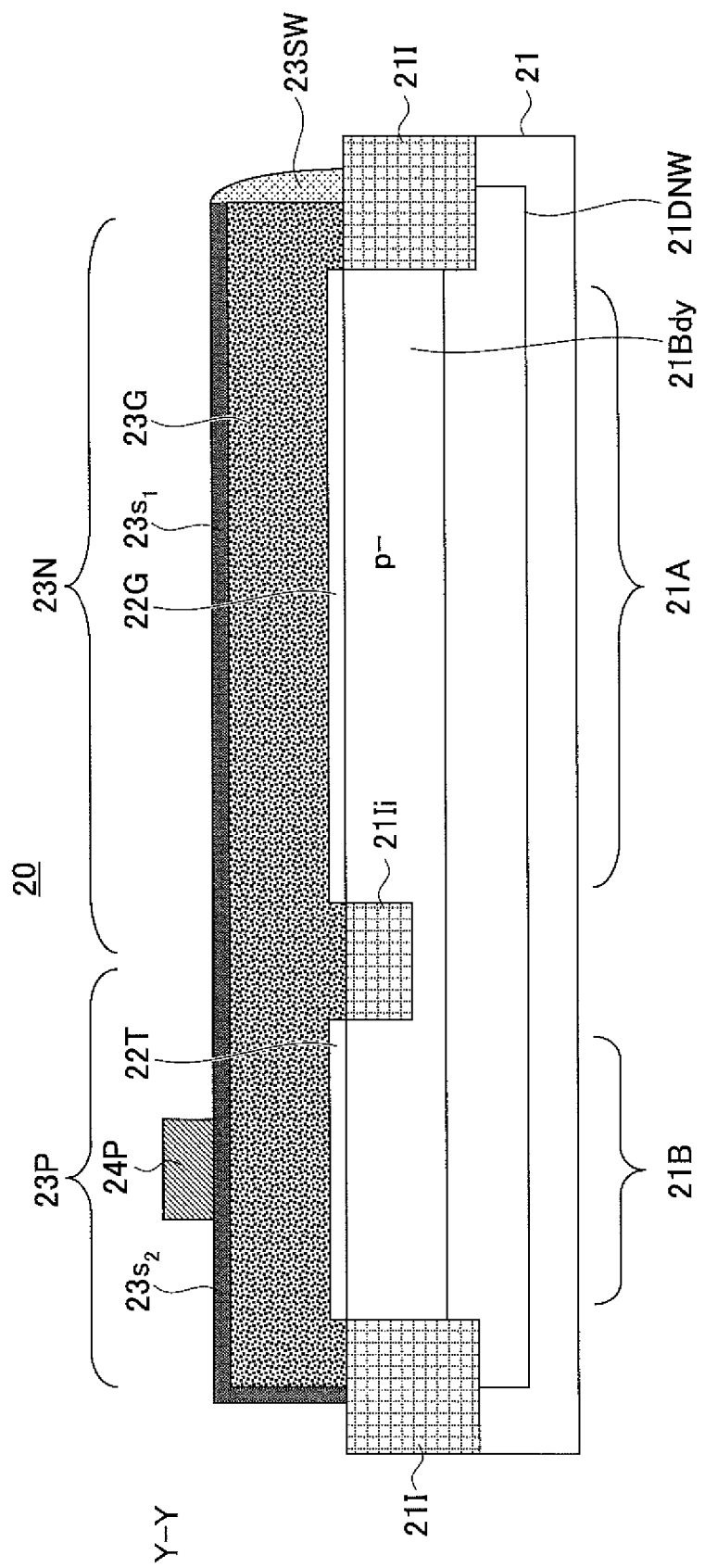
FIG. 3 is a cross-sectional diagram taken along a line Y-Y of FIG. 1.

FIG. 1 is a plan-view diagram representing the construction of a semiconductor device 20 according to a first embodiment, FIG. 2A is a cross-sectional diagram of the semiconductor device 20 taken along a line X1-X1, FIG. 2B is a cross-sectional diagram of the semiconductor device taken along a line X2-X2, and FIG. 3 is a cross-sectional diagram of the semiconductor device 20 taken along a line Y-Y.

Referring to the plan view diagram of FIG. 1, the semiconductor device 20 is a so-called dynamic threshold MOS transistor (referred to hereinafter as Dt-MOS transistor) in which a gate electrode 23G is electrically connected to a body region located right underneath the gate electrode 23G and includes a first device region 21A and a second device region 21B defined on a silicon substrate 21 with a device isolation region 21I. The device region 21A and the device region 21B constitute respective parts of the silicon substrate 21. Therein, the first device region 21A constitutes a device region forming a MOS transistor part of the Dt-MOS transistor 20, while the second device region 21B constitutes a gate tap region that connects the gate electrode of the Dt-MOS transistor to the body region electrically. In the explanation hereinafter, the first device region 21A will be designated simply as "device region 21A" and the second device region 21B will be designated simply as "gate tap region 21B".

As will be understood from the plan view diagram of FIG. 1, the gate electrode 23G extends, with the semiconductor device 20 of the present embodiment, over the silicon substrate 21 from the device region 21A to the gate tap region 21B across an insulating region 21Ii that separates the device region 21A and the gate tap region 21B from each other. In the illustrated example, the gate electrode 23G is formed of polysilicon, and, while not illustrated in the plan view diagram of FIG. 1, there is formed a silicide layer $23s_1$ on the top surface thereof by a salicide process. The insulating region 21Ii is an insulation region having an STI structure and formed in continuation to the device isolation region 21I also having an STI structure, wherein the insulating region 21Ii is formed shallower than the foregoing device isolation region 21I. As a result, the body region of the device region 21A continues to the gate tap region 21B by extending underneath the insulating region 21Ii.

In the device region 21A, there are formed sidewall insulation films 23SW of silicon oxide or silicon nitride on the gate electrode 23G along the respective sidewall surfaces thereof. Further, in the device region 21A, there is formed a source region 21S at a first side of the gate electrode 23G in the device region 21A at an outer side of the sidewall insulation film 23SW at the left side of the gate electrode 23G in the illustration of FIG. 1, and there is further formed a drain region 21D at an opposite side of the gate electrode 23G beyond the sidewall insulation film 23SW at the right side of the gate electrode 23G in the illustration of FIG. 1. Thus, in the device region 21A, there is formed a MOS transistor having the gate electrode 23G, the source region 21S and the drain region 21D.

Further, the source region 21S and the drain region 21D are respectively covered by silicide layers $21s_1$ and $21s_2$ not illustrated in FIG. 1, and via plugs $V_1$ and $V_2$ make a contact with the source and drain regions 21S and 21D respectively via the respective silicide layers $21s_1$ and $21s_2$.

In the gate tap region 21B, on the other hand, the gate electrode 23G is not formed with the sidewall insulation films 23SW. In place thereof, there is formed a shared contact plug 24 in electrical contact with the top surface and both sidewall surfaces of the gate electrode 23G. By forming the shared contact plug 24P, the gate electrode 23G is connected electrically to the surface of the silicon substrate 21 exposed in the gate tap region 21B. For this purpose, the top surface and the both sidewall surfaces of the gate electrode 23G are formed with a silicide region in the gate tap region 21B, and a similar silicide layer is formed also on the surface of the silicon substrate 21 exposed in the gate tap region 21B.

Hereinafter, the device structure in the device region 21A and the gate tap region 21B will be explained with reference to the cross-sectional diagrams of FIGS. 2A and 2B. While a Dt-MOS transistor of n-channel type is explained in the following example, it is possible to form a Dt-MOS transistor of p-channel type similarly, by merely reversing the conductivity type of the respective semiconductor layers.

Referring to the cross-sectional diagram of FIG. 2A, it can be seen that, in the device region 21A, there is formed a body region 21Bdy of p⁻-type in the silicon substrate 21 above a deep n-type well 21DNW, and a gate electrode 23G of polysilicon of n⁺-type, for example, is formed over the silicon substrate 21 via a gate insulation film 22G.

Further, in the body region 21Bdy of p⁻-type in the device region 21A, there are formed a source extension region 21$a$ of n-type and a drain extension region 21$b$ of also n-type, respectively at a first side of the gate electrode 23G and a second, opposite side to the first side, of the gate electrode 23G. Thus, in the silicon substrate 21, there is formed a channel region 21CH of the Dt-MOS transistor 20 right underneath the gate electrode 23G between the source extension region 21$a$ and the drain extension region 21$b$.

The gate electrode 23G is formed with the sidewall insulation films 23SW covering the respective sidewall surfaces thereof, and there is formed a source region 21S of n⁺-type in the device region 21A at the first side of the gate electrode 23G and at the outer side of the pertinent sidewall insulation film 23SW in partial overlapping with the source extension region 21$a$. Further, at the second side of the gate electrode 23G and at the outer side of the pertinent sidewall insulation film 23SW, there is formed a drain region 21D of n⁺-type in partial overlapping with the drain extension region 21$b$.

Further, in the cross-section of FIG. 2A, the silicide layer 23$s_1$ noted before is formed on the top surface of the gate electrode 23G. Further, silicide layers 21$s_1$ and 21$s_2$ are formed on the respective surfaces of the source region 21S and the drain region 21D.

Further, over the silicon substrate 21, there is formed an interlayer insulation film 24 to cover the gate electrode 23G, the silicide layer 23$s_1$ and further the sidewall insulation films 23SW. As noted already, the gate electrode 23G, the source region 21S, the drain region 21D, and the like, form a transistor structure of n-channel MOS transistor having a channel region 21CH in the device region 21A. In the cross-sectional diagram of FIG. 2A, the gate electrode 23G of FIG. 1 is doped to n⁺-type in correspondence to the source region 21$c$ and the drain region 21$d$. In the description hereinafter, the part of the gate electrode 23G doped to the n⁺-type will be designated as a gate electrode part 23GN.

Next, with reference to FIG. 2B, it will be noted that the deep n-type well 21DNW and the p-type body region 21Bdy extend from the device region 21A to the gate tap region 21B by passing underneath the shallow insulating region 21Ii of an STI structure located between the device region 21A and the gate tap region 21B, wherein the insulating region 21Ii constitutes a part of the device isolation region 21I but has a shallower depth as compared with the device isolation region 21I. Further, on the surface of the silicon substrate 21, it can be seen that the gate electrode 23G extends continuously from the device region over the insulating region 21Ii. In the gate tap region 21B, the gate electrode 23G forms a gate electrode part 23GP wherein the gate electrode part 23GP is formed over the surface of the silicon substrate 21 via a thin insulation film 22T corresponding to the gate insulation film 22G.

In the present embodiment, it should be noted that the gate electrode 23G is not formed with the sidewall insulation films 23SW in the gate tap region 21B. Further, in relation to this, it should be noted that the gate electrode 23G is formed with a silicide layer 23$s_2$ extending from the silicide layer 23$s_1$ of the device region 21A at the top surface and the both sidewall surfaces such that the silicide layer 23$s_2$ covers the top surface and the both sidewall surfaces of the gate electrode 23G continuously.

Further, in the gate tap region 21B, there are formed contact regions 21$e$ and 21$f$ doped to p⁺-type on the surface of the p⁻-type body region 21Bdy that extends from the device region 21A, respectively at the first side and the second side of the gate electrode 23G, and silicide layers 21$t_1$ and 21$t_2$ similar to the silicide layers 21$s_1$ and 21$s_2$ are formed on the surface of the contact regions 21$e$ and 21$f$, respectively. It should be noted, however, that, contrary to the silicide layers 23$s_1$ and 23$s_2$, the silicide layer 21$t_1$ is electrically isolated from the silicide layer 21$s_1$ and the silicide layer 21$t_2$ is likewise electrically isolated from the silicide layer 21$s_2$. In the cross-sectional diagram of FIG. 2B, it should be noted that the gate electrode 23G of FIG. 1 is doped to p⁺-type in correspondence to the contact region 21$e$ and the contact region 21$f$. In the description hereinafter, the part of the gate electrode 23G doped to the p⁺-type will be designated as a gate electrode part 23GP.

Further, the interlayer insulation film covers the surface of the silicon substrate 21 also in the gate tap region 21B, wherein it will be noted that there is formed an opening 24V so as to expose the top surface and both sidewall surfaces of the gate electrode part 23GP covered with the silicide layer 23$s_2$ and further the surface of the silicon substrate 21 covered by the silicide layers 21$t_1$ and 21$t_2$ in the gate tap region 21B.

The opening 24V is filled with a metal film, and as a result, there is formed a shared contact plug 24P that causes a contact with the sidewall surfaces and the top surface of the gate electrode part 23GP of the p+-type via the silicide layer 23$s_2$ and further a contact with the contact regions 21$e$ and 21$f$ via the respective silicide layers 21$t_1$ and 21$t_2$. With the shared contact plug 24P, the gate electrode part 23GP is connected to the body region 21Bdy of p⁻-type right underneath the gate electrode 23G in the gate tap region 21B.

FIG. 3 is a cross-sectional diagram of the Dt-MOS transistor 20 taken along a line Y-Y in FIG. 1.

Referring to FIG. 3, the gate electrode 23G extends over the silicon substrate 21 from the device region 21A to the gate tap region 21B, and the silicide layer 21$s_1$ and the silicide layer 21$s_2$ are formed continuously on the gate electrode 23G respectively in the device region 21A and in the gate tap region 21B. Here, it should be noted that the silicide layer 21$s_1$ covers only the top surface of the gate electrode part 23GN while the silicide layer 21$s_2$ covers the top surface and both sidewall surfaces of the gate electrode part 23GP.

On the surface of the silicon substrate 21, it can be seen that the gate insulation film 22G is formed in the device region 21A and that the thin insulation film 22T is formed similarly in the gate tap region 21B, and because of this, the gate electrode 23G is separated from the underlying p⁻-type body region 21By by the gate insulation film 22 in the device region 21A and by the foregoing insulation film 22T in the gate tap region 21B.

Thus, in the device region 21A, the n-channel MOS transistor is formed with the gate electrode 23G, while in the gate tap region 21B, the gate electrode 23G is electrically connected to the p⁻-type body region 21Bdy by the shared contact plug 24P. As a result the MOS transistor formed in the device region 21A operates as a so-called dynamic threshold MOS (Dt-MOS) transistor. Further, from FIG. 3, it can be seen that the insulating region 21Ii of the STI structure is formed with a shallower depth as compared with the device isolation region 21I, and because of this the p⁻-type body region 21Bdy can extend continuously from the device region 21A to the gate tap region 21B.

Figure 4:
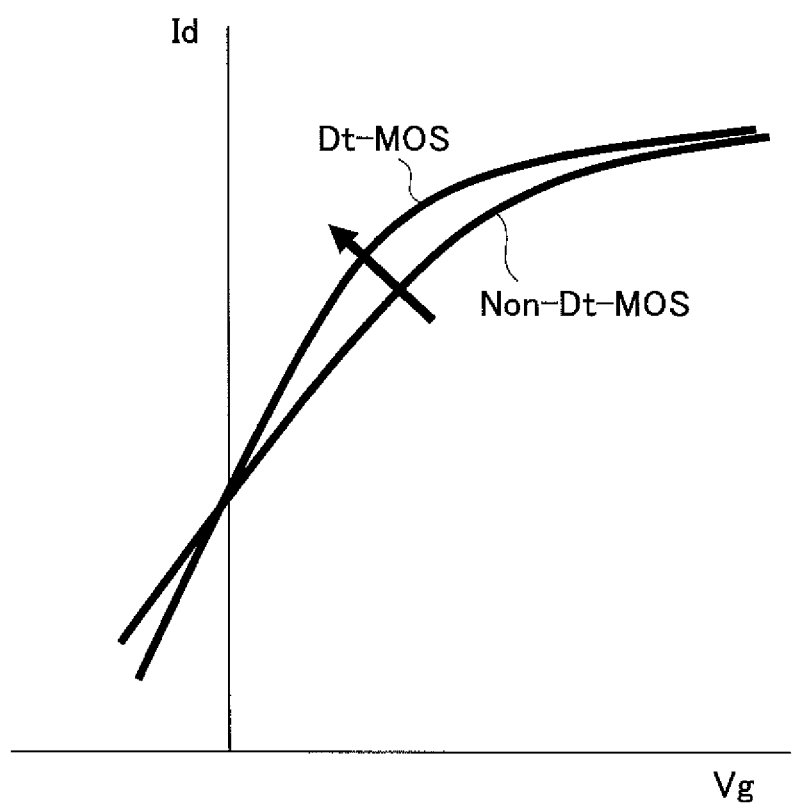
FIG. 4 is a graph representing an operational characteristic of a Dt-MOS transistor.

FIG. 4 is a graph representing the operational characteristic of the Dt-MOS transistor in comparison with the operational characteristic of an ordinary MOS transistor (Non-Dt-MOS).

With the Dt-MOS transistor, an input signal applied to the gate electrode 23G is applied also to the p⁻-type body region 21Bdy in the gate tap region 21B, and because of this, the signal voltage of the input signal works to reduce the threshold voltage of the Dt-MOS transistor. Thus, the operational characteristic of the Dt-MOS transistor approaches the operational characteristic of the MOS transistor (Non-Dt-MOS) of low threshold voltage with increase of the signal voltage. Thus, the Dt-MOS transistor 20 of the present embodiment can turn ON with small signal voltage. On the other hand, in the case the signal voltage is 0V or a voltage near 0V, the potential of the body 21Bdy becomes 0V or a voltage near 0V, and the operational characteristic of the transistor approaches that of a MOS transistor of high threshold voltage (Non-Dt-MOS) transistor. Thus, the threshold voltage of the Dt-MOS transistor 20 is not different from that of an ordinary n-channel MOS transistor having a high threshold voltage, and as a result, the Dt-MOS transistor 20 shows a switch OFF operation characterized by low OFF current or leakage current as represented in FIG. 4.

Referring to FIG. 2B again, it should be noted that, with the present embodiment, the shared contact plug 24P makes a contact with the top surface and both sidewall surfaces of the gate electrode 23G in the gate tap region 21B via the silicide layer $23s_2$ and further that the shared contact plug 24P makes a contact with the p⁻-type body region 21Bdy in the silicon substrate 21 at the locations surrounded by circles $C_1$ and $C_2$ in FIG. 2B via the silicide layers $21t_1$ and $21t_2$, respectively. While it is drawn in the illustrated example that the edge of the shared contact plug 24P at the side of the source region 21e aligns with the edge of the sidewall insulation film 23SW of the device region 21A, this is merely for the sake of convenience. It should be noted that the present embodiment is not limited to such a specific construction.

Figure 5:
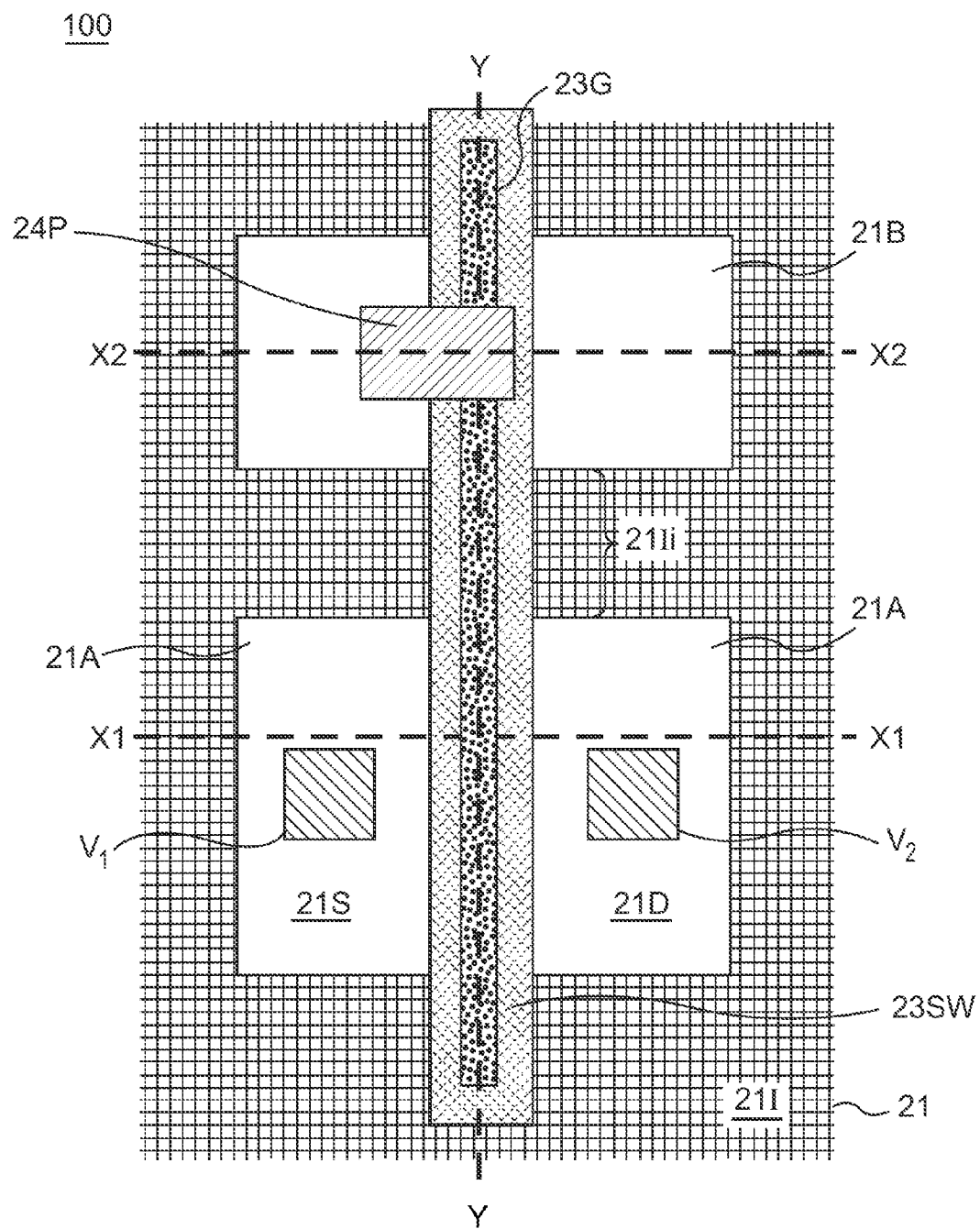
FIG. 5 is a plan-view diagram representing a semiconductor device according to a comparative example.
Figure 6A:
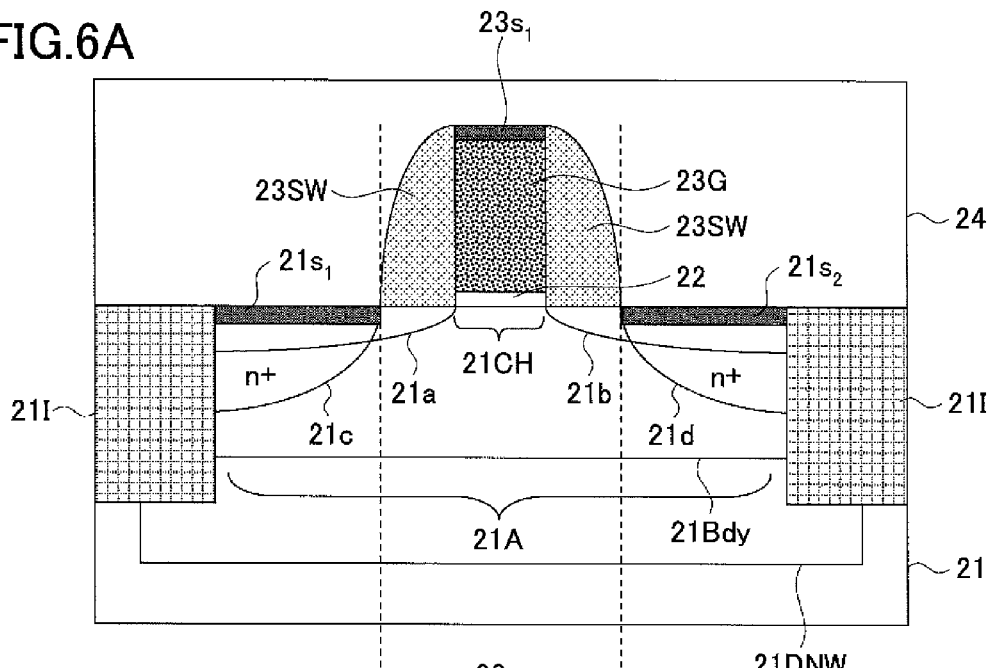
FIGS. 6A and 6B are cross-sectional diagrams of FIG. 5 respectively taken along a line X1-X1 and a line X2-X2.
Figure 6B:
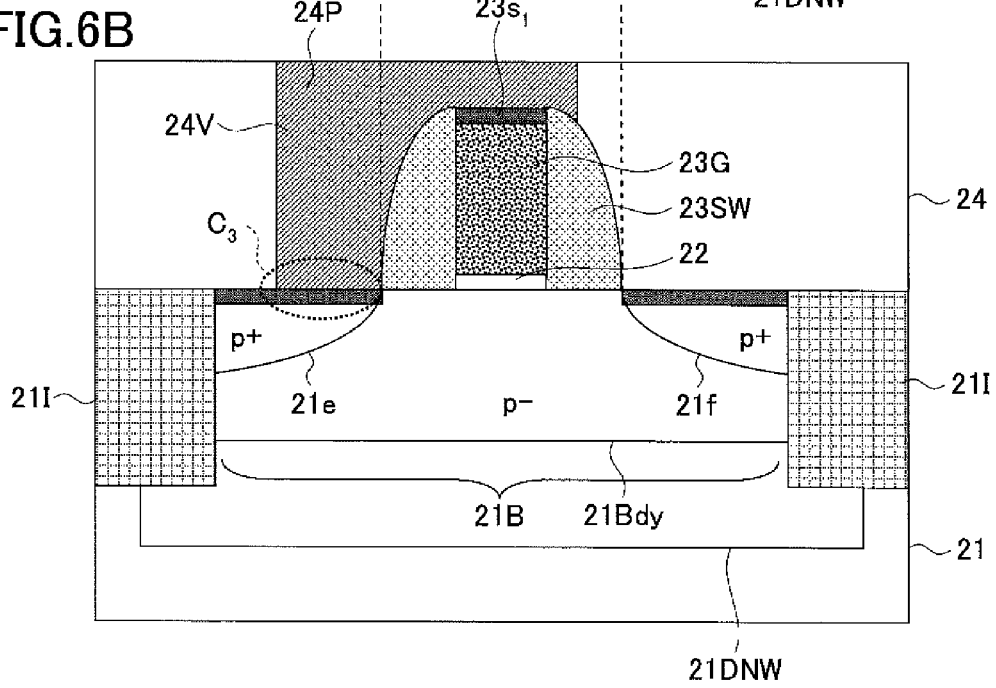

FIG. 5 and FIGS. 6A and 6B represent the construction of a Dt-MOS transistor according to a comparative example. For the sake of comparison, the same reference numerals are attached to those parts corresponding to the parts represented in FIG. 1 and FIGS. 2A and 2B.

Referring to FIG. 5, it can be seen that the sidewall insulation films 23SW are formed along the entire length of the gate electrode 23G with this comparative example, and because of this, while the construction of the MOS transistor for the device region 21A represented in FIG. 6A may be the same as that represented in FIG. 2A, there is a difference between the construction of the gate tap region 21B represented in FIG. 6B and that represented in FIG. 2B.

More specifically, the gate electrode 23G is formed with the sidewall insulation films 23SW also in the gate tap region 21B, and because of this, the p⁺-type contact regions 21e and 21f are formed at the respective outer sides of the sidewall insulation films 23SW. Further, associated with this, it can be seen that the silicide layers $21s_1$ and $21s_2$ are formed at the respective outer sides of the sidewall insulation films 23SW.

Thus, when the gate electrode 23G is to be electrically connected to the body region 21bdy in the silicon substrate 21 in the gate tap region 21B by way of the shared contact plug 24P, it is necessary to extend the shared contact plug 24 beyond the sidewall insulation film 23SW on the gate electrode 23G as represented in FIG. 6B. Thus, when to secure a contact area identical to the regions $C_1$ and $C_2$ in the construction of FIG. 2B, it is necessary to secure an area equal to or larger than the total of the areas of the contact regions $C_1$ and $C_2$ for the area of the contact region $C_3$ represented in FIG. 6B. In the construction of FIG. 6B, it should be noted that the part of the shared contact plug 24P at the right side of the gate electrode 23G in the drawing is located on the sidewall insulation film 23SW and does not contribute to the electrical contact. In the embodiment represented in FIG. 2B, in contrast, both the part of the shared contact plug 23P located at the left side of the gate electrode 23G and the part of the shared contact plug 23P located at the right side of the of the gate electrode 23G contribute to the electrical connection to the body region 21bdy.

Thus, the comparative example represented in FIG. 5 and FIGS. 6A and 6B has the problem of increase of size of the shared contact plug 24P. Further, with the construction of FIG. 6B, the shared contact plug 24P cannot reduce the contact resistance sufficiently even when the shared contact plug 24P is provided in view of the fact that the shared contact plug 24P can make contact with the gate electrode 23G only via the silicide layer $23s_1$ at the top surface thereof. Contrary to the foregoing, the present embodiment can form the shared contact plug 24P within the area of the sidewall insulation films 23SW in FIG. 6B.

Next, the fabrication process of the Dt-MOS transistor 20 according to the present embodiment will be explained with reference to FIG. 7A-7C—FIG. 20A-20C. In each drawing in FIG. 7A-7C—FIG. 20A-20C, it should be noted that the drawing A represents a cross-sectional diagram taken align a line X1-X1 of FIG. 1, the drawing B represents a cross-sectional diagram taken along a line X2-X2 of FIG. 1, and the drawing C represents a cross-sectional diagram taken along a line Y-Y of FIG. 1.

Figure 7A:
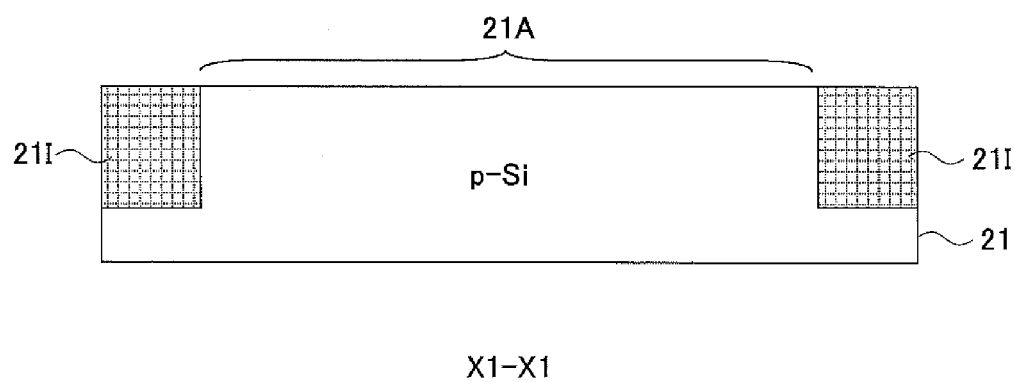
Figure 7B:
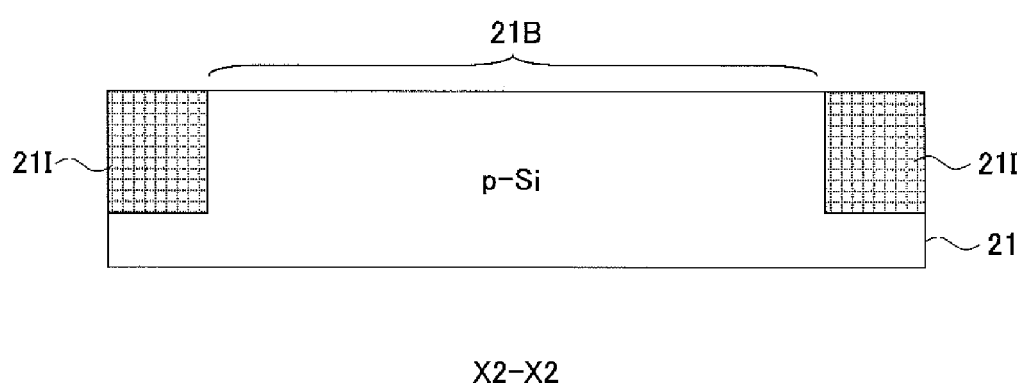

Referring to FIGS. 7A-7C, the silicon substrate 21 of p⁻-type is formed with the device isolation region 21I by an ordinary process with a depth of 250 nm-350 nm, for example. The device isolation region 21I thus formed defines the foregoing device region 21A and the gate tap region 21B.

Figure 8A:
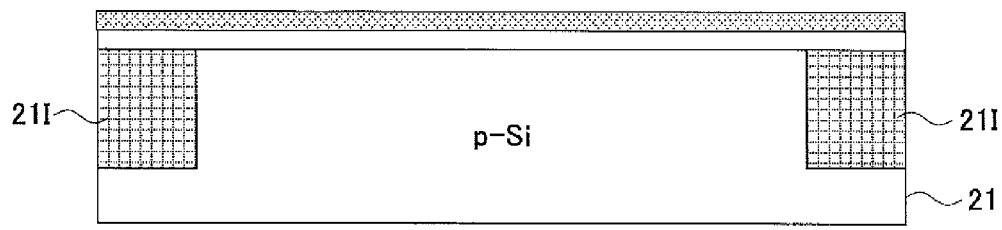
Figure 8B:
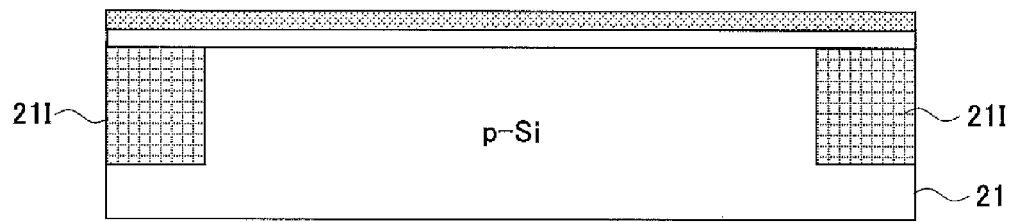

Next, in the step of FIGS. 8A-8C, there are formed a pad oxide film 210X and a silicon nitride film 21N similarly to the case of forming the device isolation region 21I, wherein the pad oxide film 210X and the silicon nitride film 21N are patterned subsequently to expose the surface of the silicon substrate 21 at a location corresponding to where the insulating region 21Ii is to be formed. Further, in the step of FIGS. 8A-8C, the silicon substrate 21 is etched by a dry etching process to a depth shallower than the device isolation region 21I, such as 100 nm-200 nm, while using the silicon nitride film 21N as a mask to form a depression 21i corresponding to the insulating region 21Ii.

Figure 9A:
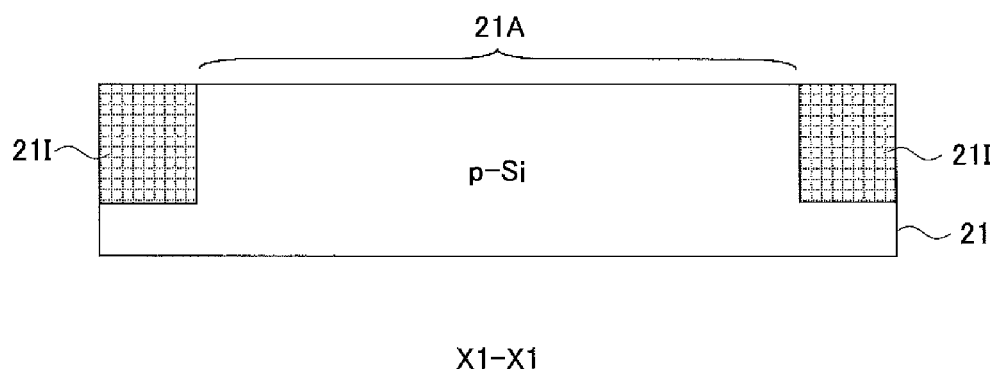
Figure 9B:
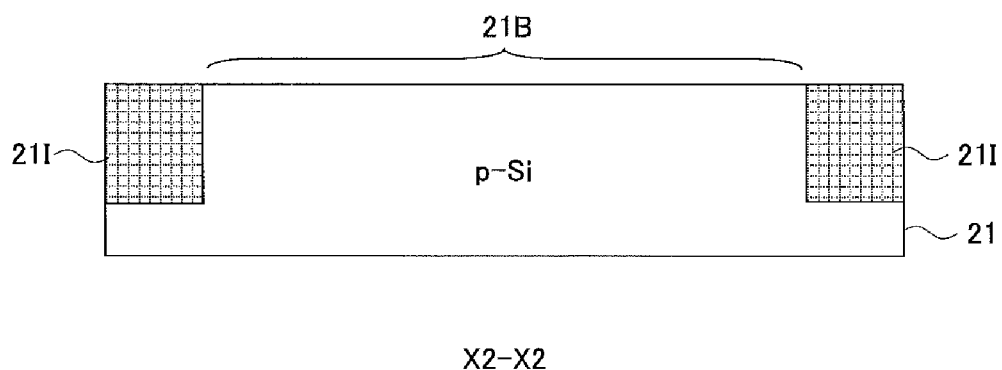

Further, in the step of FIGS. 9A-9C, the depression 21Ii is filled with a CVD silicon oxide film formed by a high-density plasma CVD process, and with this, the insulating region 21Ii is formed as can be seen in the Y-Y cross-section represented in FIG. 9C. Here, it should be noted that FIGS. 9A-9C represent the state in which the CVD silicon oxide film is removed by a chemical mechanical polishing (CMP) process while using the silicon nitride film 21N as a stopper and the silicon nitride film 21N and the pad oxide film 210X are removed subsequently by a wet etching process such that the surface of the silicon substrate 21 is exposed.

Figure 10A:
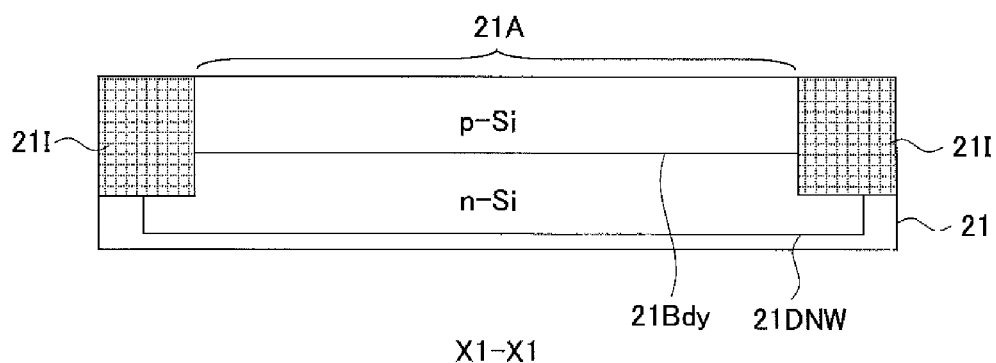
FIGS. 10A-10C are fourth cross-sectional diagrams explaining the fabrication process of the semiconductor device according to the first embodiment.
Figure 10B:
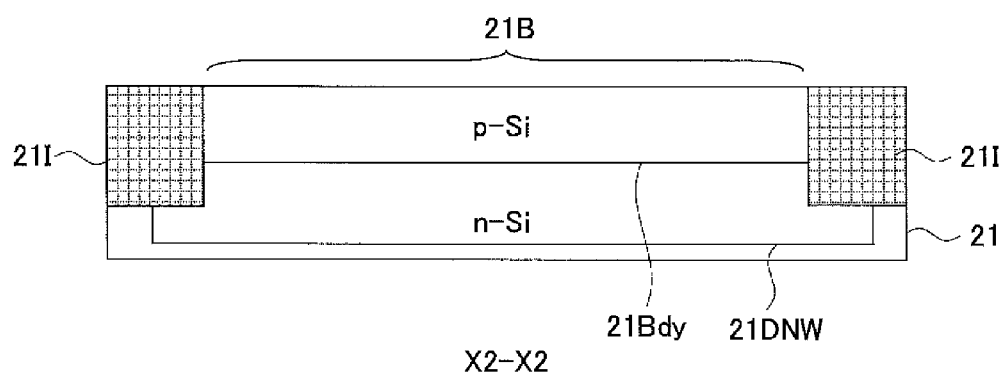
Figure 10C:
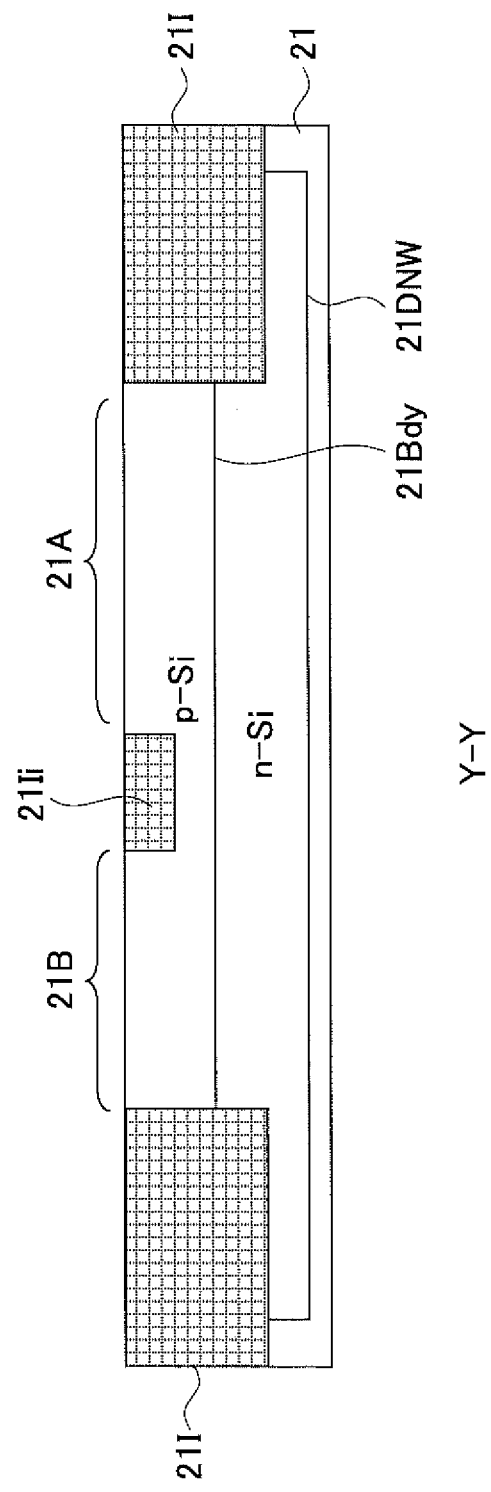

Next, in the step of FIGS. 10A-10C, an n-type impurity element such as P is introduced into the silicon substrate 21 under an acceleration voltage of 200 keV-500 keV with a dose of $1\times10^{13}$ cm$^{-2}$-$1\times10^{14}$ cm$^{-2}$, and with this, the deep n-type well 21DNW is formed in the region that includes the device region 21A and the tap region 21B with a depth deeper than the device isolation region 21I.

Further, in the step of FIGS. 10A-10C, a p-type impurity element such as B is introduced into the silicon substrate 21 under an acceleration voltage of 10 keV-100 keV with a dose of $1\times10^{12}$ cm$^{-2}$-$1\times10^{14}$ cm$^{-2}$, and with this, the body region 21Bdy of p-type is formed in a region that includes the device region 21A and the tap region 21B with a depth shallower than the device isolation region 21I but deeper than the insulating region 21Ii. As will be seen in the Y-Y cross-section of FIG. 10C, the deep n-type well 21DNW and the p-type body region 21Bdy extend underneath the insulating region 21Ii from the device region 21A to the gate tap region 21B continuously.

Figure 11A:
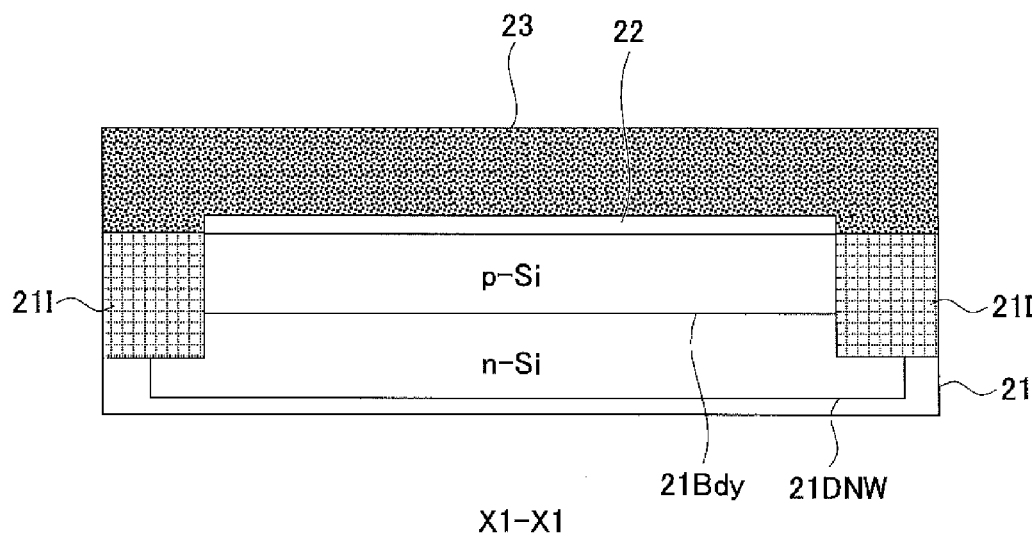
FIGS. 11A-11C are fifth cross-sectional diagrams explaining the fabrication process of the semiconductor device according to the first embodiment.
Figure 11B:
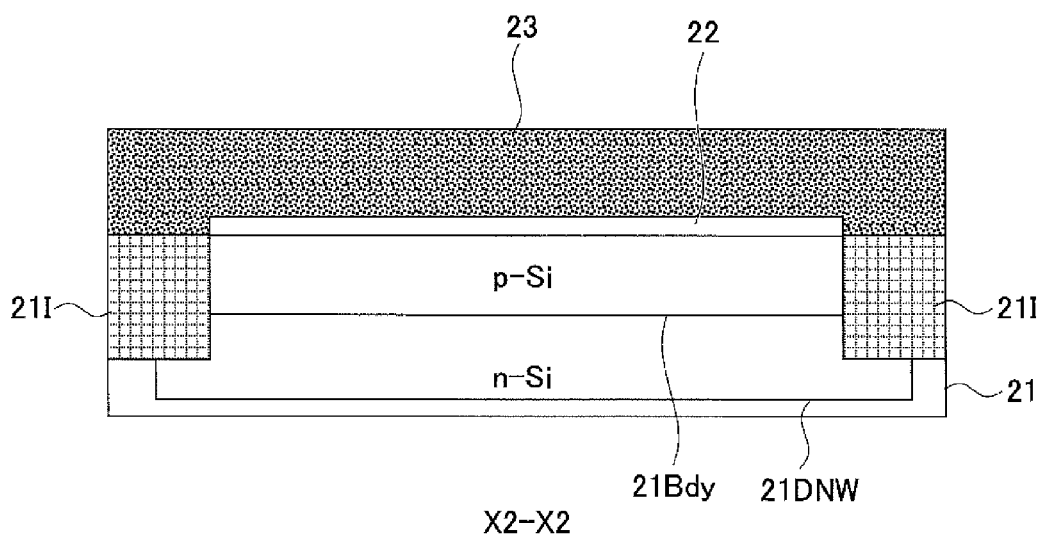
Figure 11C:
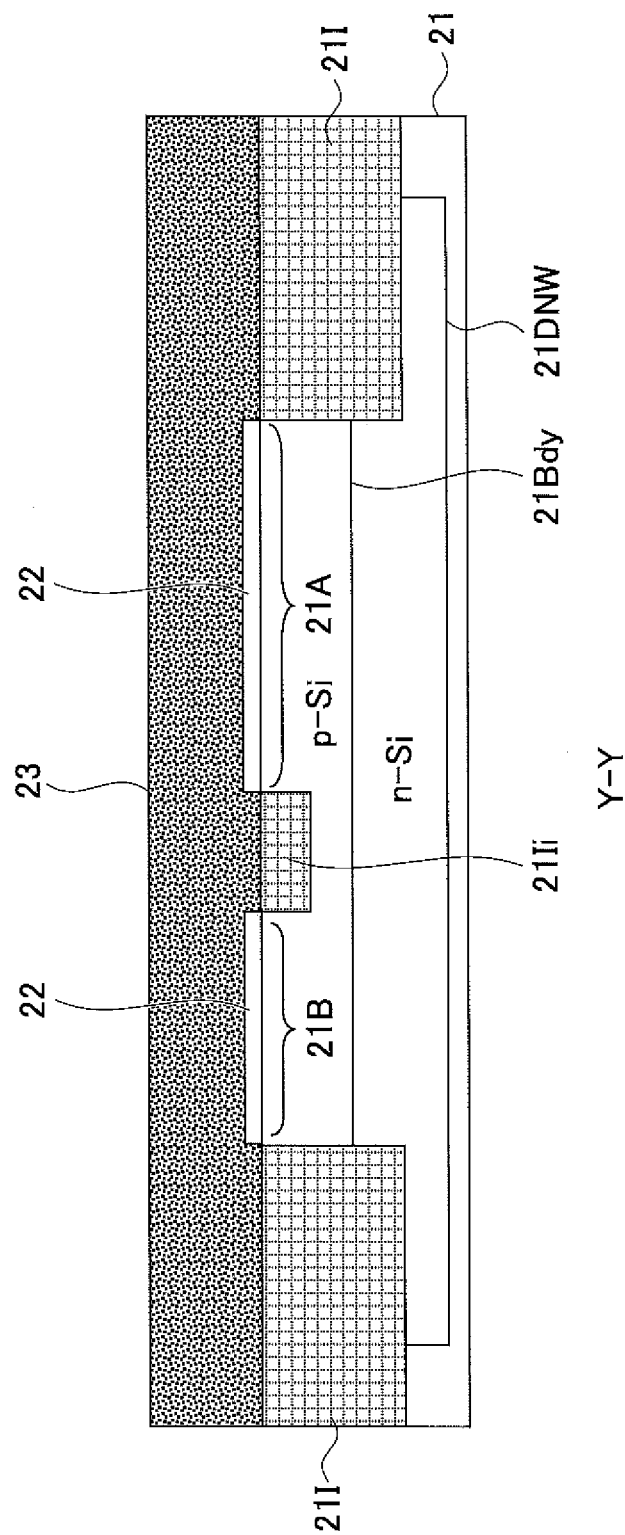

Next, in the step of FIGS. 11A-11C, there is formed a silicon oxide film 22 of a film thickness of 1 nm-2 nm on the surface of the silicon substrate 21 to cover the device region 21A and the gate tap region 21B simultaneously by a thermal oxidation process or plasma oxidation process, and a polysilicon film 23 is deposited with a film thickness of 50 nm-150 nm, such as 100 nm, to cover the device region 21A and the gate tap region 21B continuously.

Figure 12A:
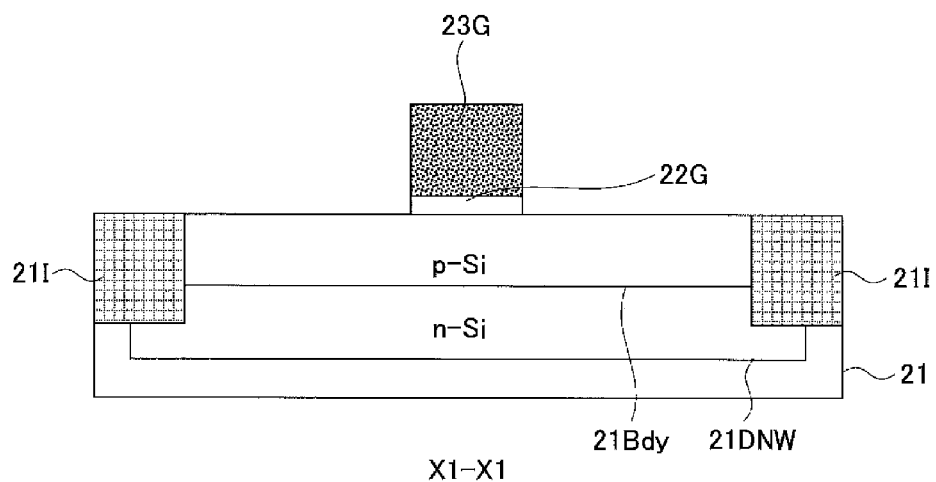
FIGS. 12A-12C are sixth cross-sectional diagram explaining the fabrication process of the semiconductor device according to the first embodiment.
Figure 12B:
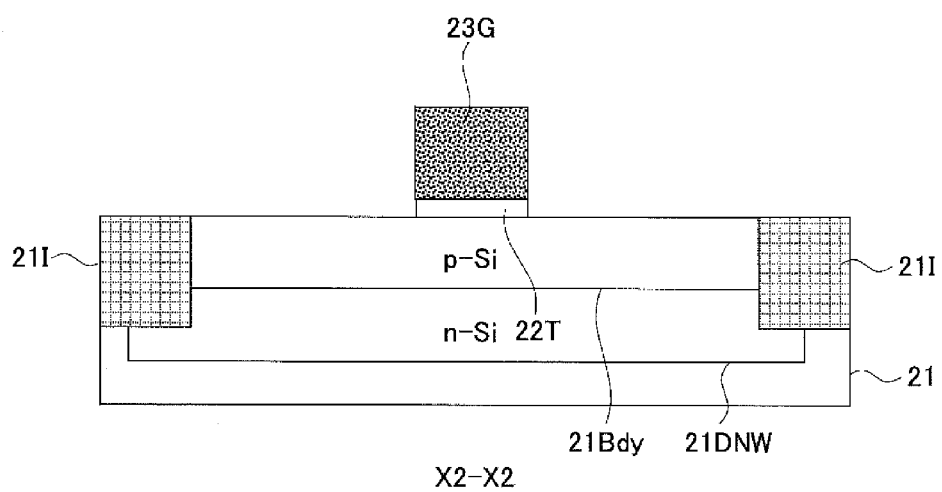
Figure 12C:
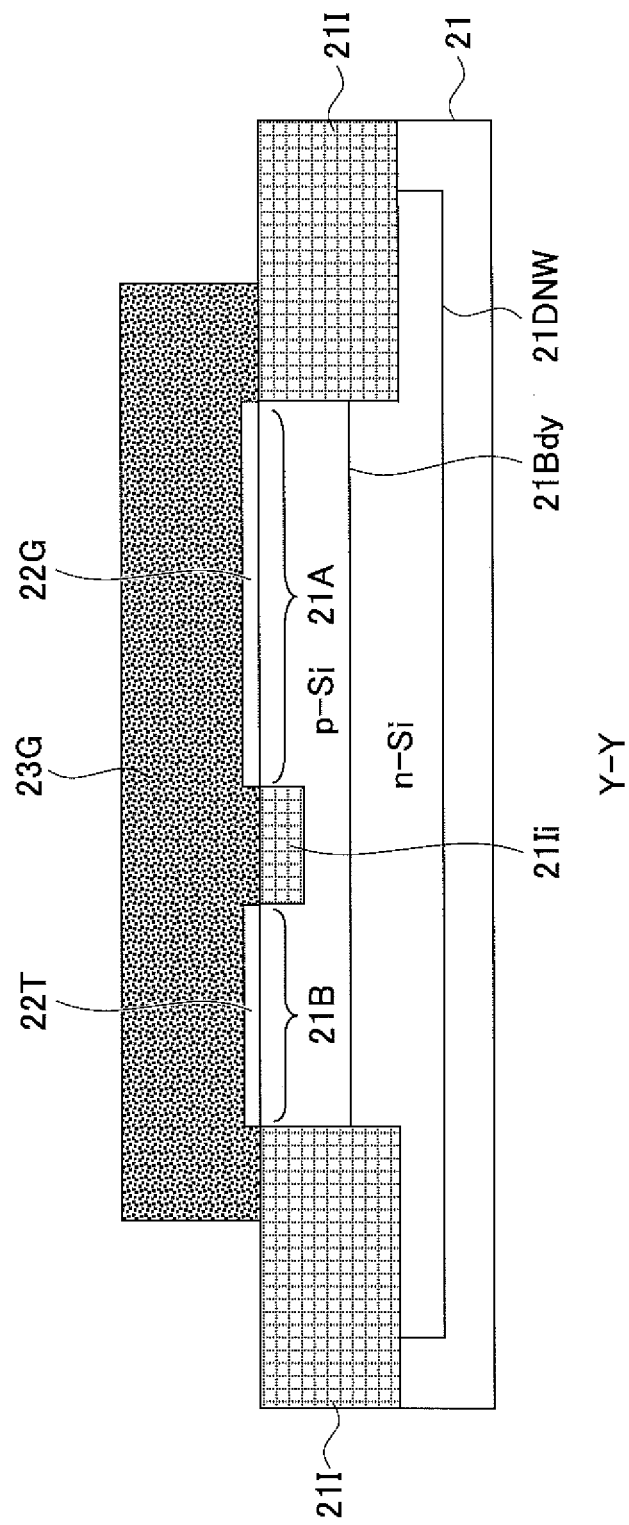

Next, in the step of FIGS. 12A-12C, the polysilicon film 23 and the underlying silicon oxide film 22 are patterned to form the gate electrode 23G and the gate insulation film 22G as represented in the X1-X1 cross-section of FIG. 12A. At the same time, the gate electrode 23G and the insulation film 22T are formed as represented in the X2-X2 cross-section of FIG. 12B.

Figure 13A:
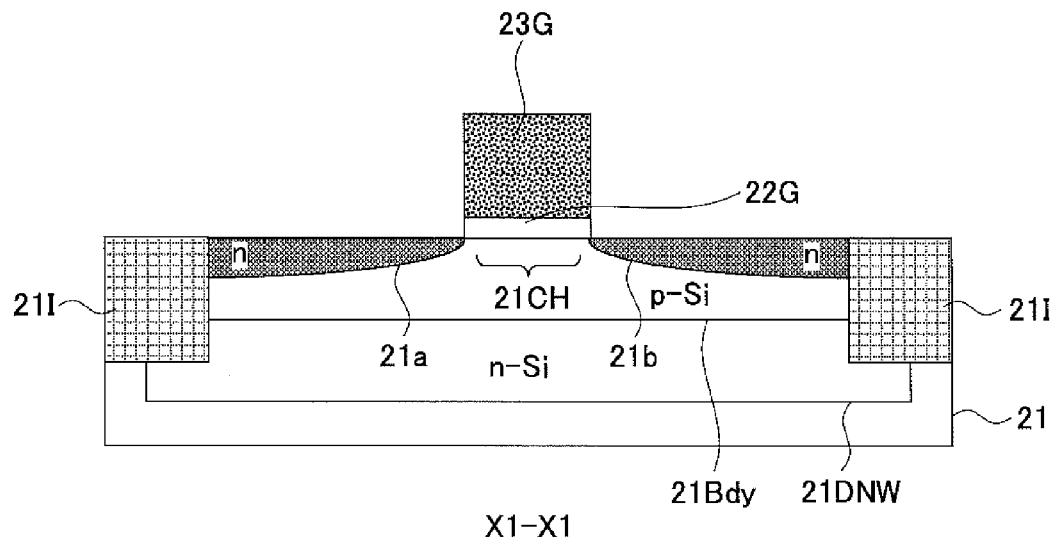
FIGS. 13A-13C are seventh cross-sectional diagrams explaining the fabrication process of the semiconductor device according to the first embodiment.
Figure 13B:
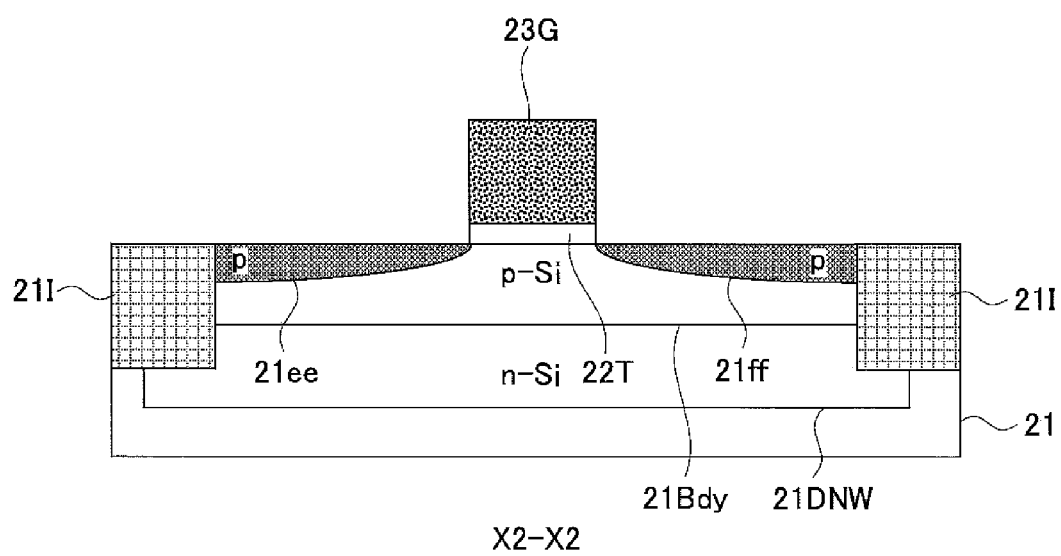
Figure 13C:
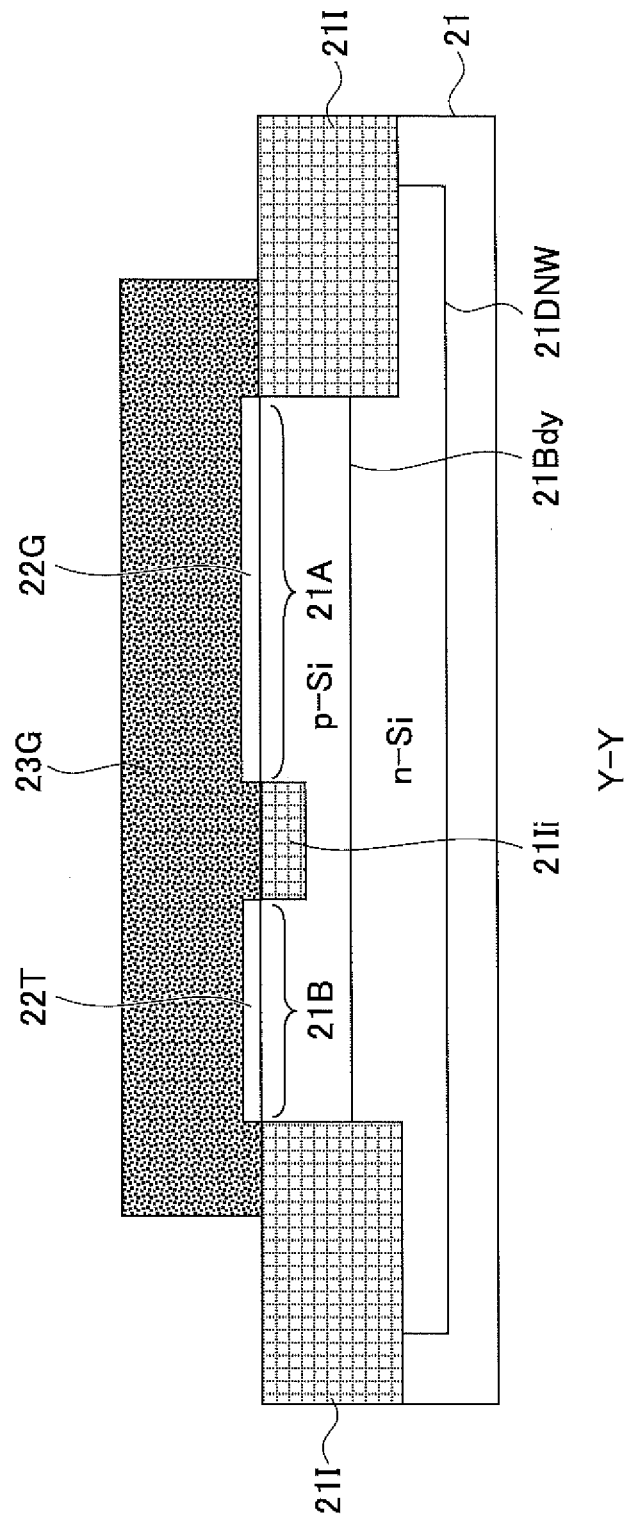

Further, in the step of FIGS. 13A-13C, an n-type impurity element such as As is introduced into the device region 21A under an acceleration voltage of 1 keV-10 keV and with the dose of $5\times10^{14}$ cm$^{-2}$-$5\times10^{15}$ cm$^{-2}$ while using the gate electrode 23G as a mask, and with this, the source extension region 21a and the drain extension region 21b of n-type are formed in the body region 21Bdy of p-type at the respective sides of the gate electrode 23G. Further, a p-type impurity element such as B is introduced into the device region 21B in the step of FIGS. 13A-13C under an acceleration voltage of 1 keV-10 keV and with the dose of $5\times10^{14}$ cm$^{-2}$-$5\times10^{15}$ cm$^{-2}$ while using the gate electrode 23G as a mask, and with this, a p-type region 21ee and a p-type region 21ff of p-type are formed in the body region 21Bdy of p-type at the respective sides of the gate electrode 23G.

Figure 14A:
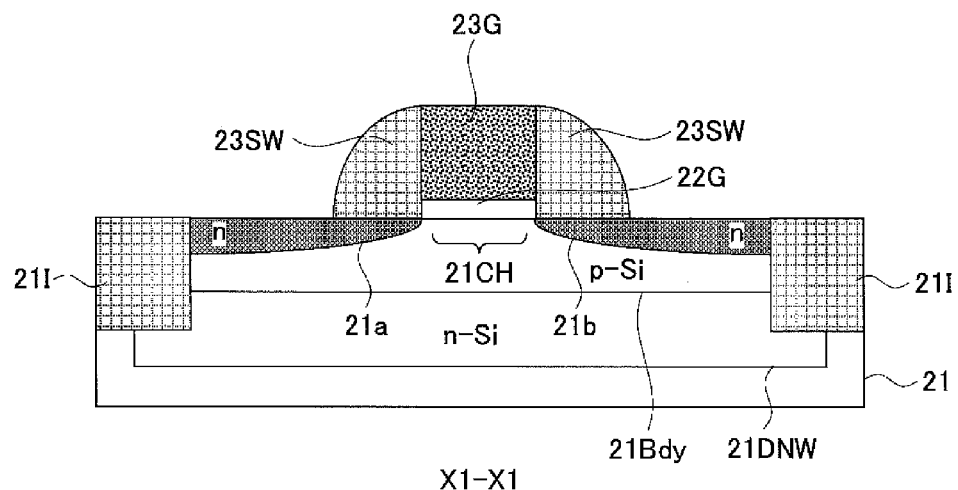
Figure 14B:
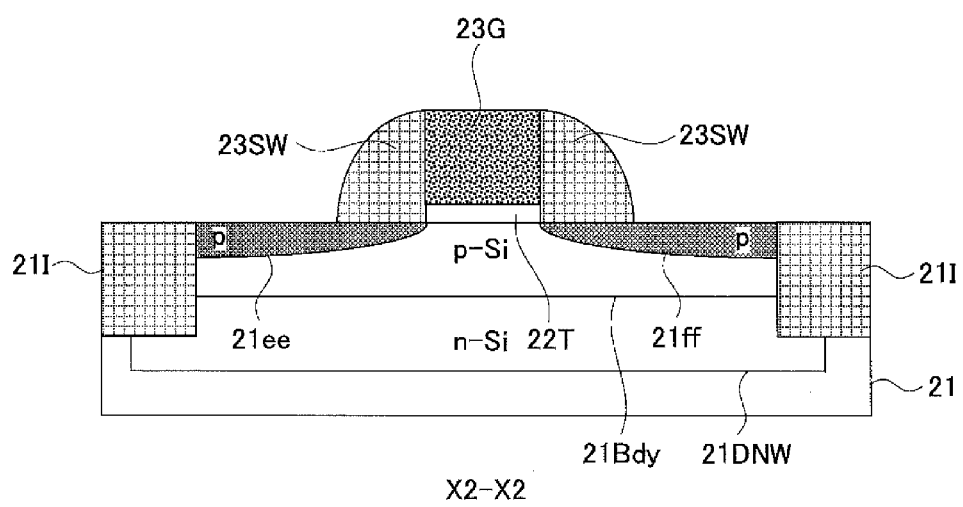

Further, in the step of FIGS. 14A-14C, the sidewall insulation films 23SW are formed on the gate electrode 23G with a film thickness of 40 nm-80 nm. The sidewall insulation films 23SW thus formed cover the respective sidewall surfaces of the gate electrode 23G to extend over the entire length thereof, and thus, to extend throughout the device region 21A and the gate tap region 21B.

Figure 15A:
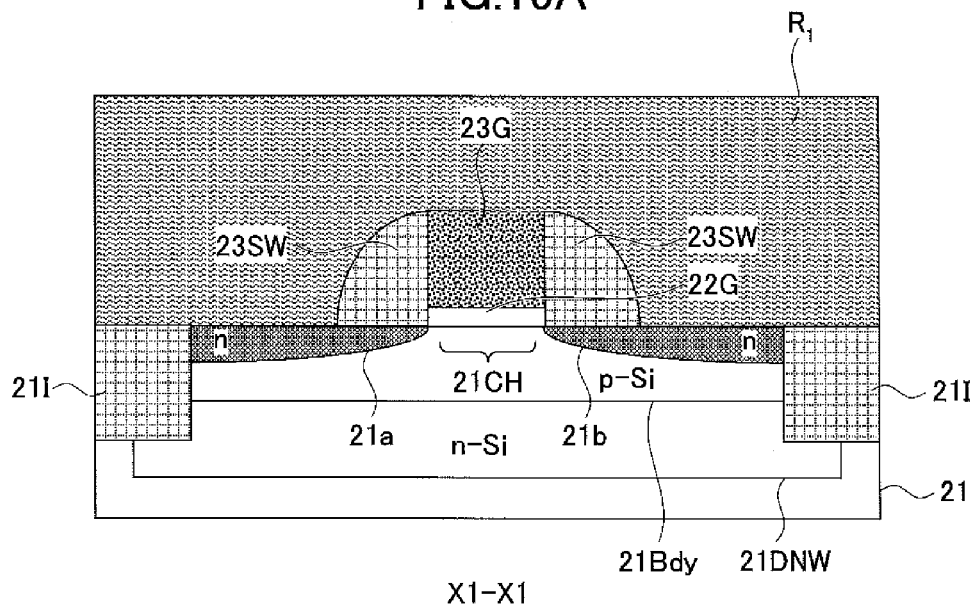
Figure 15B:
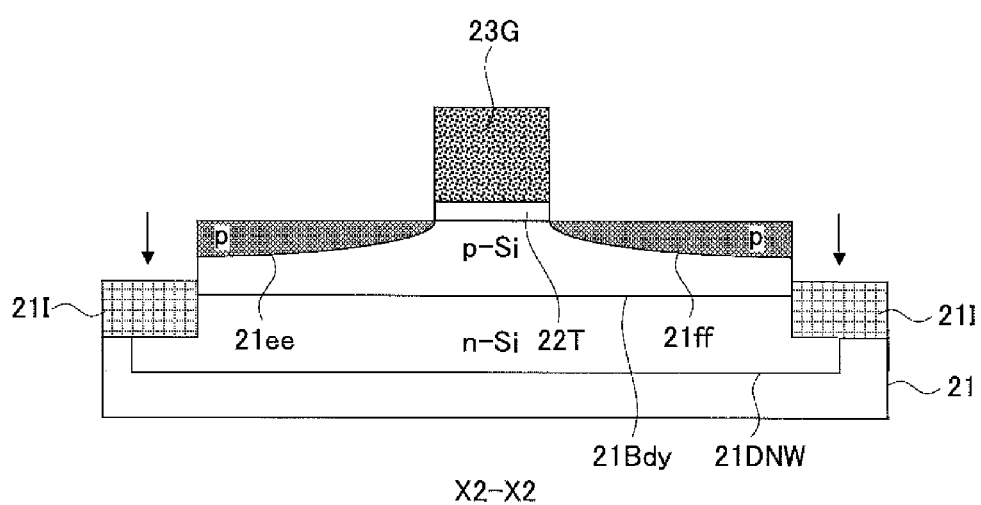
Figure 21:
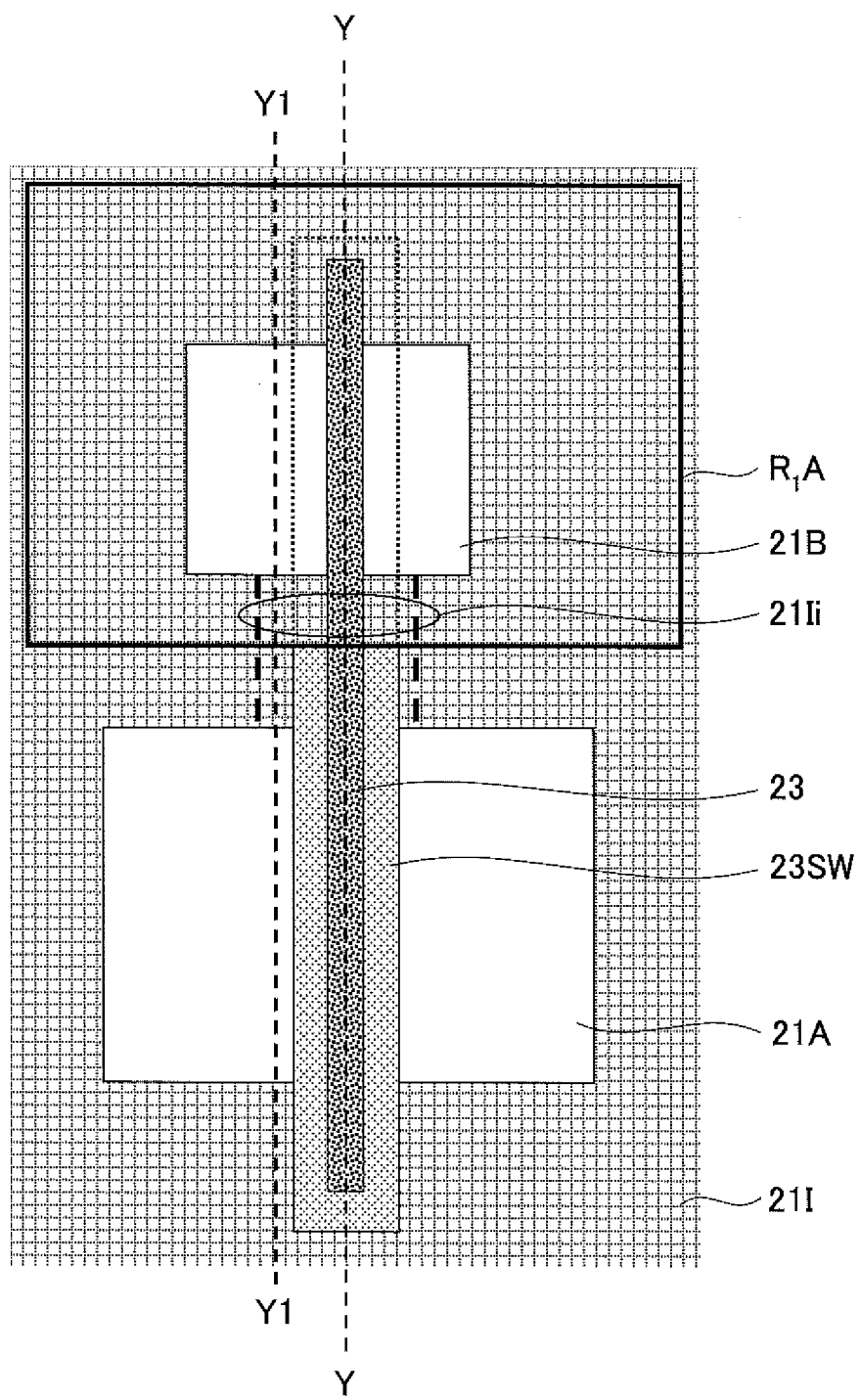
FIG. 21 is a plan-view diagram representing an outline of a resist mask used in the process of FIGS. 15A-15C.

As noted previously, the sidewall insulation films 23SW are formed of a silicon oxide film or a silicon nitride film or a stack of these films, wherein it should be noted that the present embodiment removes the sidewall insulation films 23SW in the step of FIGS. 15A-15C from the gate tap region 21B by a dry etching process conducted in the state that the device region 21A is protected by a resist pattern $R_1$ having a resist opening $R_1A$. The dry etching process may use $CF_4$ or $CHF_3$ as an etching gas and may be conducted under a high etching selectivity condition determined such that the sidewall insulation films 23SW are removed with a high etching rate as compared with the silicon substrate 21 or the gate electrode 23. With this, the both sidewall surfaces of the gate electrode 23G are exposed in the gate tap region 21B. As a result of the etching in the step of FIGS. 15A-15C, the sidewall insulation films 23SW are interrupted at the insulating region 21Ii as represented in the plan view diagram of FIG. 21. It should be noted that the plan view diagram of FIG. 21 corresponds to the structure of FIG. 15A-15C, and thus, those parts corresponding to the parts explained before are designated by the same reference numerals. In FIG. 21, it should be noted that the resist pattern $R_1$ is not illustrated. Only the resist opening $R_1A$ is represented. Further, FIG. 21 represents the insulating region 21Ii by a broken line. It should be noted that the etching of the sidewall insulation films 23SW is not limited to the dry etching process explained before but it is also possible to conduct the etching by a wet etching process that uses a buffered HF solution.

Meanwhile, in the step of FIGS. 15A-15C, there can be a case in which the silicon oxide film constituting the device isolation region 21I cause recession in the gate tap region 21B as indicated by an arrow as a result of the etching to remove the sidewall insulation films 23SW. Such recession occurs in the region not covered by the sidewall insulation films 23SW in the step of FIGS. 14A-14C. As a result, there can be a case in which the sidewall surface of the silicon substrate 21, in which the body region 21Bdy or the p-type contact regions 21ee and 21ff are formed is exposed as represented in the X2-X2 cross-section.

Figure 22:
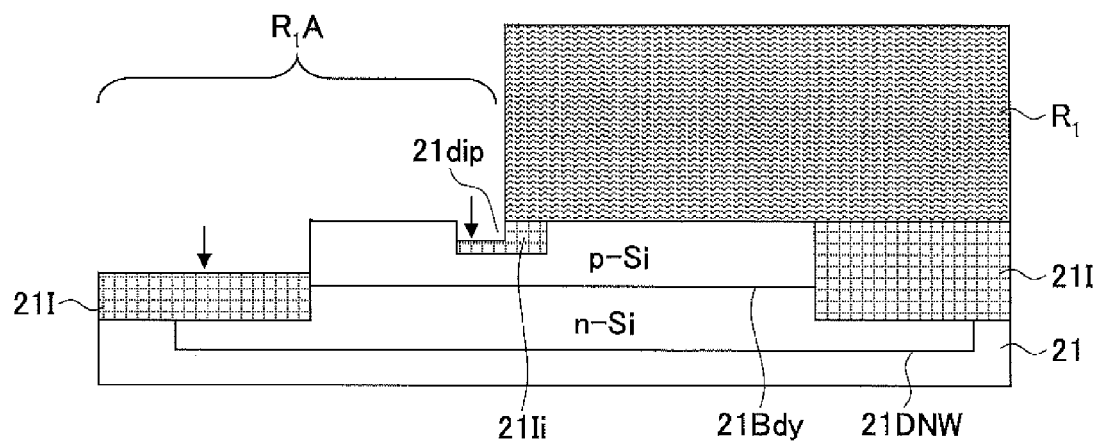
FIG. 22 is a cross-sectional diagram taken along a line Y1-Y1 of FIG. 21 representing an etching process of FIGS. 15A-15C in detail.

FIG. 22 is a cross-sectional diagram of the structure for the step of FIGS. 15A-15C, of which plan view is represented in FIG. 21, in a cross-section taken along a line Y1-Y1. As will be noted from FIG. 22, the line Y1-Y1 is set parallel to the line Y-Y and to cross the insulating region 21Ii at the outside of the sidewall insulation films 23SW.

Referring to FIG. 22, the recession of the silicon oxide film represented by the arrow takes place not only in the device isolation region 21I but also in the insulating region 21Ii as can be seen in the cross-section taken along the line Y1-Y1 and there is formed a depression 21dip that exposes the body region 21Bdy in the insulating region 21Ii. In some cases, the silicon oxide film may be removed totally in the depression 21dip represented in FIG. 22, resulting in exposure of the surface of the body region 21Bdy.

Figure 16A:
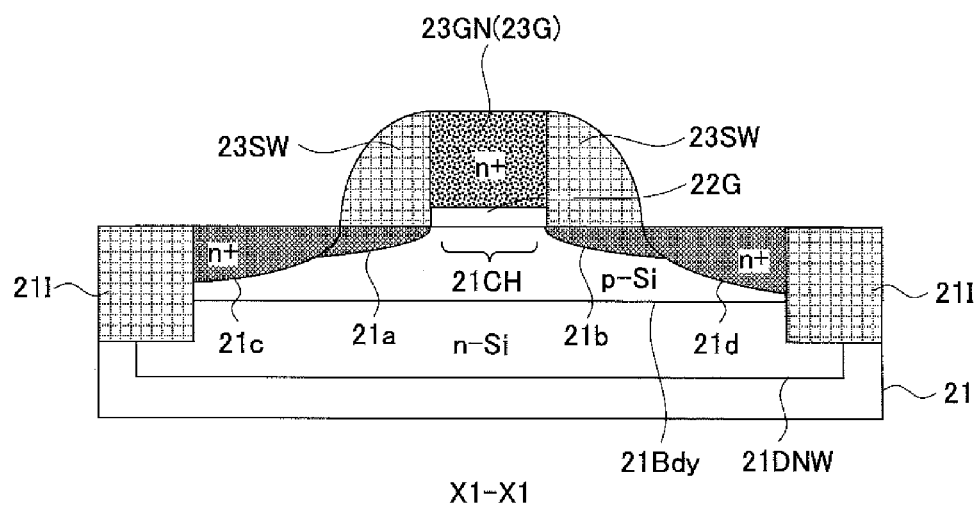
Figure 16B:
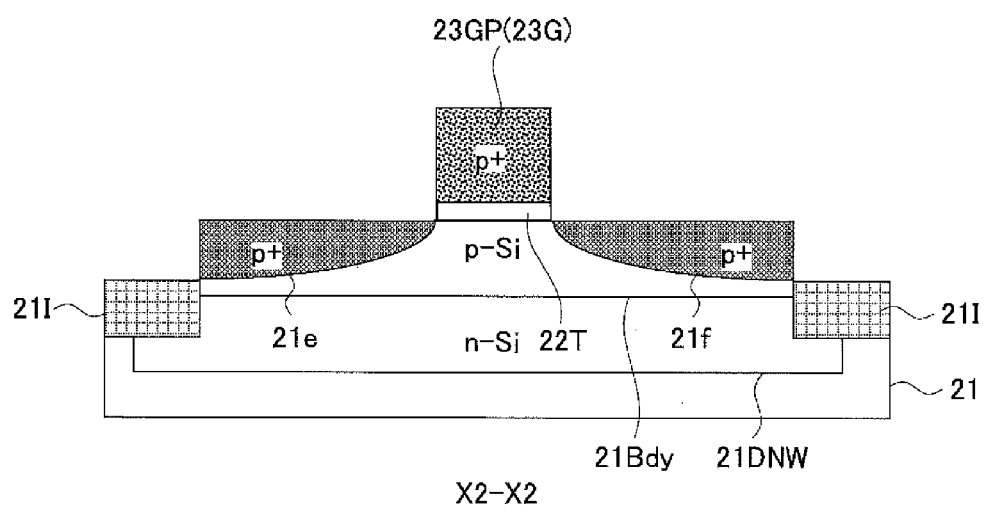

Further, the resist pattern $R_1$ is removed in the step of FIGS. 16A-16C, and an n-type impurity element such as P is introduced into the device region 21A under the acceleration voltage of 5 keV-30 keV and with the dose of $1\times10^{15}$ cm$^{-2}$-$1\times10^{16}$ cm$^{-2}$ while using the gate electrode 23G and the sidewall insulation films 23SW as a mask, and with this, there are formed a source region 21c and a drain region 21d of n$^+$-type in the body region 21Bdy at the respective outer sides of the side wall insulation films 23SW in partial overlapping with the source extension region 21a and the drain extension region 21b, respectively. With this ion implantation, the part of the gate electrode 23G that extends over the device region 21A is doped to the n$^+$-type and the gate electrode part 23GN of the n$^+$-type is formed.

Further, in the step of FIGS. 16A-16C, a p-type impurity element such as B is introduced into the gate tap region 21B under the acceleration voltage of 5 keV-30 keV and with the dose of $1\times10^{15}$ cm$^{-2}$-$1\times10^{16}$ cm$^{-2}$ while using the gate electrode 23G as a mask, and with this, the contact regions 21e and 21f of p$^+$-type are formed in the body region 21Bdy respectively in correspondence to the p-type regions 21ee and 21ff. Further, with this ion implantation, the part of the gate electrode 23G that extends over the gate tap region 21B is doped to the p⁺-type and the gate electrode part 23GP of the p⁺-type is formed.

Figure 23:
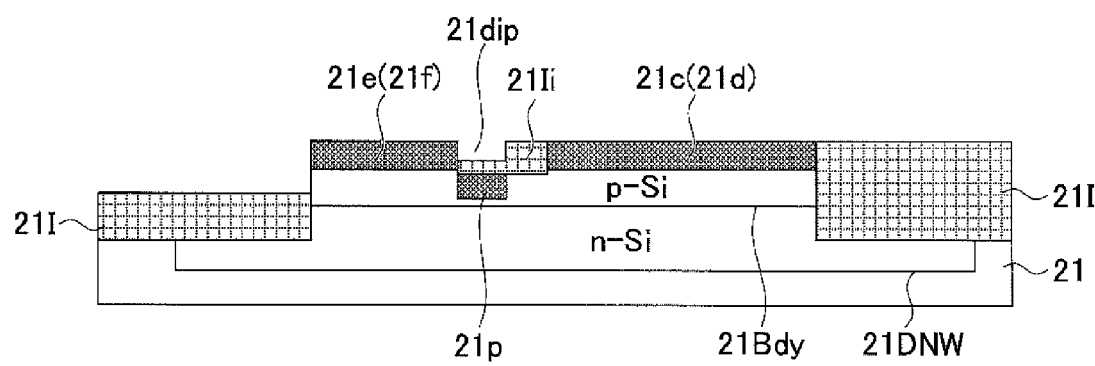
FIG. 23 is a cross-sectional diagram taken along a line Y1-Y1 of FIG. 21 representing an ion implantation process of FIG. 16A-16C in detail.

FIG. 23 is a cross-sectional diagram taken along a line Y1-Y1 of FIG. 21 corresponding to the ion implantation process of FIGS. 16A-16C.

Figure 24:
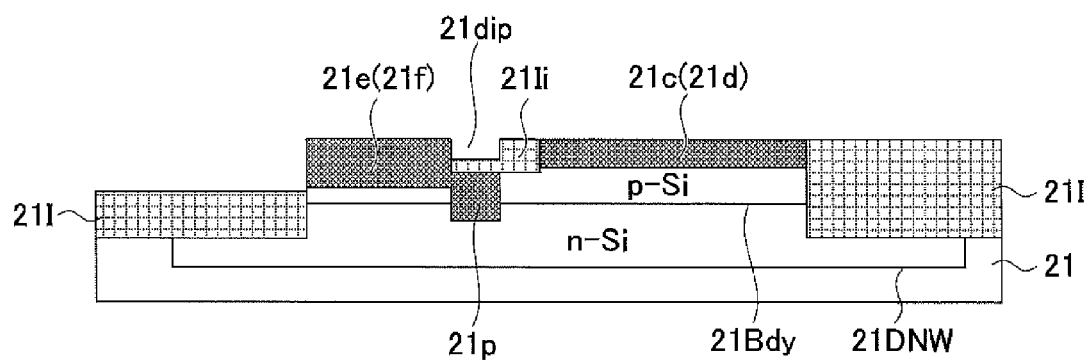
FIG. 24 is a cross-sectional diagram representing another example of the ion implantation process of FIG. 23.

Referring to FIG. 23, it will be noted that, as a result of the ion implantation into the gate tap region 21B, there is formed a p-type region 21p at the bottom of the depression 21dip simultaneously to the formation of the p⁺-type contact regions 21e and 21f at the surface of the body region 21Bdy. Depending on the ion implantation energy, there can also be a situation in which the foregoing p-type region 21p reaches the underlying n-type well 21DNW as represented in a cross-sectional diagram of FIG. 24. Occurrence of such a situation is preferable in view of the fact that there is caused no problem in the operation of the Dt-MOS transistor and in view of the fact that resistance is reduced in the electrical connection between the device region 21A and the gate tap region 21B via the body region 21Bdy. In the case of FIG. 24, it is noted that the p-type region 21p reaches the n-type well 21DNW. Even in such a case, the p-type region 21p is isolated from the n-type well 21DNW by a p/n junction, and no electrical connection is formed therebetween. It is desirable, however, to avoid the situation in which the p-type region 21p reaches the p-type silicon substrate 21 underneath the deep n-type well 21DNW.

Figure 17A:
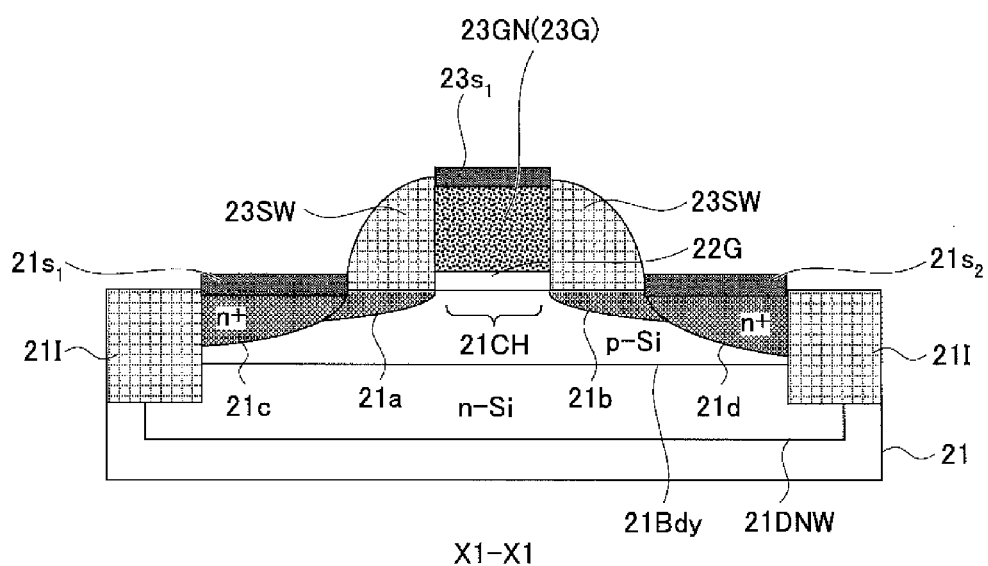
FIGS. 17A-17C are eleventh cross-sectional diagrams explaining the fabrication process of the semiconductor device according to the first embodiment.
Figure 17B:
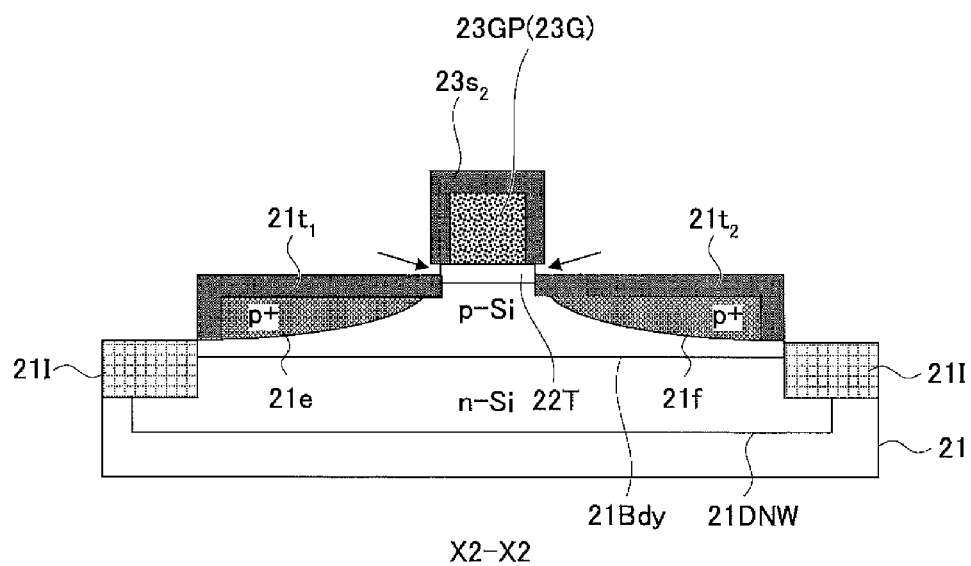
Figure 17C:
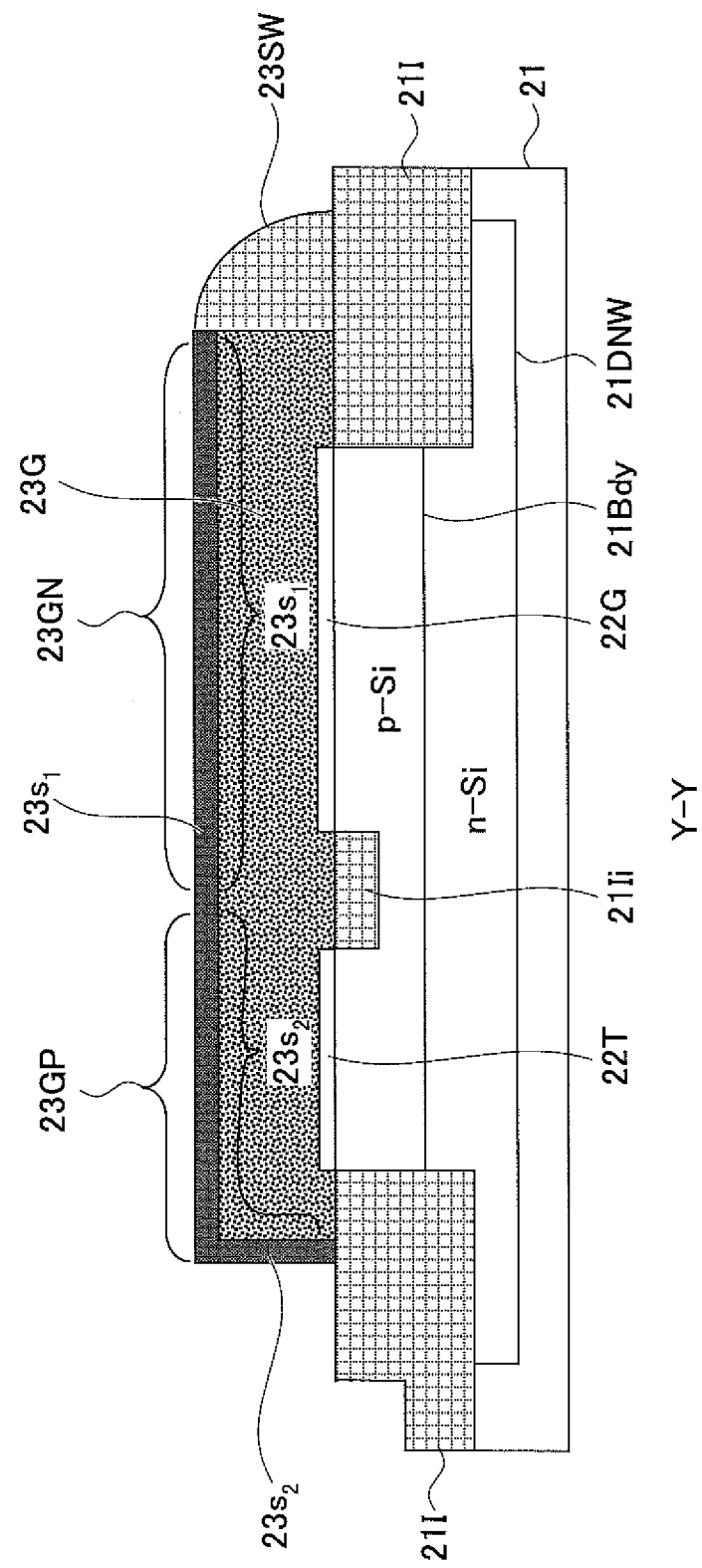

Next, in the step of FIGS. 17A-17C, a low resistance film of silicide such as $CoSi_2$ is formed on the exposed silicon surface in the structure of FIGS. 16A-16C by a salicide process, and as a result, the silicide layer $23s_1$ is formed on the top surface of the gate electrode part 23GN in the cross-sectional diagram of FIG. 17A. Further, in the cross-section of FIG. 17B, it can be seen that the silicide layer $23s_2$ is formed on the top surface and the sidewall surfaces of the gate electrode part 23GP, wherein the silicide layer $23s_2$ is in continuation to the silicide layer $21s_1$ as represented in FIG. 17C. In the description hereinafter, the silicide layer $23s_1$ is defined as a gate silicide layer formed on the gate electrode part 23GN and the silicide layer $23s_2$ is defined as a gate silicide layer formed on the gate electrode part 23GP.

Further, as a result of the salicide process, the silicide layer $21s_1$ is formed on the source region 21c and the silicide layer $21s_2$ is formed on the drain region 21d as represented in the cross-section of FIG. 17A. Further, in the cross-section of FIG. 17B, the silicide layer $21t_1$ is formed on the contact region 21e and the silicide layer $21t_2$ is formed on the contact layer 21f.

These silicide layers $21s_1$, $21s_2$, $21t_1$, $21t_2$, $23s_1$ and $23s_2$ are formed by the salicide process with a film thickness of 10 nm-20 nm, for example.

Meanwhile, there can be a case, in the dry etching process of FIGS. 16A-16C explained previously, that a part of the device isolation region 21I causes recession in the gate tap region 21B as represented in the cross-section of FIG. 16B, leading to exposure of the sidewall surface of the p-type body region 21Bdy at the contact regions 21e and 21f of the p⁺-type. In such a case, there can be a case in which the contact regions 21e and 21f causes short circuit with the p-type body region 21Bdy via the silicide layer $21t_1$ or $21t_2$ in the silicide formation process of FIGS. 17A-17C. It should be noted, however, that, even when the short circuit to the body region 21Bdy takes place by way of such silicide layers, there is caused no effect on the device operation in view of the fact that both the contact region 21e and the contact regions 21f are of a p⁺-type region. In the X1-X1 cross-section represented in FIG. 16A, the sidewall insulation films 23SW are not removed, and associated with this, there occurs no recession in the device isolation region 21I in contrast to the X2-X2 cross-section. Thus, the foregoing removal of the sidewall insulation films 23SW does not affect on the operational characteristic of the MOS transistor formed in the device region 21A.

Figure 25:
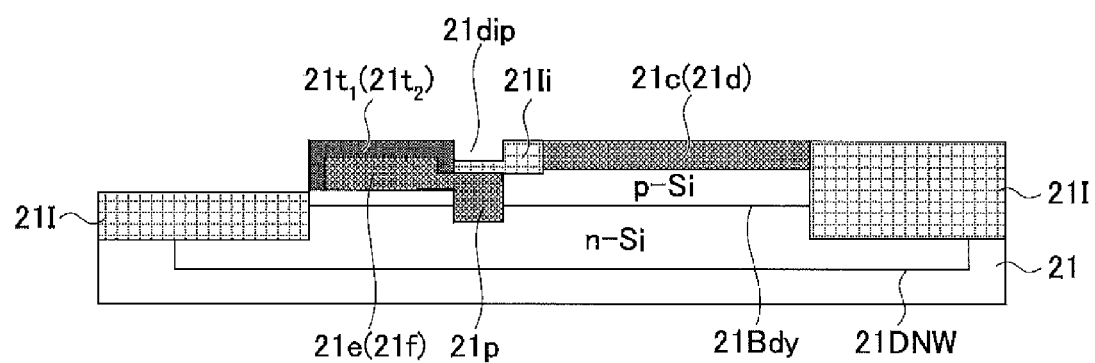
FIG. 25 is a cross-sectional diagram taken along a line Y1-Y1 of FIG. 21 representing a silicide formation process of FIGS. 17A-17C.

FIG. 25 is a cross-sectional diagram taken along a line Y1-Y1 of FIG. 21 corresponding to the process of FIGS. 17A-17C.

Referring to FIG. 25, it can be seen that the silicide layer $21t_1$ or $21t_2$ is formed not only on the top surface of the silicon substrate 21 in the body region 21Bdy but also on the bottom surface and the sidewall surface of the depression 21dip not covered by the insulating film 21Ii and further on the sidewall surface of the silicon substrate 21 exposed by the recession of the device isolation region 21I.

In the silicide formation process of FIGS. 17A-17C, it will be noted that there is formed a recession in the insulation film 22T right underneath the gate electrode part 23GP as represented in the X2-X2 cross-section of FIG. 17B by arrows, wherein this recession is caused as a result of the cleaning process conducted in advance of the silicide formation process to clean the surface of the structure represented in FIGS. 16A-16C with HF. As a result of the recession of the insulation film 22T caused in advance of the silicide formation, it should be noted that the silicide layers $21t_1$ and $21t_2$ are formed in the gate tap region 21B adjacent to the insulation film 22T.

Figure 18A:
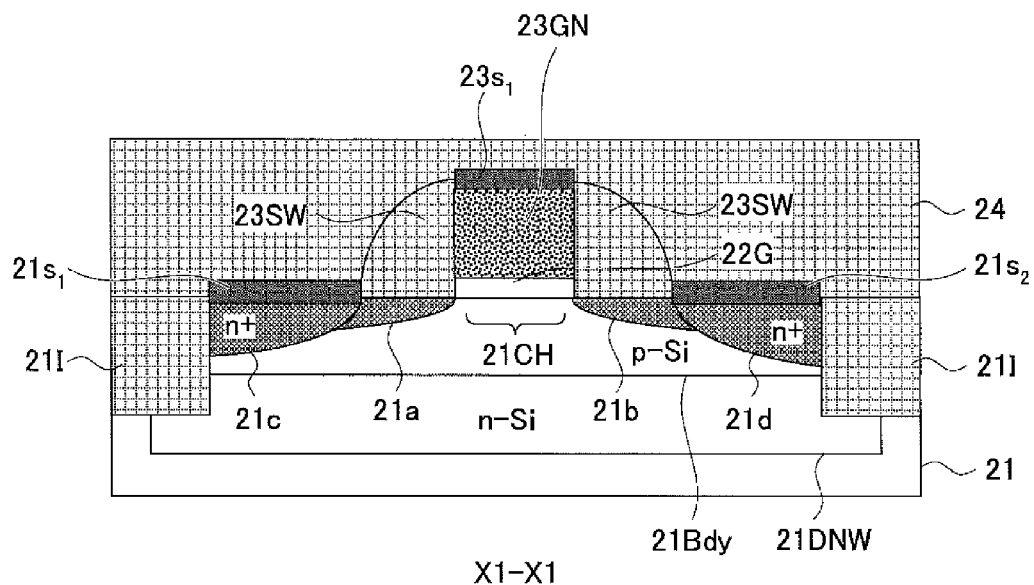
FIGS. 18A-18C are twelfth cross-sectional diagrams explaining the fabrication process of the semiconductor device according to the first embodiment.
Figure 18B:
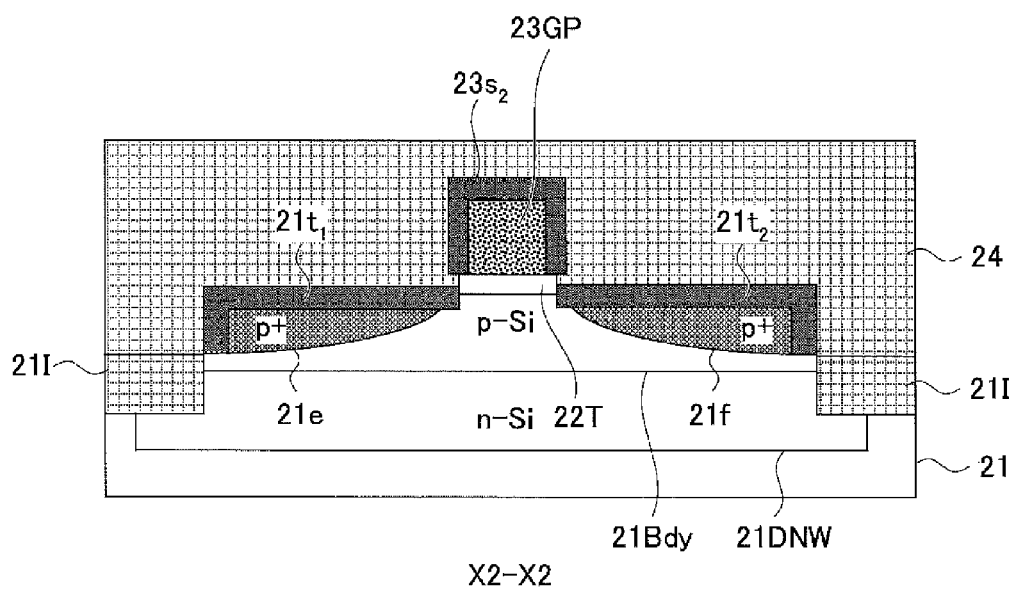
Figure 18C:
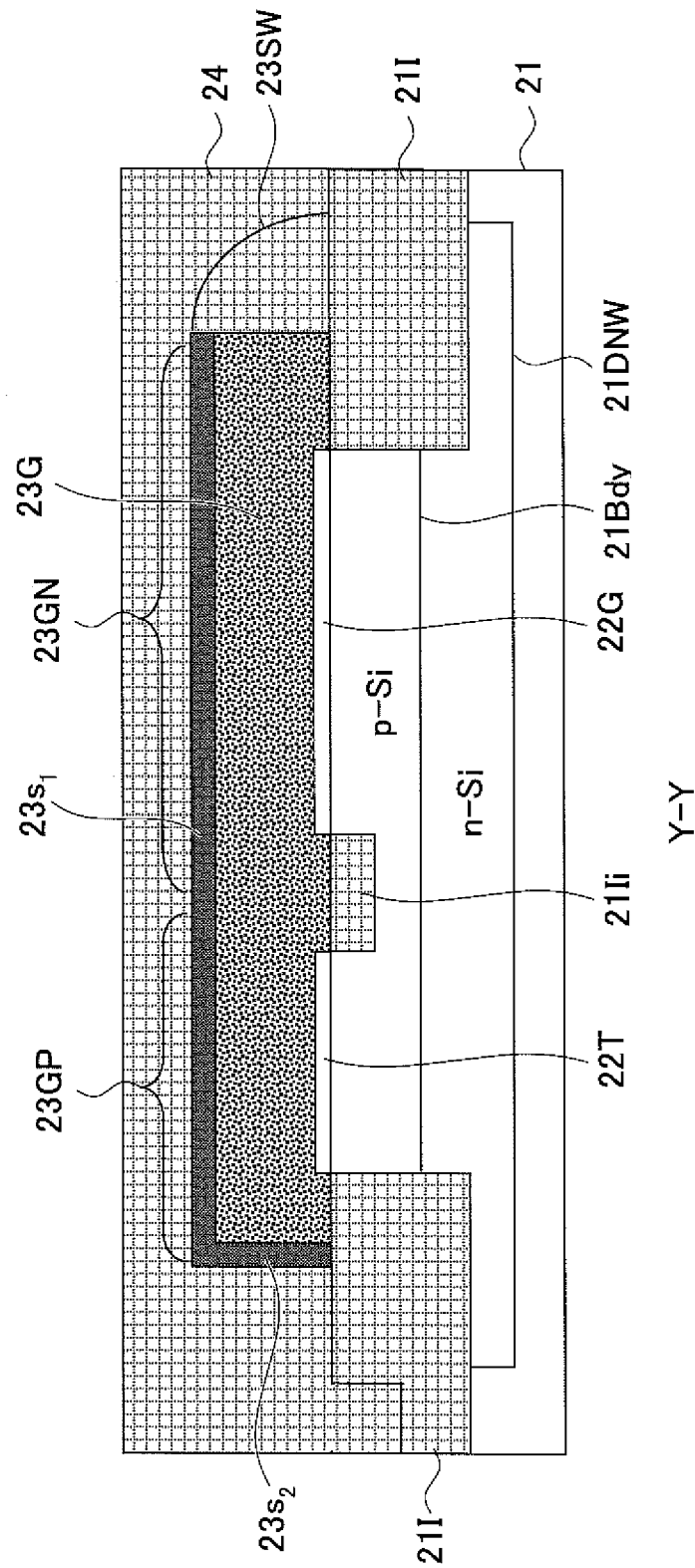
Figure 19A:
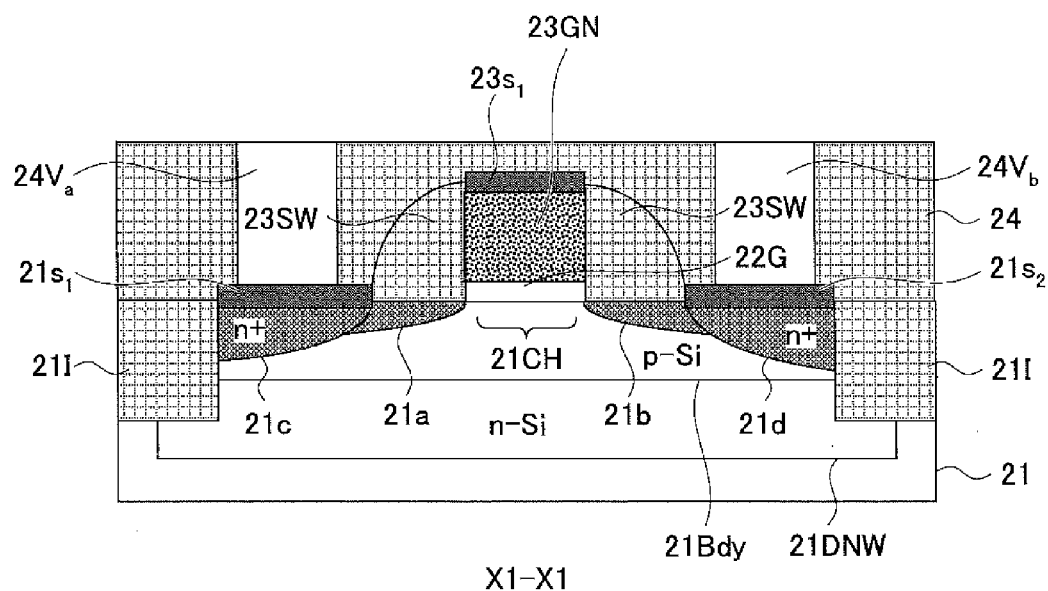
Figure 19B:
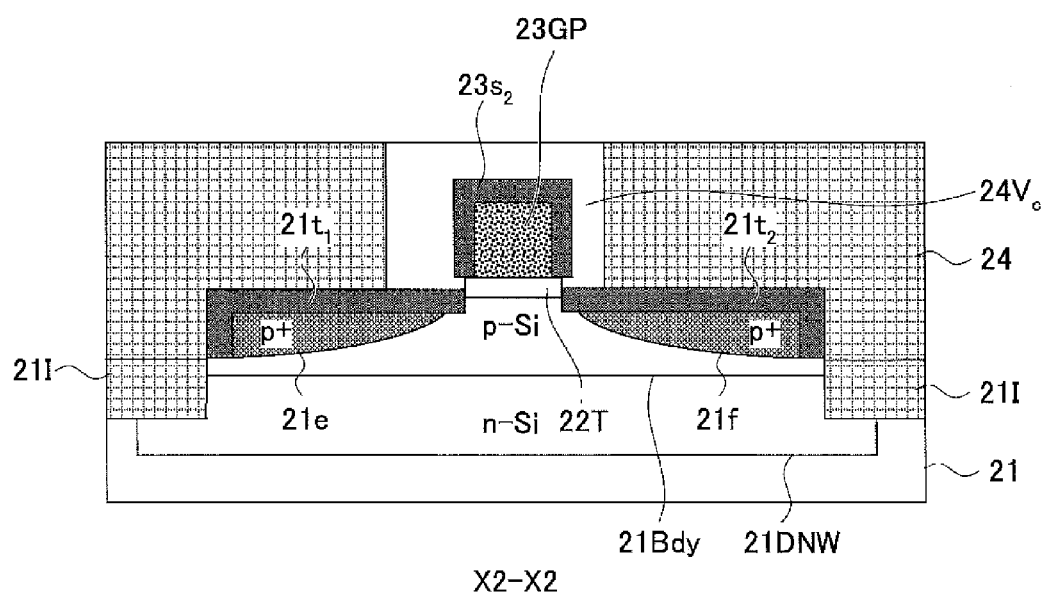

Next, in the step of FIGS. 18A-18C, the interlayer insulation film 24 is formed on the silicon substrate 21 to cover the gate electrode part 23GN via the sidewall insulation films 23SW and the silicide layer $23s_1$ in the device region 21A as represented in FIG. 18A and further to directly cover the silicide layer $23s_2$ on the top surface and the sidewall surfaces of the gate electrode part 23GP as represented in FIG. 18B. Further, in the step of FIGS. 19A-19C, the interlayer insulation film 24 is formed with via-holes 24Va-24Vc to expose the silicide layers $21s_1$, $21s_2$ and $23s_2$, respectively.

Further, in the step of FIGS. 20A-20C, via-plugs $24V_A$, $24V_B$ and $24V_C$ are formed respectively in the via-holes 24Va-24Vc in correspondence to the via-plugs $V_1$, $V_2$ and 24P explained with reference to FIG. 1. Here, the via-plug $24V_C$ is a shared via-contact plug and makes a contact with the top surface and both sidewall surfaces of the gate electrode part 23GP in the gate tap region 21B via the silicide layer $23s_2$. Thereby, the via-plug $24V_C$ connects the gate electrode 23 to the p-type body region 21Bdy of p-type electrically via the silicide layers $21t_1$ and $21t_2$ and the contact regions 21e and 21f. With this, the Dt-MOS transistor 20 is formed on the silicon substrate 21 in the state that the gate electrode 23G is electrically connected to the body region 21Bdy.

Figure 20A:
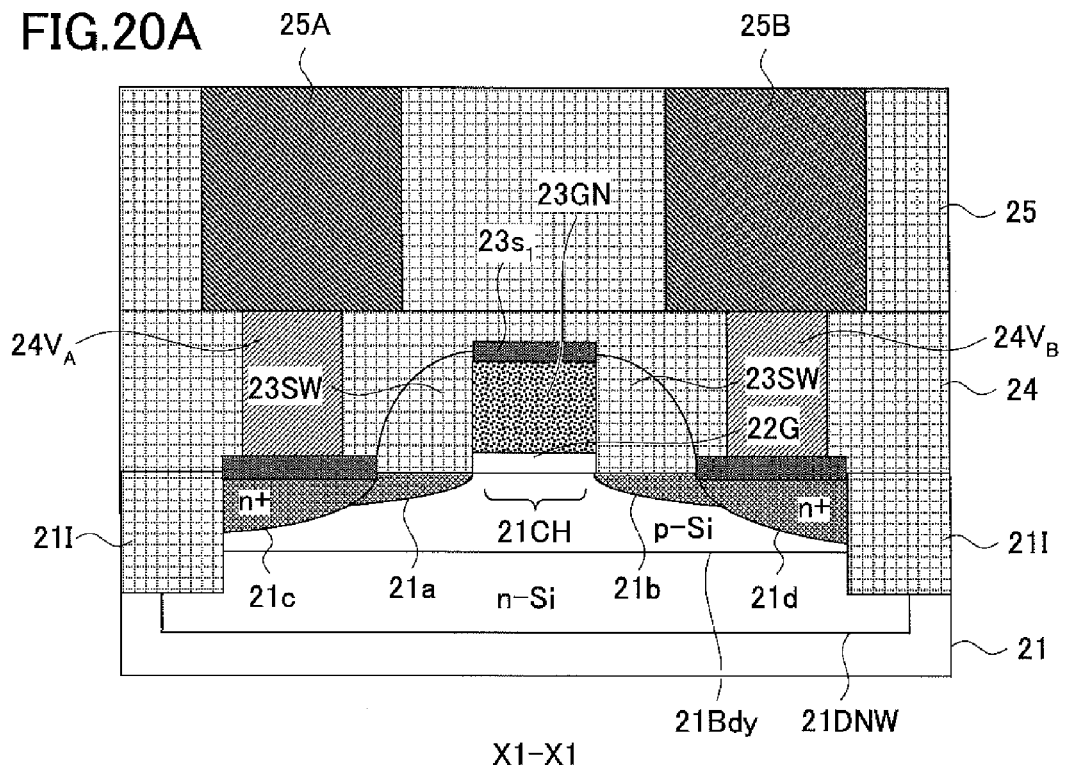
FIGS. 20A-20C are fourteenth cross-sectional diagram explaining the fabrication process of the semiconductor device according to the first embodiment.
Figure 20B:
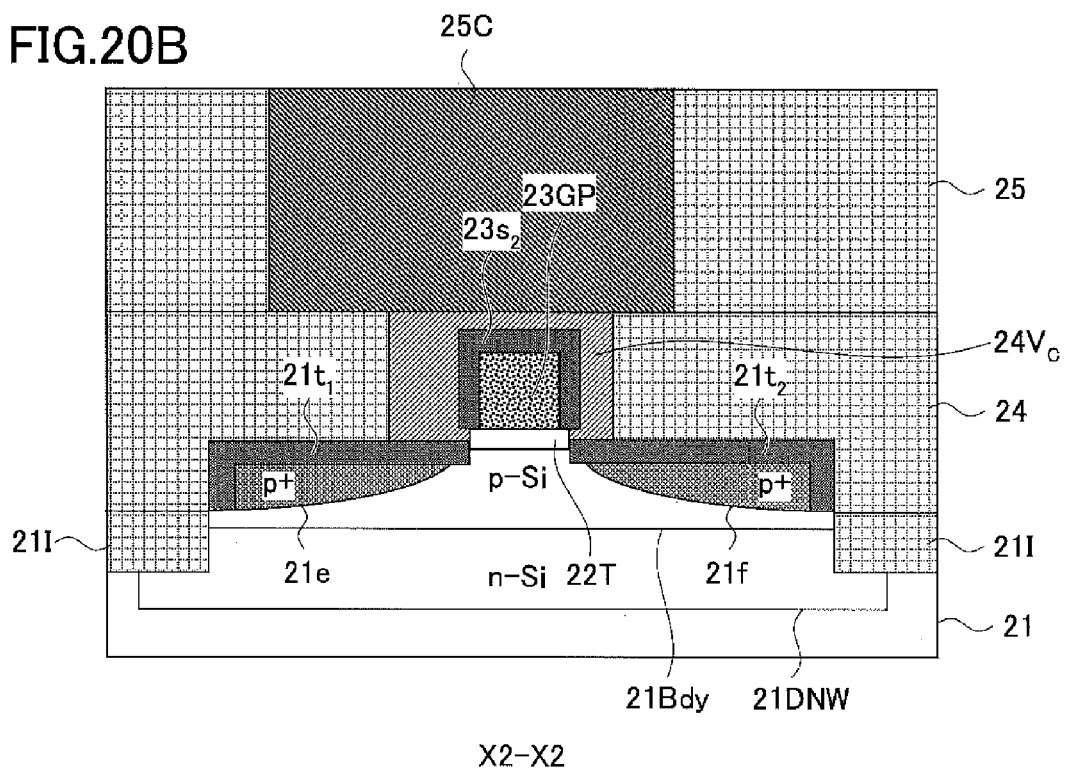
Figure 20C:
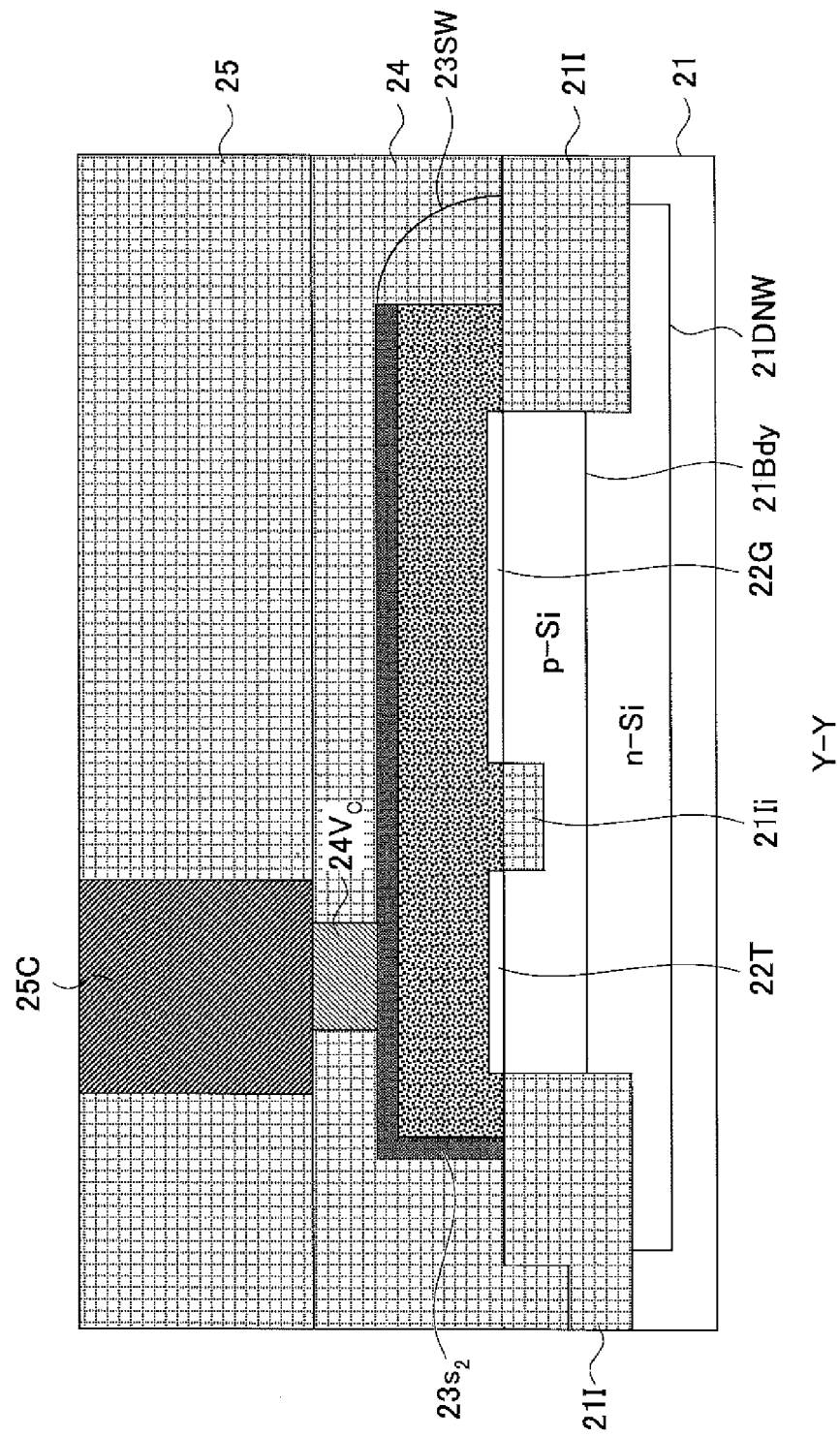

Further, in the step of FIGS. 20A-20C, a next interlayer insulation film 25 is formed on the interlayer insulation film 25 and the interlayer insulation film 25 is formed with wiring patterns 25A-25C respectively in correspondence to the via-plugs $24V_A$-$24V_C$.

Figure 26:
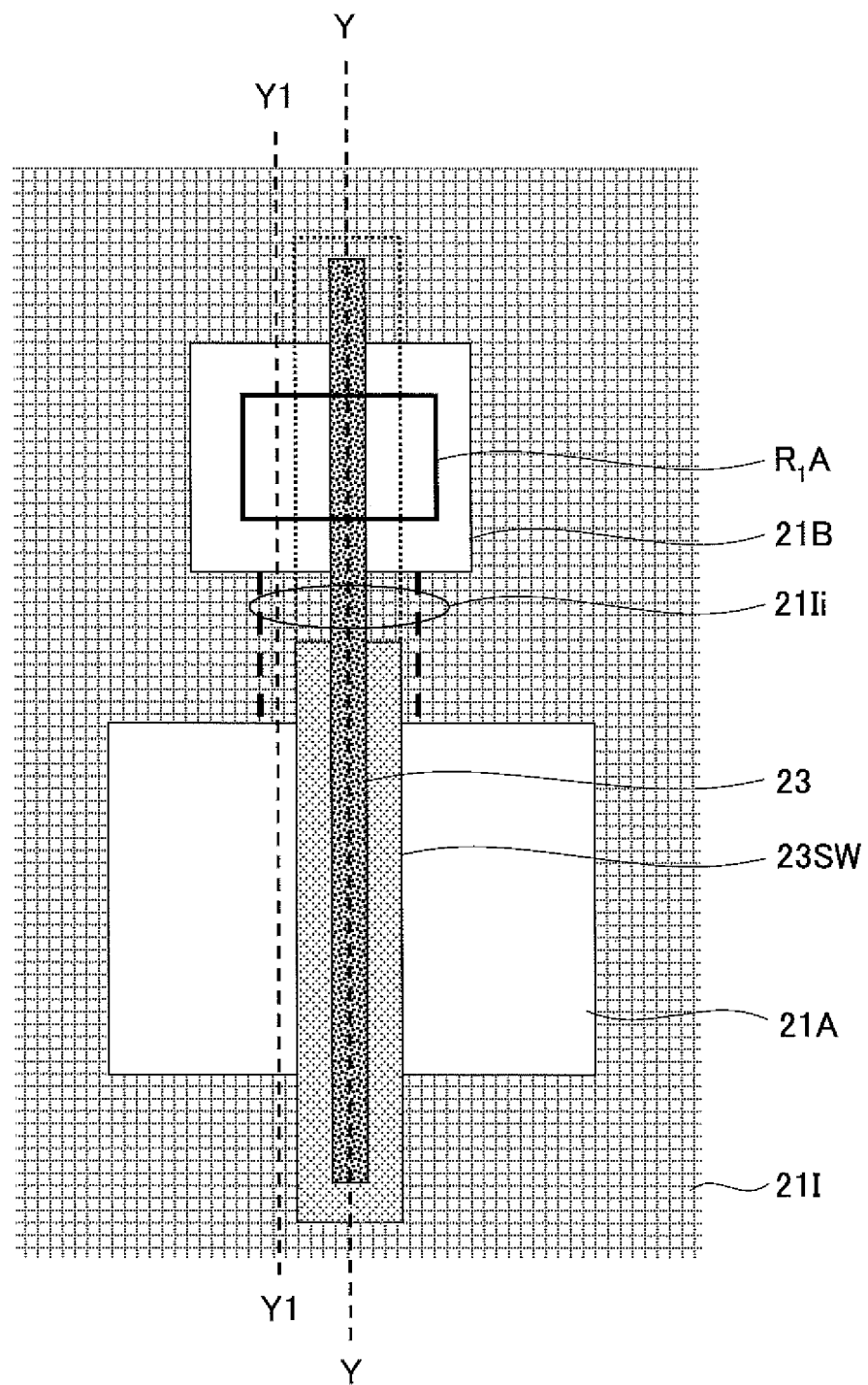
FIG. 26 is a plan view diagram representing a modification of the mask pattern used in the first embodiment.

Meanwhile, in the step of FIGS. 15A-15C of the present embodiment, it is also possible to form the resist pattern $R_1$ such that the resist opening $R_1A$ exposes only a part of the gate electrode 23G and the associated sidewall insulation films 23SW in the tap region 21B as represented in FIG. 26.

Figure 27A:
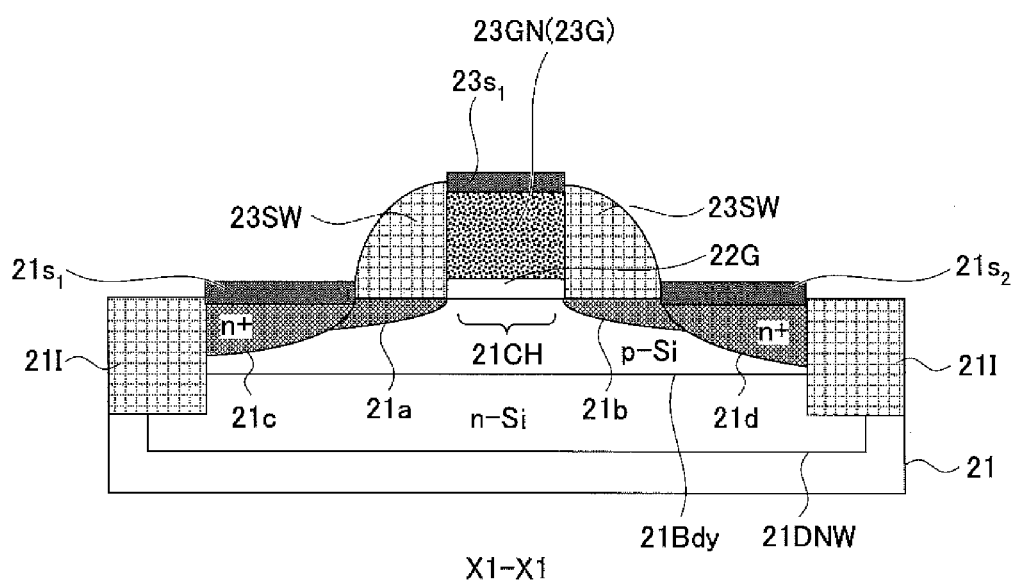
Figure 27B:
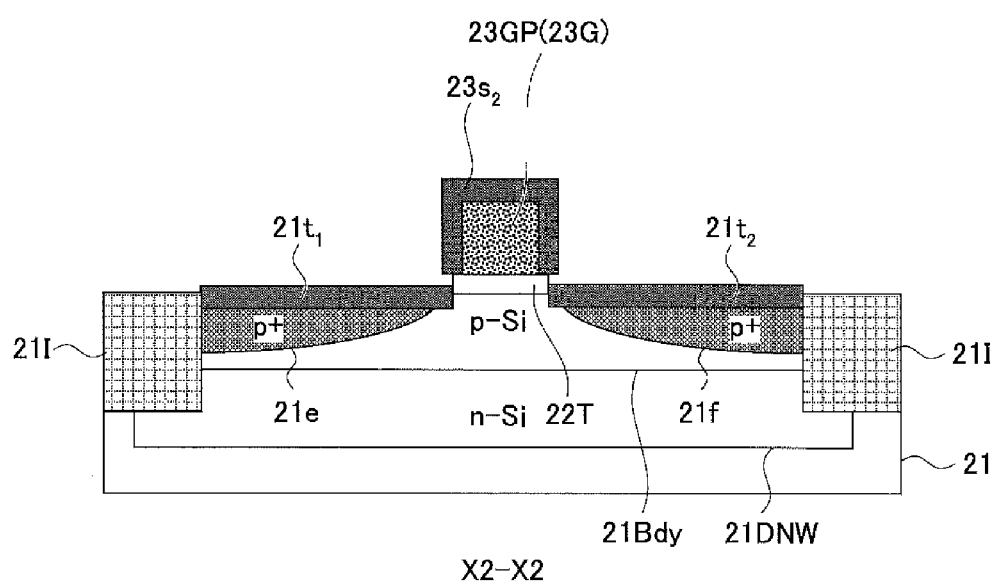

In the case the sidewall insulation films 23SW are removed by using the resist pattern $R_1$ with the resist opening $R_1A$ of FIG. 26, it is possible to avoid the recession occurring in the device isolation region 21I or the insulating region 21Ii as represented in FIGS. 27A-27C. In FIGS. 27A-27C, it should be noted that FIG. 27A represents a cross-sectional diagram taken along the line X1-X1 in FIG. 1, FIG. 27B represents a cross-sectional diagram taken along the line X2-X2 in FIG. 1 and FIG. 27C represents a cross-sectional diagram taken along the line Y-Y in FIG. 1. In FIGS. 27A-27C, those parts explained before are designated by the same reference numerals and the description thereof will be omitted. FIGS. 27A-27C correspond to the step of FIGS. 17A-17C.

Hereinafter, a first modification of the present embodiment will be explained.

In the foregoing explanations, the ion implantation process for forming the source and drain regions 21S and 21D and the gate contact regions 21e and 21f has been conducted after the sidewall insulation films 23SW are removed from the gate tap region 21B in the step of FIGS. 15A-15C. With the present modification, the ion implantation is conducted before removing the sidewall insulation films 23SW as represented in FIGS. 28A-28C, FIGS. 29A-29C and FIGS. 30A-30C. In FIGS. 28A-28C, FIGS. 29A-29C and FIGS. 30A-30C, those parts explained before are designated by the same reference numerals and the description thereof will be omitted.

Figure 28A:
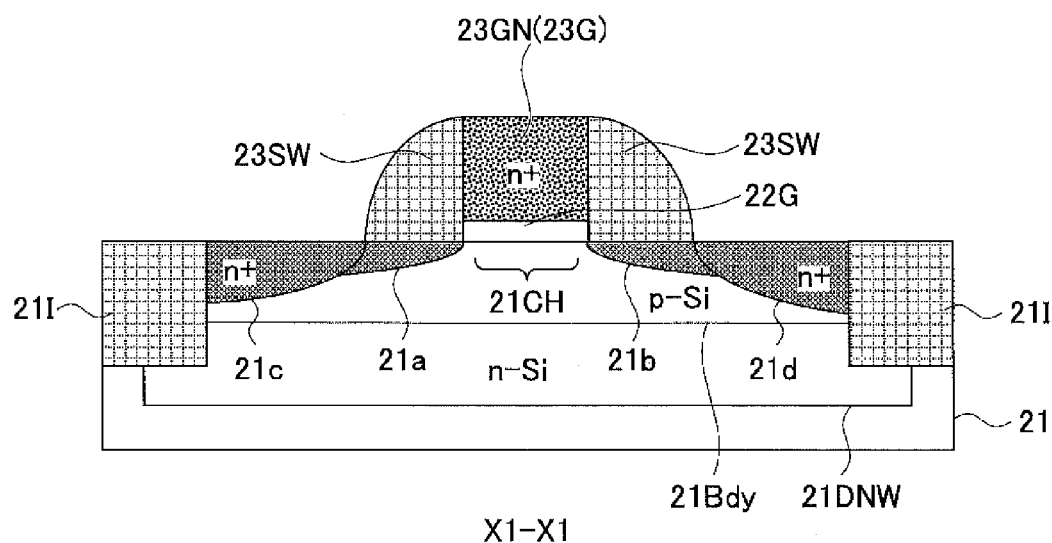
Figure 28B:
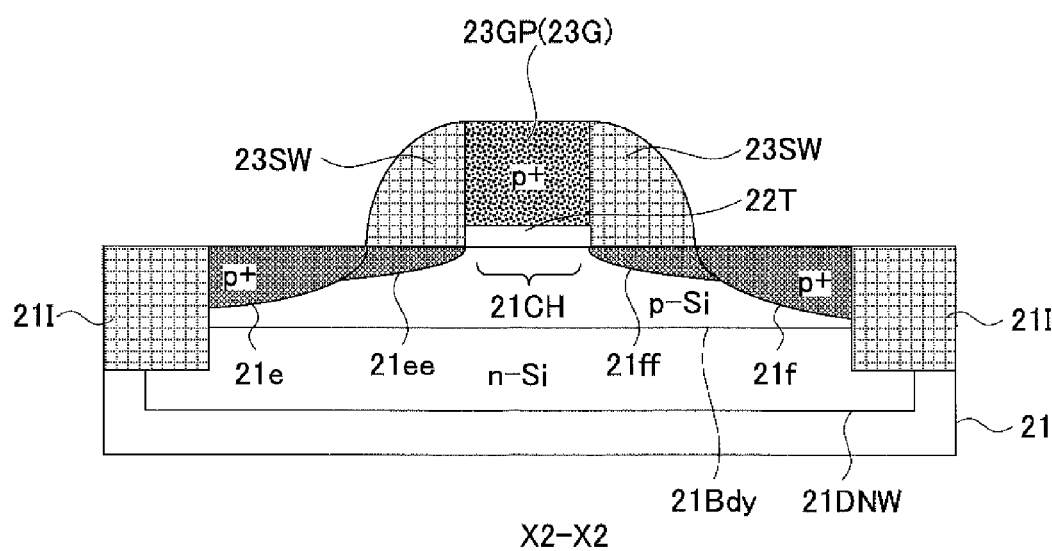

Thus, after the step of FIGS. 14A-14C, the p-type impurity element is introduced into the gate tap region 21B with high concentration in the state the sidewall insulation films 23SW are formed on the gate electrode 23G as represented in FIG. 28B, and with this, the gate contact regions 21e and 21f are formed with the p$^+$-type conductivity. Further, in the device region 21A, the source region 21S and the drain region 21D of n$^+$-type are formed separately as represented in FIG. 28A.

Figure 29A:
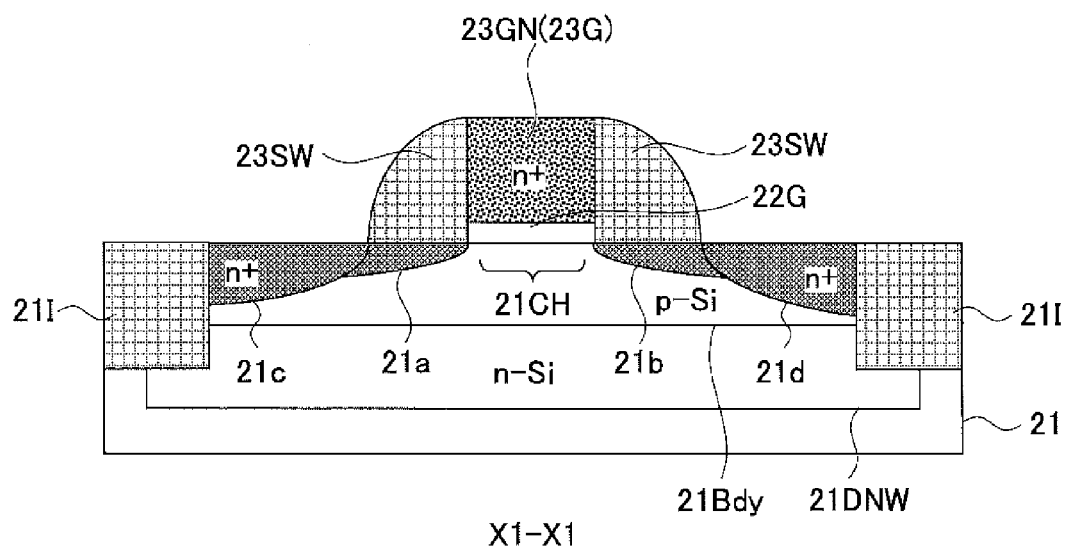
FIGS. 29A-29C are second cross-sectional diagrams representing the process of fabricating the semiconductor device according to the second modification of the first embodiment.
Figure 29B:
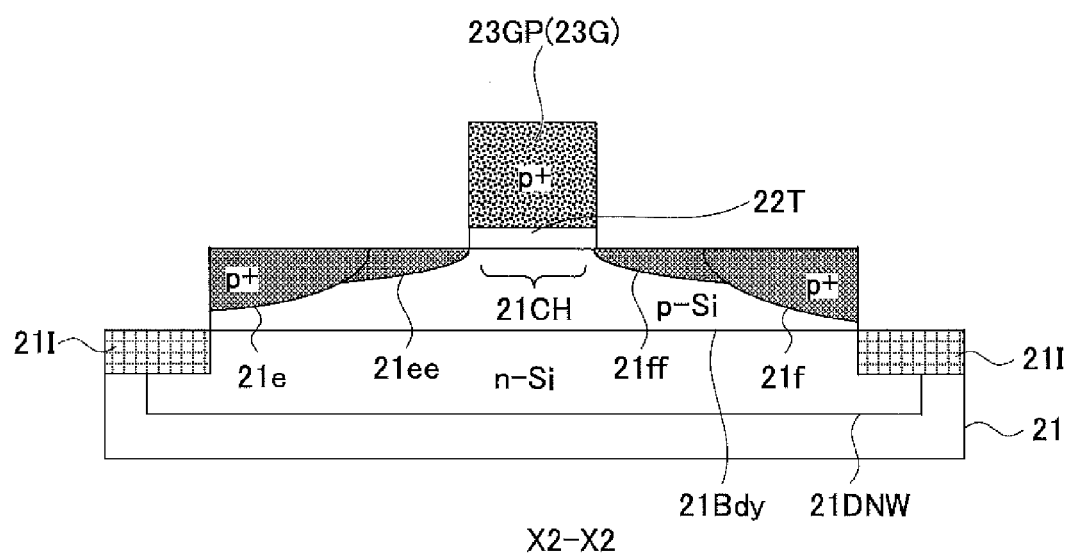
Figure 29C:
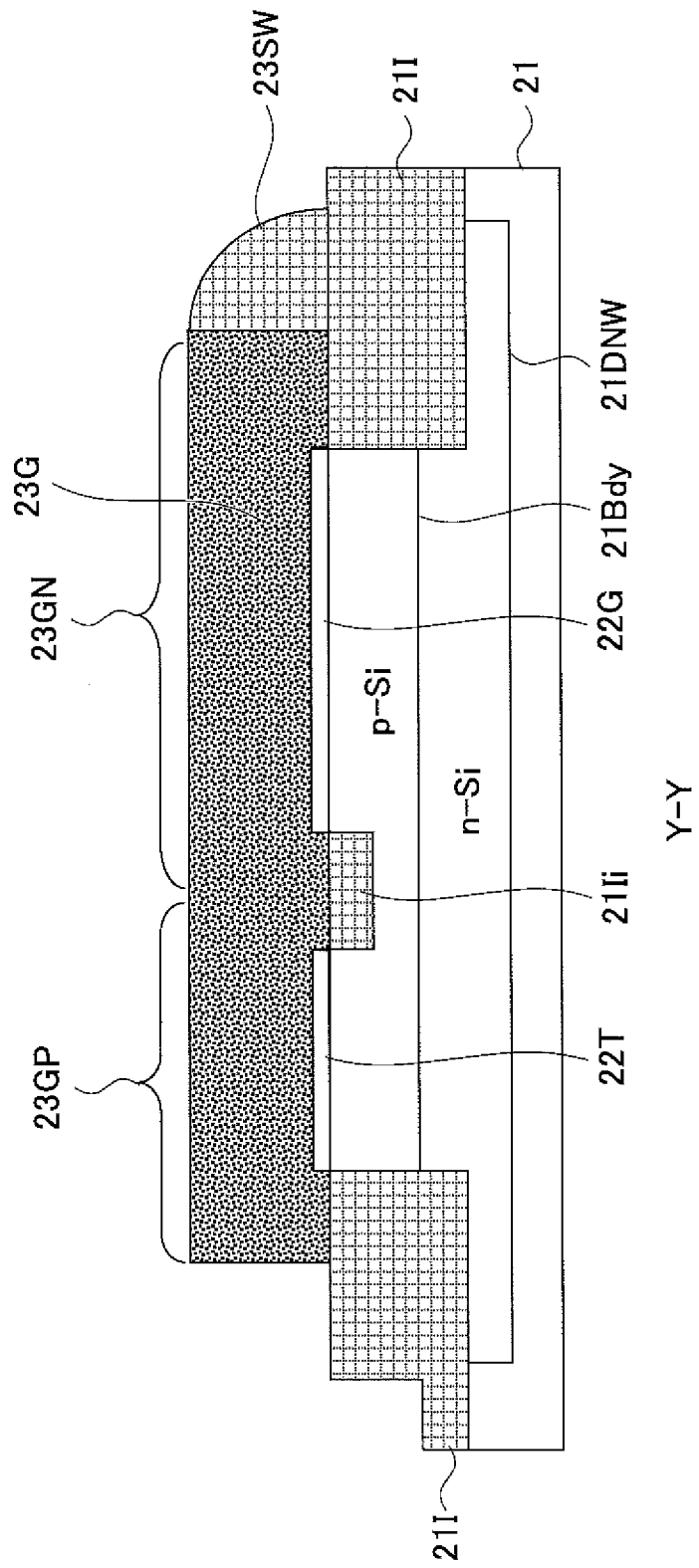
Figure 30A:
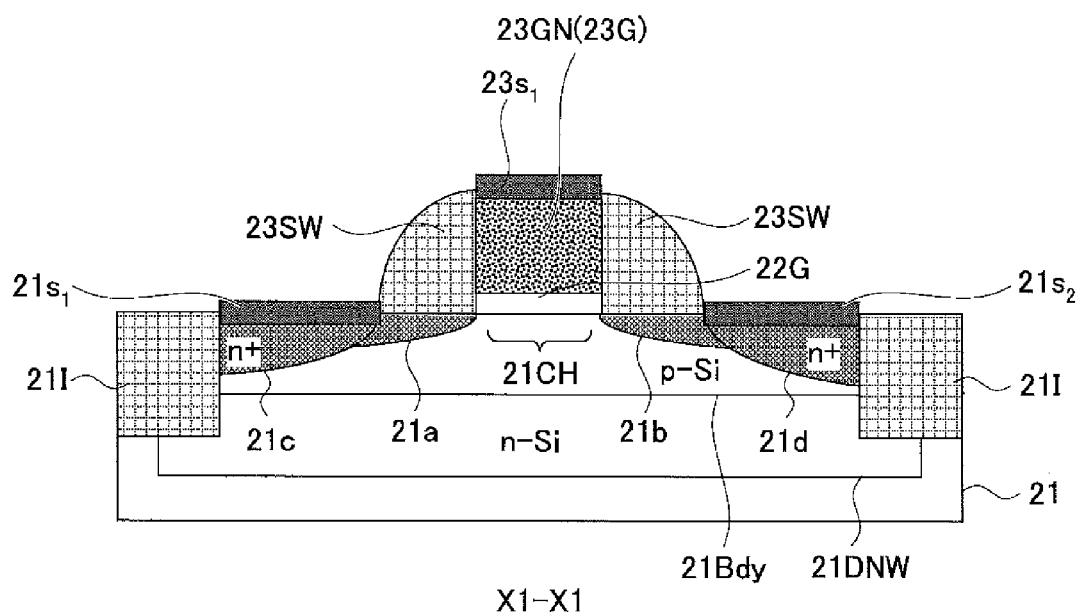
Figure 30B:
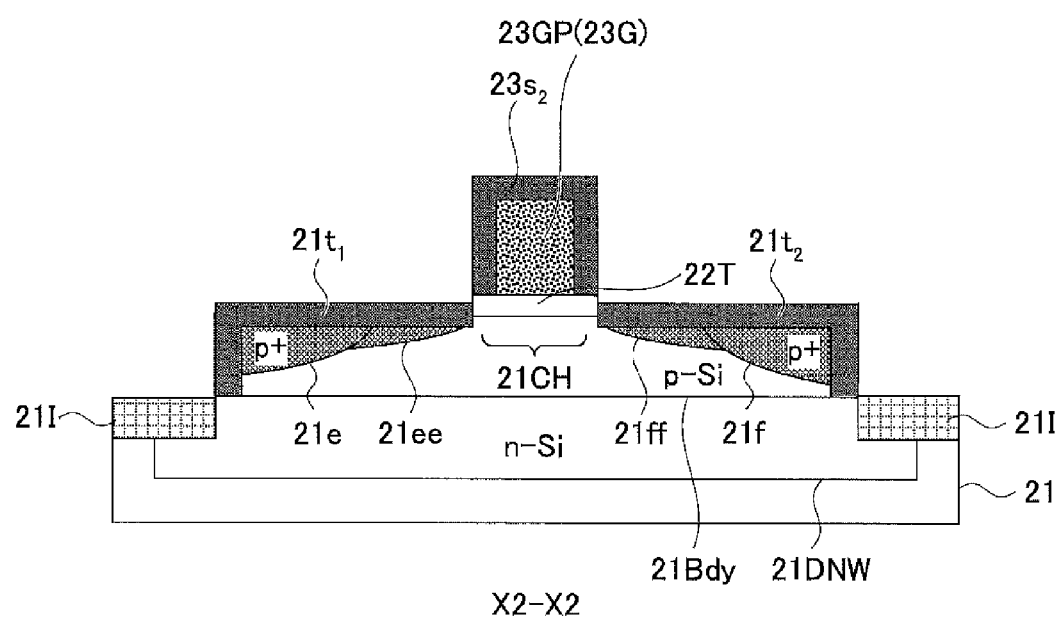

Next, in the step of FIGS. 29A-29C, the sidewall insulation films 23SW are removed only in the gate tap region 21B and silicide formation is conducted in the step of FIGS. 30A-30C in the device region 21A and the gate tap region 21B by a salicide process. With this, the silicide layer $23s_1$ is formed on the gate electrode part 23GN in the device region 21A and the silicide layers $21s_1$ and $21s_2$ are formed respectively on the source region 21S and the drain region 21D similarly to the previous embodiment. At the same time, the silicide layer $23s_2$ is formed on the top surface and both sidewall surfaces of the gate electrode part 23GP in the gate tap region 21B and the silicide layers $21t_1$ and $21t_2$ are formed further on the top surface of the gate contact regions 21e and 21f and on the sidewall surface formed as a result of recession of the device isolation region 21I.

With the modification of FIGS. 28A-28C, 29A-29C and 30A-30C, in which the silicide layers $21t_1$ and $21t_2$ extend to the region close to the gate electrode part 23GP, it becomes possible to connect the gate electrode 23G to the body region 21Bdy electrically with low resistance by using the shared contact plug 24Vc of compact size explained with reference to FIGS. 20A-20C in spite of the fact that the contact regions 21e and 21f of p$^+$-type are formed with separation from the gate electrode part 23GP of p$^+$-type.

Hereinafter, a second modification of the present embodiment will be explained.

While explanation has been made in the previous embodiment to form the sidewall insulation films 23SW for the entire length of the gate electrode 23G and removing the sidewall insulation films 23SW thereafter from the gate tap region 21B, it is also possible to modify the embodiment further such that the sidewall insulation films 23SW are not formed in the gate tap region 21B.

Figure 31A:
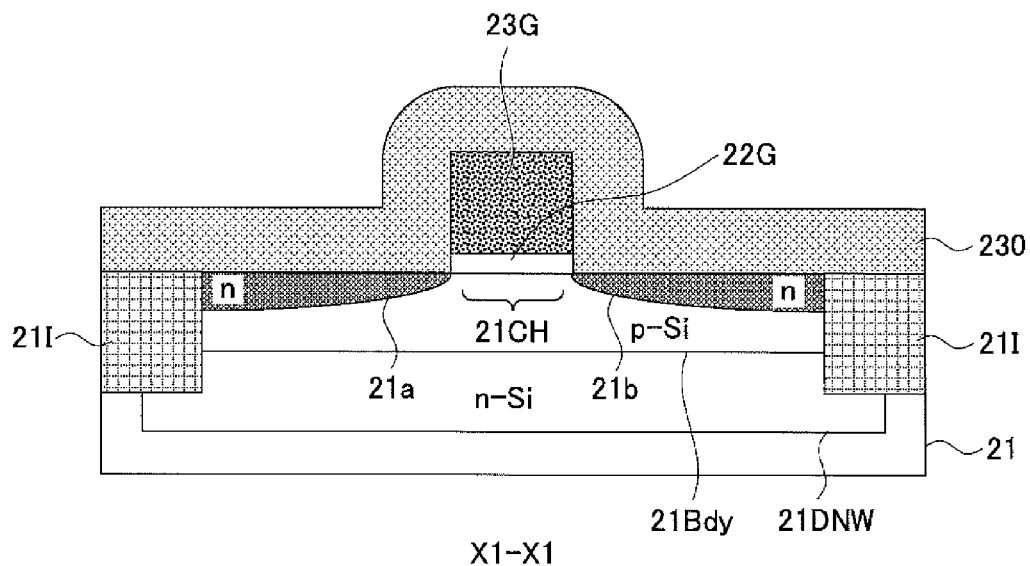
FIGS. 31A and 31B are first cross-sectional diagrams representing the process of fabricating a semiconductor device according to a third modification of the first embodiment.
Figure 31B:
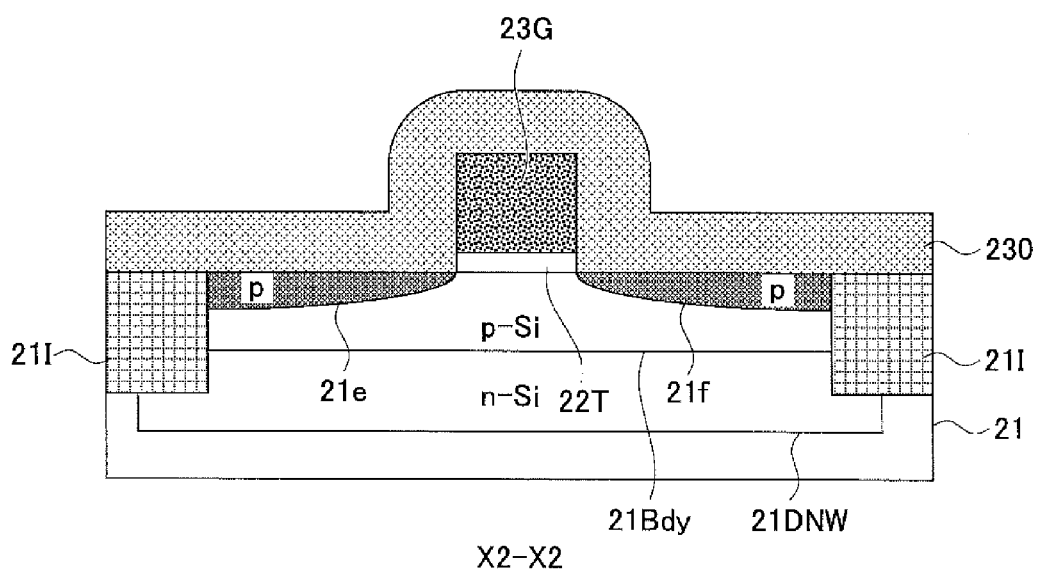
Figure 32A:
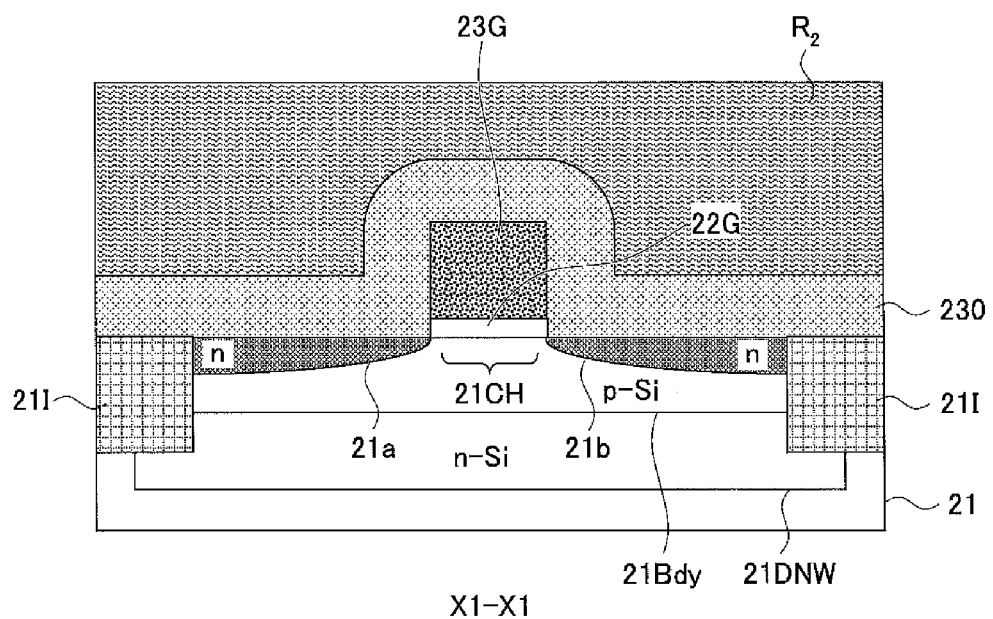
FIGS. 32A and 32B are second cross-sectional diagrams representing the process of fabricating the semiconductor device according to the third modification of the first embodiment.
Figure 32B:
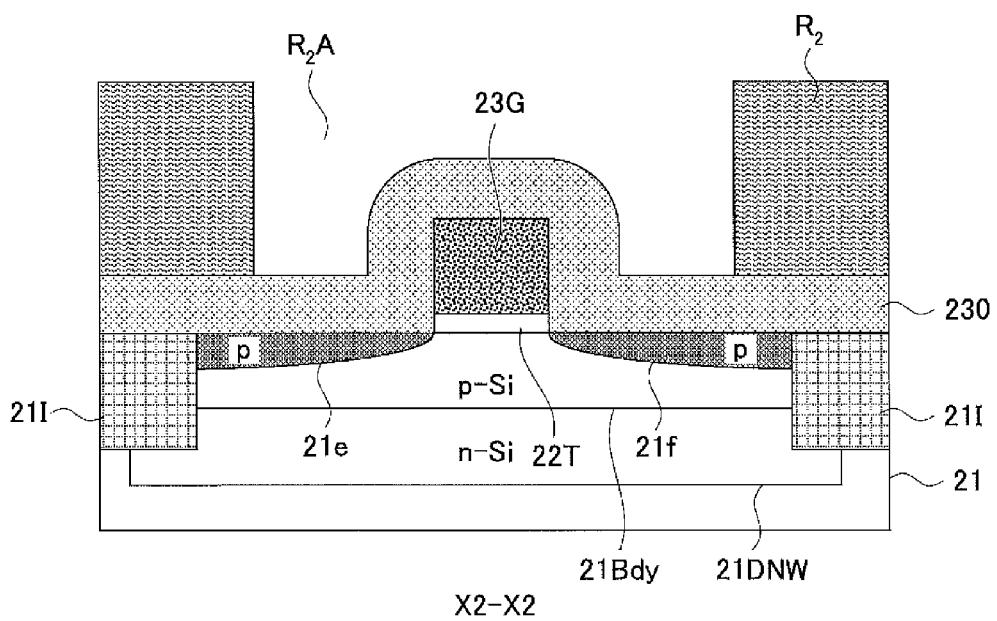
Figure 33A:
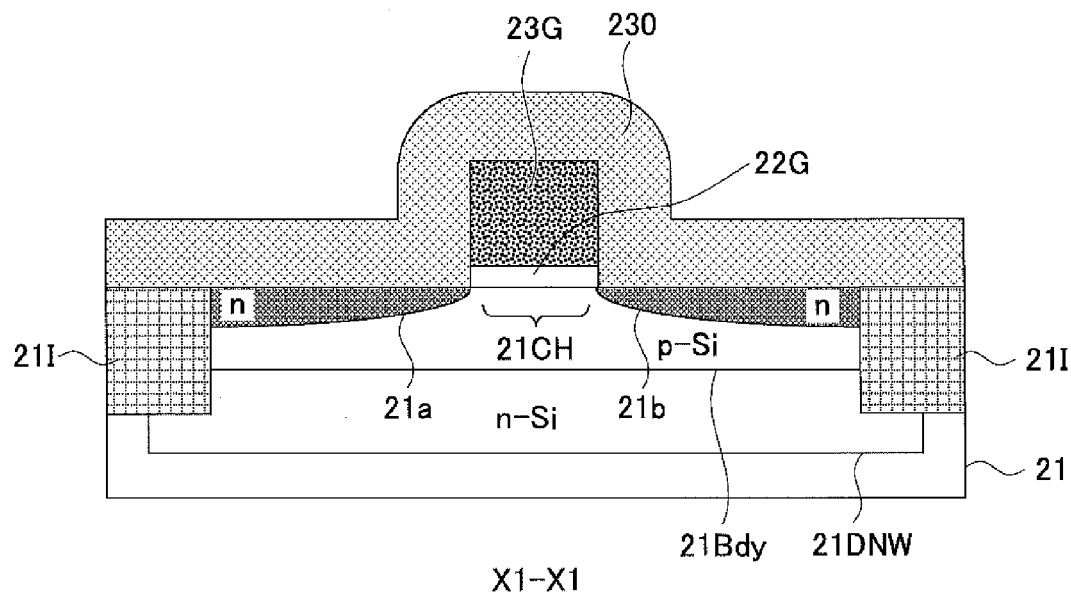
FIGS. 33A and 33B are third cross-sectional diagrams representing the process of fabricating a semiconductor device according to the third modification of the first embodiment.
Figure 33B:
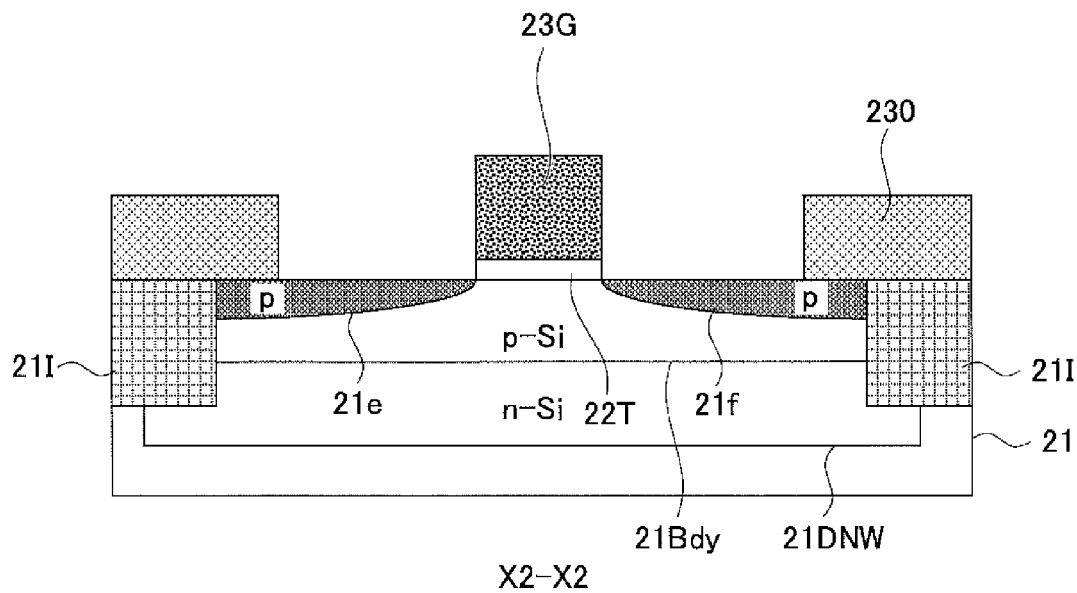

According to this modification, there is formed an insulation film 230 of a silicon oxide or silicon nitride or a stack of these films on the silicon substrate 21 after the step of FIGS. 13A-13C to extend continuously from the device region 21A to the gate tap region 21B by a CVD process, or the like, with a generally uniform thickness as represented in FIGS. 31A and 31B, followed by the step of FIGS. 32A and 32B in which there is formed a resist pattern $R_2$ on the silicon substrate 21 to cover the device region 21A, wherein the resist pattern $R_2$ is formed to have a resist opening $R_2A$ so as to expose a part of the insulation film 230 that covers the gate electrode 23G in the gate tap region 21B. Further, in the step of FIGS. 33A and 33B, the insulation film 230 is removed in the gate tap region 21B while using the resist pattern $R_2$ as a mask. Further, by etching back the insulation film 230 in the step of FIGS. 34A and 34B, the sidewall insulation films 23SW are formed only on the gate electrode 23G in the device region 21A.

Figure 34A:
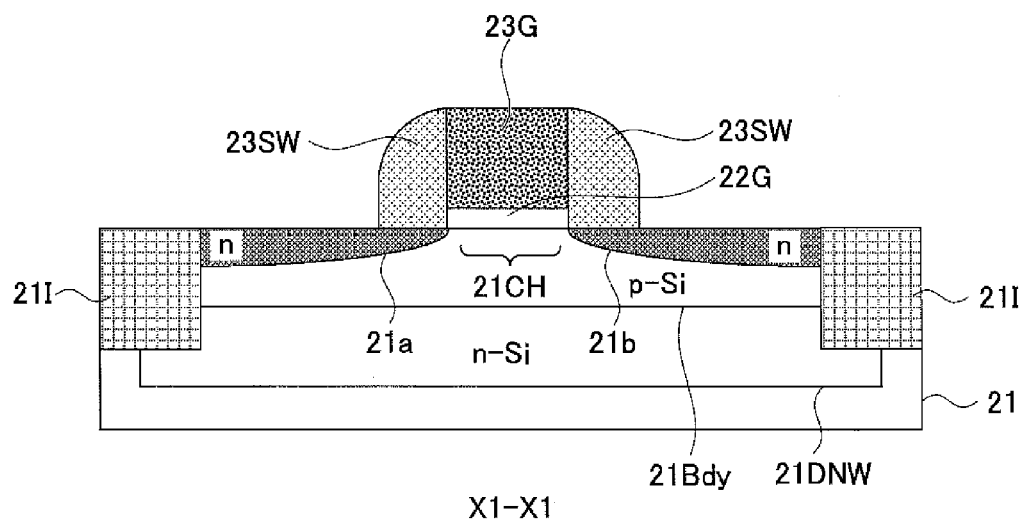
FIGS. 34A and 34B are fourth cross-sectional diagrams representing the process of fabricating a semiconductor device according to the fourth modification of the first embodiment.

After the step of FIGS. 34A and 34B, the step of FIGS. 16A-16C and the steps thereafter explained already are conducted, and with this, the Dt-MOS transistor 20 explained with reference to FIGS. 20A-20C or FIGS. 27A-27C is obtained. In the case the resist opening $R_2A$ is extended to the entire area of the gate tap region 21B, the structure of FIGS. 20A-20C is obtained, while in the case the size of the resist opening $R_2A$ is narrowed as in the case of the resist opening $R_1A$, of FIG. 26, the structure of FIGS. 27A-27C is obtained.

[Second Embodiment]

Figure 35A:
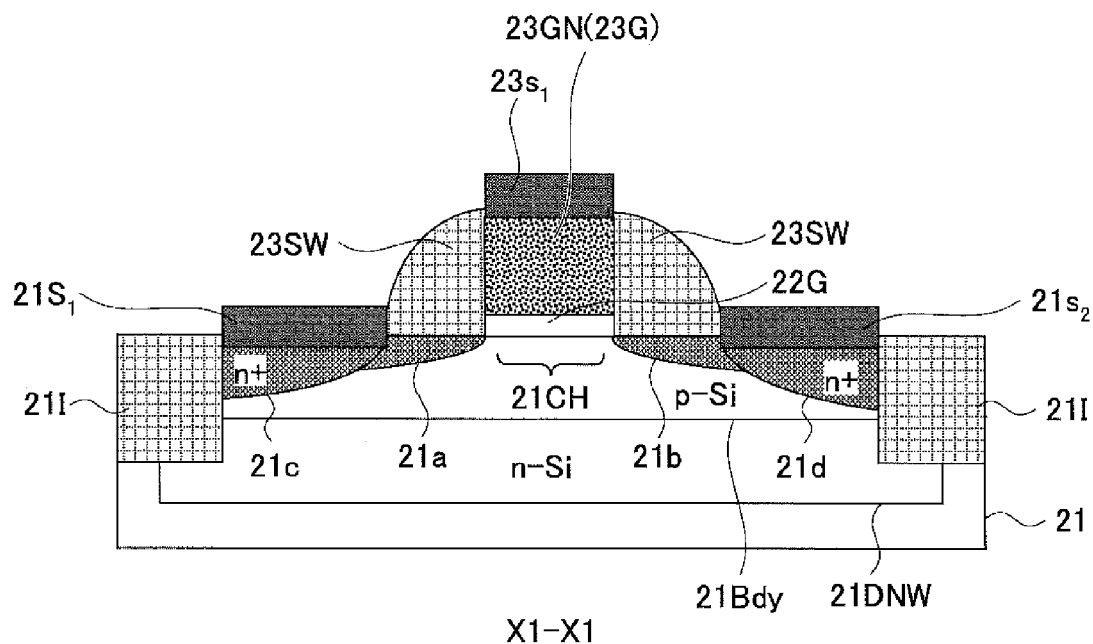
FIGS. 35A-35C are cross-sectional diagram representing the construction of a semiconductor device according to a second embodiment.
Figure 35B:
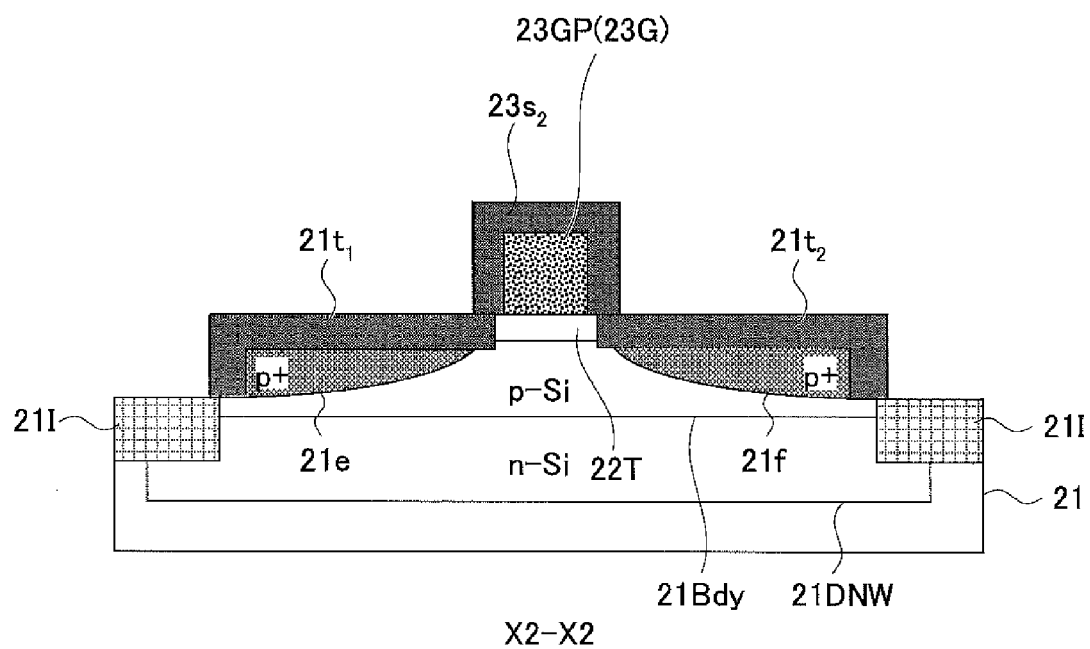
Figure 35C:
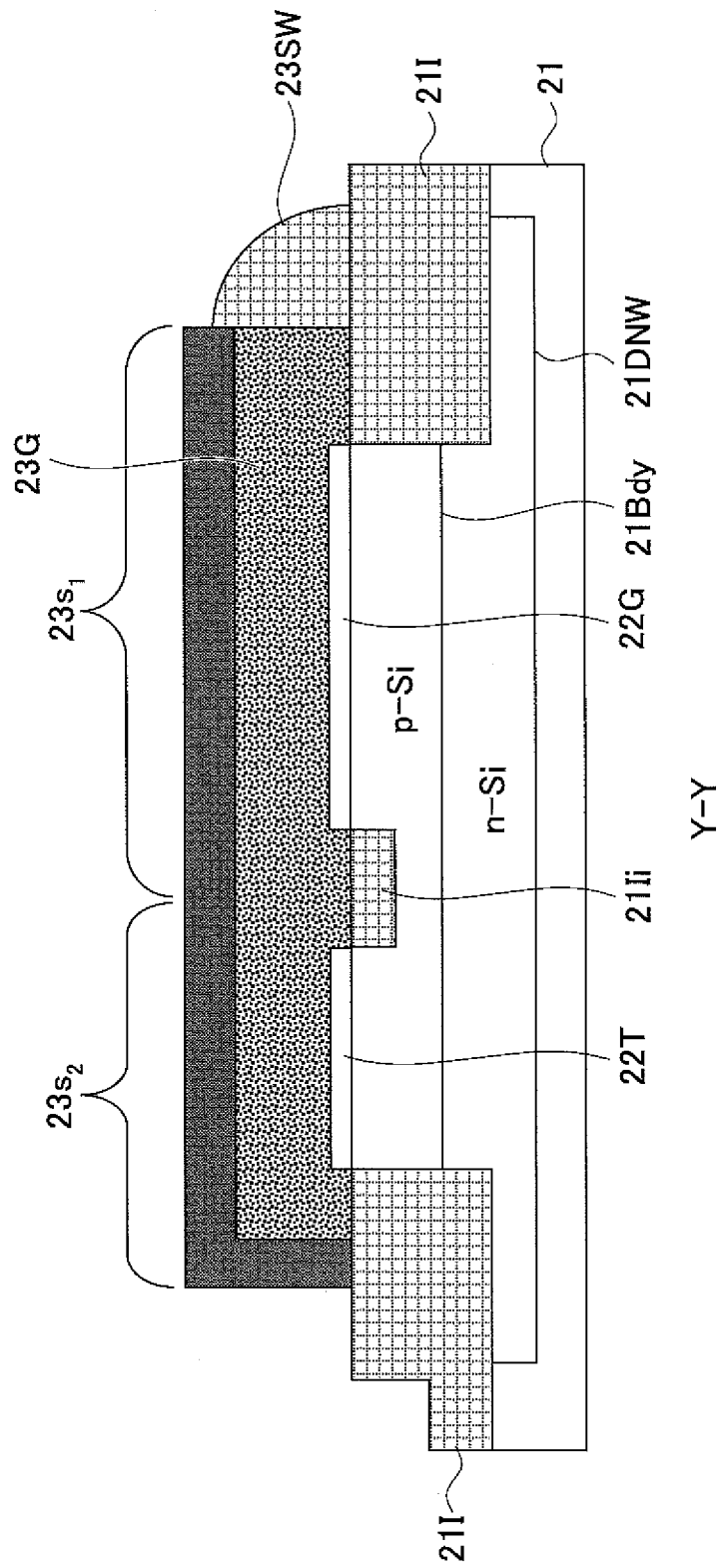

Next, a second embodiment will be explained with reference to FIGS. 35A-35C. Similarly to the previous embodiments, FIG. 35A represents a cross-sectional diagram taken along the line X1-X1 of FIG. 1, FIG. 35B represents a cross-sectional diagram taken along the line X2-X2 of FIG. 1 and FIG. 35C represents a cross-sectional diagram taken along the line Y-Y of FIG. 1. In the drawings, those parts explained before are designated by the same reference numerals and the description thereof will be omitted. The step of FIGS. 35A-35C corresponds to the step of FIGS. 17A-17C of the preceding embodiment, for example.

Because of bonding of metal atom with Si layer, there are many silicides that cause volumetric dilatation after silicide formation reaction as compared with the state before the silicide formation reaction when a silicide layer is formed by a salicide process that uses a reaction between silicon and a metal M such as a reaction of Si+M→MSi In the case of NiSi, for example, it is known that there occurs a volumetric dilation of about 1.2 times after the reaction. Likewise, in the case of $TiSi_2$, a volumetric dilatation of about 1.12 times is known, while in the case of PtSi, a volumetric dilatation of about 1.5 times is known. Further, in the case of $Pd_2Si$, a volumetric dilatation of about 2.09 times is known, while in the case of IrSi, a volumetric dilatation of about 1.39 times is known.

As explained previously, the silicide layers $21s_1$, $23s_1$, $21t_1$, $21t_2$, $23s_2$, and the like, are formed with a film thickness of 10-20 nm, while the insulation film 22T is formed to have a film thickness of only 1-2 nm in correspondence to the gate insulation film 22. Thus, when a volumetric dilatation of 1.2 times has been induced in the silicide layers, there is caused a corresponding increase of film thickness in the silicide layers, and this leads to a situation represented in FIG. 35B in which the silicide layers $21t_1$ and $21t_2$ cause secure butting engagement and corresponding electrical contact, with the silicide layers $23s_2$ formed on the sidewall surfaces of the gate electrode part 23GP.

For example, a volumetric dilatation of 20% in a silicide layer of the film thickness of 20 nm results in an increase of film thickness of 4 nm. This volumetric dilatation of the silicide layer $23s_2$ is sufficient, together with the volumetric dilatation of the silicide layers $21t_1$ and $21t_2$, to fill the gap of about 8 nm. Because of this, the silicide layer $23s_2$ and the silicide layer $21t_1$ or $21t_2$ causes a reliable butt contact and it becomes possible to attain electric contact between the polysilicon gate electrode 23GP and the body 21Bdy without using a shared contact plug.

Thus, because the silicide layer $23s_2$ and the silicide layer $21t_1$ or $21t_2$ causes a reliable electric contact, the present embodiment can eliminate the shared contact plug 24P or 24Vc in the Dt-MOS transistor and attain the electrical contact between the gate electrode 23G and the body region 21Bdy by the contact between the silicide layers. Thereby, it becomes possible to form a more reliable contact when the insulation film 22T is receded by approximately 5 nm-15 nm in the step of FIGS. 17A-17C in correspondence to the arrows represented in FIG. 17B.

Figure 36A:
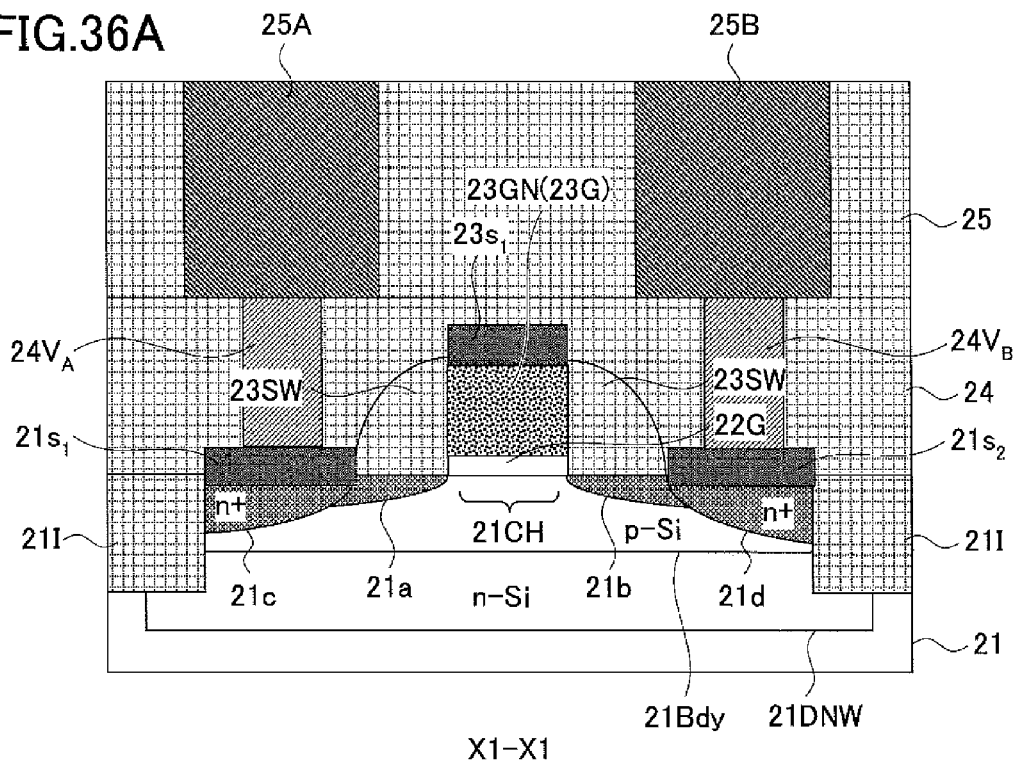
FIGS. 36A-36C are cross-sectional diagrams representing the construction of the semiconductor device of the second embodiment including representation of a wiring layer.
Figure 36B:
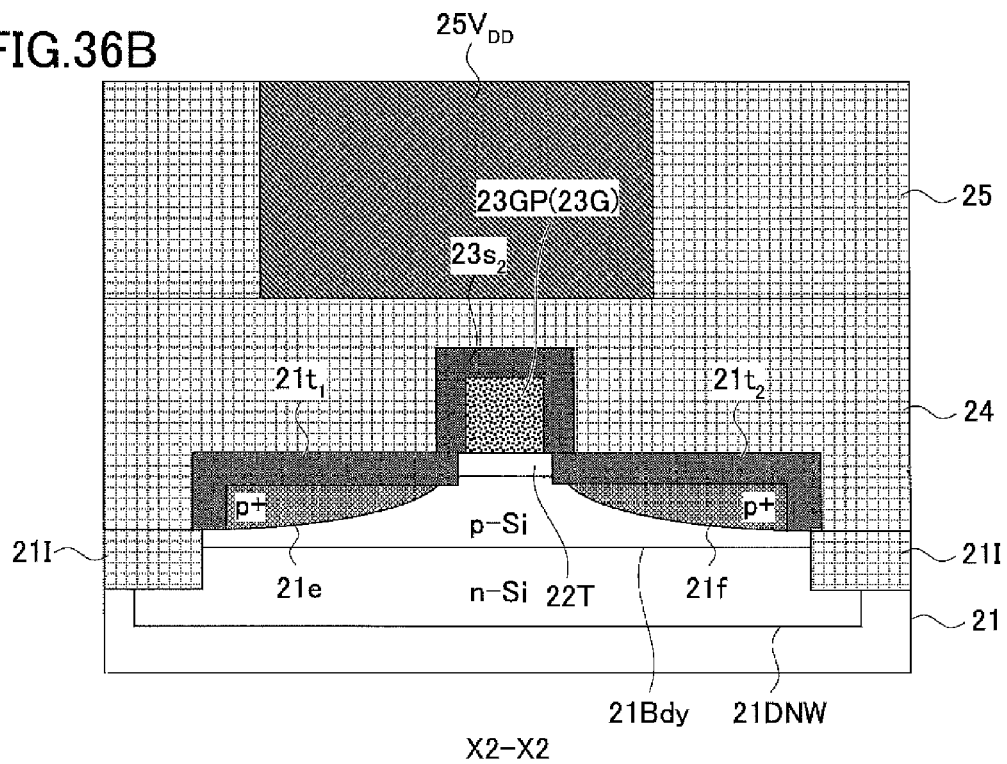
Figure 36C:
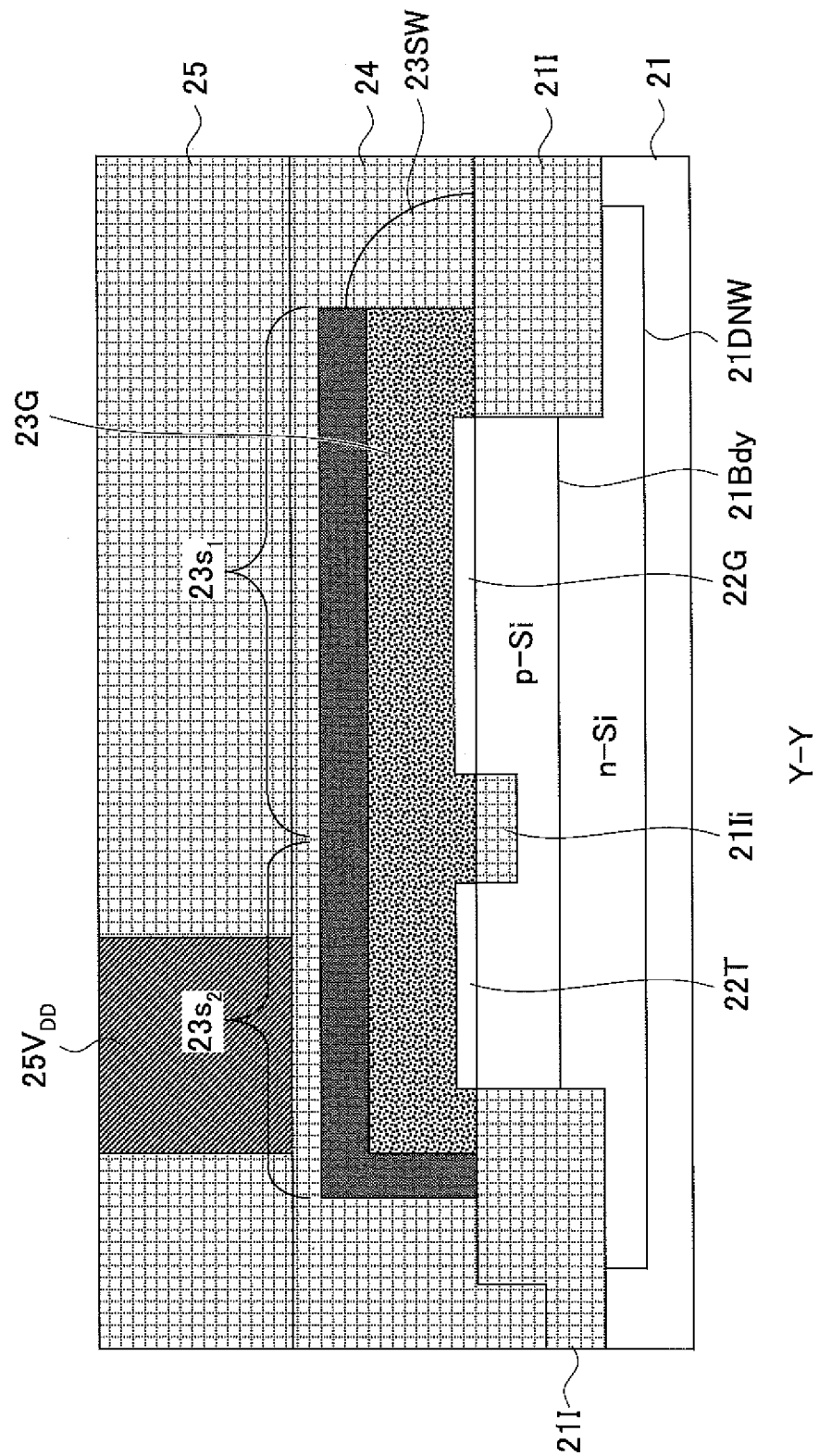

Thus, with the present embodiment, it becomes possible to form a wiring irrelevant to the gate electrode 23G, such as a power wiring $25V_{DD}$, over the gate electrode part 23GP when a multilayer interconnection structure is formed over the silicon substrate 21, as represented in FIGS. 36A-36C, by stacking the interlayer insulation film 24 and the interlayer insulation film 25. With this, the degree of freedom of circuit design is increased significantly. In FIGS. 36A-36C, those parts explained before are designated by the same reference numerals and the description thereof will be omitted.

Figure 43A:
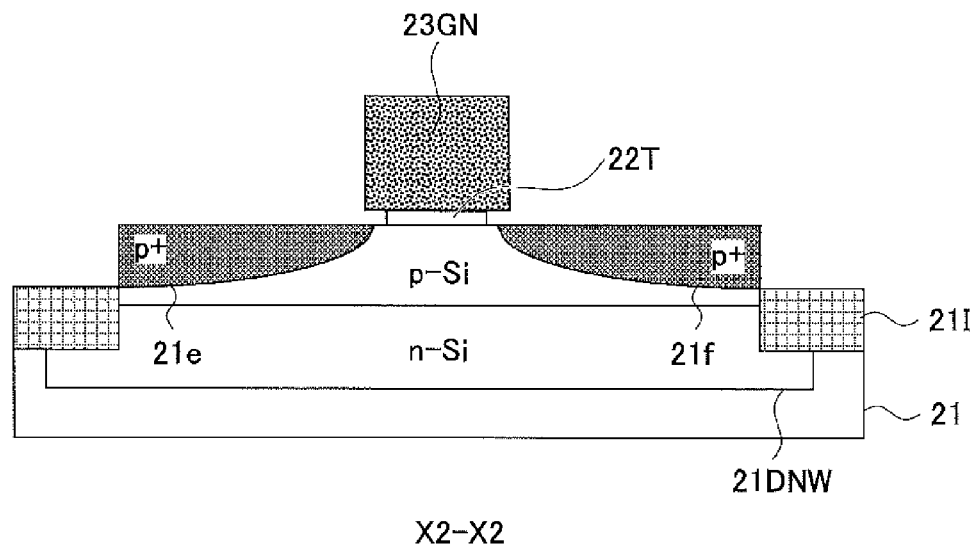
FIGS. 43A-43C are cross-sectional diagrams representing the process of fabricating a semiconductor device according to a modification of the second embodiment.
Figure 43B:
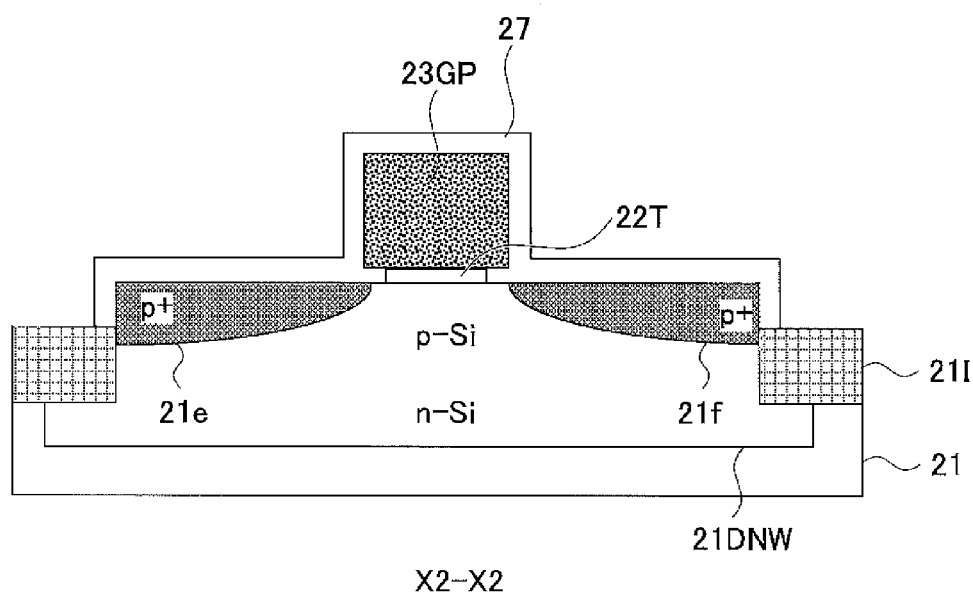
Figure 43C:
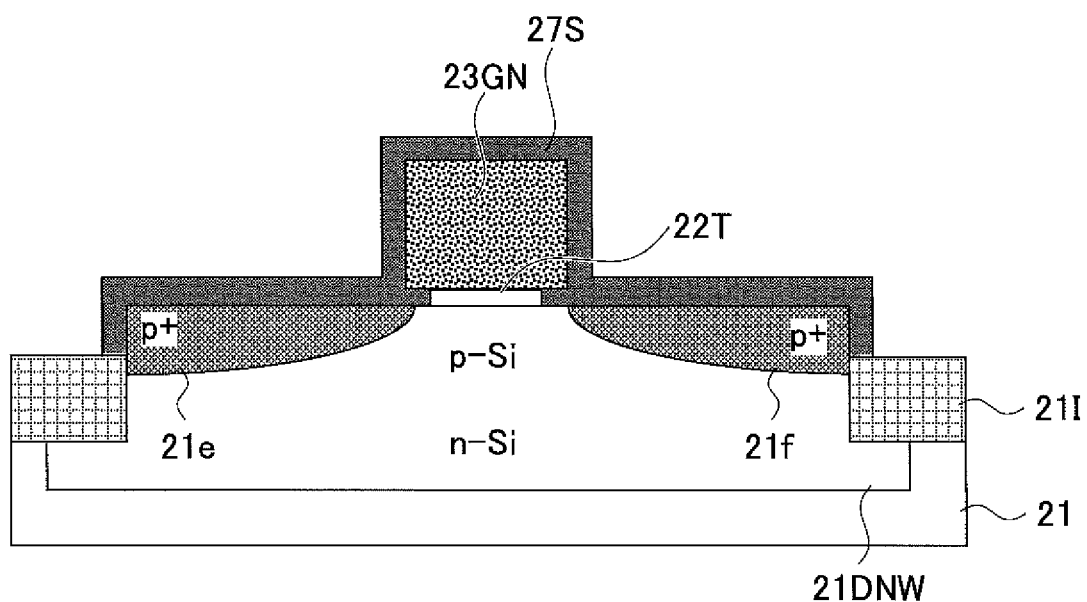

FIGS. 43A-43C represent the fabrication process of a semiconductor device according to a modification of the present embodiment. It should be noted that each diagram of FIGS. 43A-43C represents a cross-section corresponding to the X2-X2 cross-section of FIG. 1.

Figure 34B:
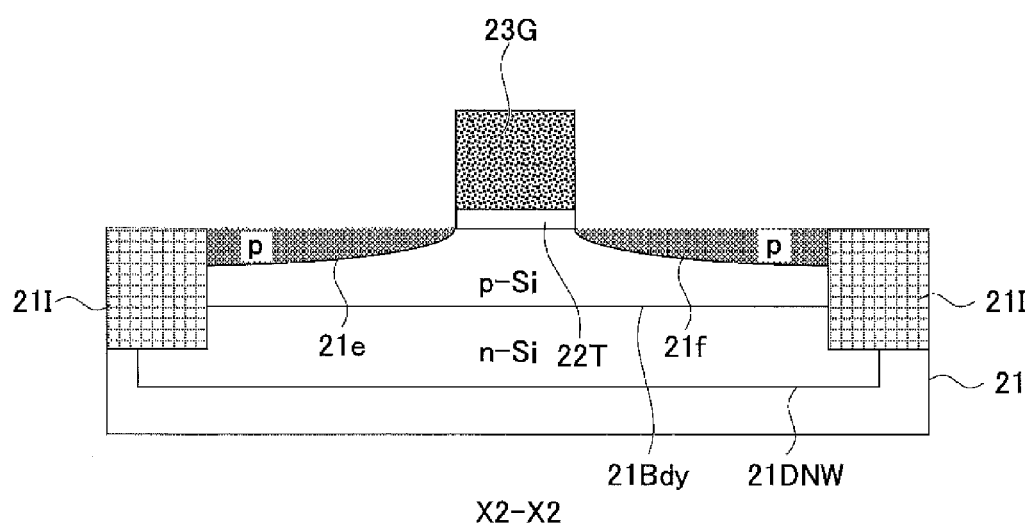

Referring to FIG. 43A, the present embodiment causes a recession, after the step of FIG. 34B, in the gate insulation film 22T by HF processing.

Further, in the step of FIG. 43B, a silicon layer 27 is grown selectively on the exposed silicon surface in the structure of FIG. 43B, and thus on the exposed surface of the p$^+$-type contact regions 21e and 21f and on the exposed surface of the polysilicon gate electrode 23GP, by a CVD process with a film thickness of several nanometers.

The silicon film 27 thus formed fills the gap formed right underneath the gate electrode 23GP with the recession of the insulation film 22T and functions to connect the gate electrode 23GP to the contact regions 21e and 21f via the silicide layer 27s when the silicon film 27 is converted to the silicide layer 27s in the step of FIG. 43C. Because the silicon layer 27 continues from the gate electrode part 23GP to the contact regions 21e and 21f in the step of FIG. 43B, the silicide layer 27s is not limited to the material that causes volumetric dilatation at the time of silicide formation. Thus, it is also possible to use a material not causing volumetric dilatation such as cobalt silicide for the silicide layer 27s.

[Third Embodiment]

Figure 37:
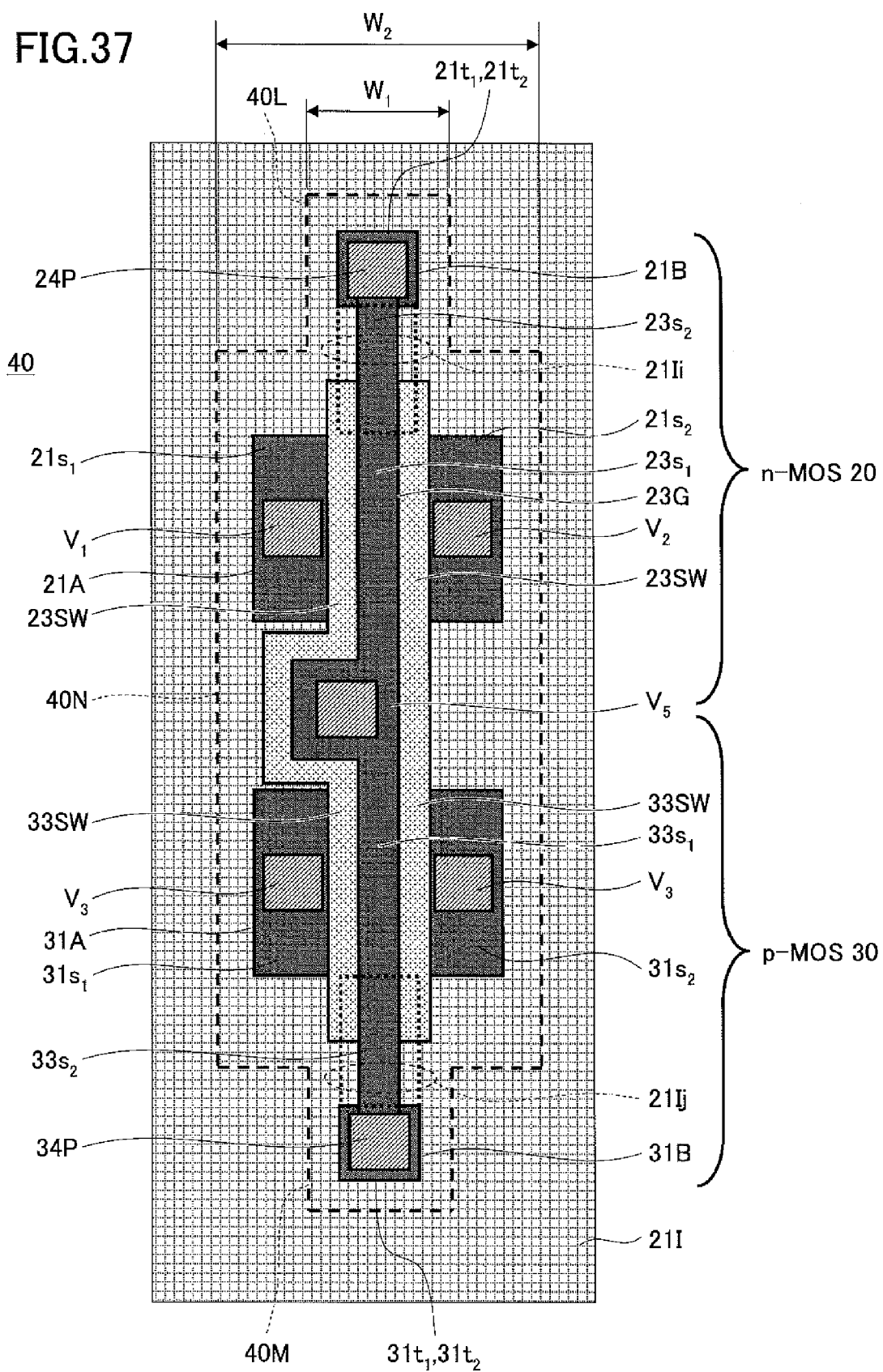
FIG. 37 is a plan-view diagram representing the construction of the semiconductor integrated circuit device according to a third embodiment.

FIG. 37 is a plan view diagram representing the construction of a semiconductor device 40 according to a third embodiment in which the n-channel Dt-MOS transistor of FIG. 1 is integrated with a p-channel Dt-MOS transistor 30 of a similar construction to form a CMOS structure.

Referring to the plan view of FIG. 37, the semiconductor device 40 is formed in the device isolation region 21I of STI structure, and the ne-channel Dt-MOS transistor 20 has the device region 21A and the gate tap region 21b as explained before. Further, the polysilicon gate electrode extends continuously from the device region 21A to the gate tap region 21B. As explained in the previous embodiment, the polysilicon gate electrode 23G carries the sidewall insulation films 23SW on the respective sidewall surfaces in the device region 21A and the top surface of the gate electrode 23G is covered with the silicide layer $23s_1$ in the device region 21A. In the gate tap region 21B, the top surface and the both sidewall surfaces of the polysilicon gate electrode 23G are covered with the silicide layer $23s_2$. Further, in the gate tap region 21B, the polysilicon gate electrode 23G is connected to the silicide layers $21t_1$ and $21t_2$ covering the surface of the gate tap region 21B by way of the shared contact plug 24P. In the device region 20, the body region 21Bdy of p-type is formed with the source region 21S and the drain region 21D of n$^+$-type at the respective lateral sides of the gate electrode 23G, and the gate electrode 23G itself is doped to the n$^+$-type in the device region 21A. Further, the body region 21Bdy of p-type extends underneath the shallow insulating region 21Ii to the gate tap region 21B and the contact regions 21e and 21f of p$^+$-type are formed in the body region 21Bdy. The silicide layers $21t_1$ and $21t_2$ are formed on the respective surfaces of the contact regions 21e and 21f. Reference should be made to FIGS. 2A and 2B and FIG. 3 explained previously.

Further, with the present embodiment, the silicon substrate 21 is formed with a device region 31A of the p-channel Dt-MOS transistor 30 and a further gate tap region 31B of the p-channel Dt-MOS transistor 30 and, while the illustration is omitted, the device region 31A is formed with a body region similar to the body region 21Bdy of p-type but with the opposite conductivity type of n-type. Further, while the illustration is omitted, the gate tap region 31B is formed with gate contact regions similar to the gate contact regions 21e and 21f of p$^+$-type of the gate tap region 21B, but with the opposite conductivity type of n$^+$-type. Between the device region 31A and the gate tap region 31B, there is formed an insulating region 21Ij similar to the insulating region 21Ii in continuation to the device region 21I of the STI structure with a shallow depth such that the body region of n-type can extend from the device region 31A to the gate tap region 31B continuously.

Further, in the semiconductor device 40, the polysilicon gate electrode 23G extends over the device regions 31A and 31B similarly as in the case the polysilicon gate electrode 23G extends over the device regions 21A and 21B, wherein the polysilicon gate electrode 23G is doped to the p$^+$-type in the device region 31A. In the gate tap region 31B, on the other hand, the polysilicon gate electrode 23G is doped to the n$^+$-type, and thus in opposite conductivity type to the case of the gate tap region 21B. The polysilicon gate electrode 23G is formed with sidewall insulation films 33SW in the device region 31A as an extension of the sidewall insulation films 23SW in the device region 21A, and there is formed a silicide layer $33s_1$ similar to the silicide layer $23s_1$ on the top surface of the polysilicon gate electrode 23G. While not illustrated in FIG. 37, there are formed a source region and a drain region of p$^+$-type in the device region 31A at respective lateral sides of the polysilicon gate electrode 23 and at the respective outer sides of the sidewall insulation films 33SW, and in respective correspondence to the source region and the drain region of p$^+$-type, there are formed via-plugs $V_3$ and $V_4$ over the silicon substrate 21 via silicide layers $31s_1$ and $31s_2$, which are formed respectively in correspondence to the source region and the drain region of p$^+$-type.

Further, in the gate tap region 31B, the sidewall insulation films 33SW are removed from the sidewall surfaces of the polysilicon gate electrode 23G in the gate tap region 31B, and a silicide layer $33s_2$ similar to the silicide layer $23s_2$ of the gate tap region 21B is formed on the top surface and both sidewall surfaces of the polysilicon gate electrode 23G. Further, the gate tap region 21B is formed with a shared contact plug 34P similar to the shared contact plug 24P in the gate tap region 31B. Thus, the shared contact plug 34P makes a contact with both sidewall surfaces and the top surface of polysilicon gate electrode 23G via the silicide layer $33s_2$ and electrically connects the polysilicon gate electrode 23G to the contact regions of n+-type formed in the gate tap region 31B in correspondence to the contact regions 21e and 21f of the p+-type, respectively via the silicide layers $31t_1$ and $31t_2$.

Figure 38:
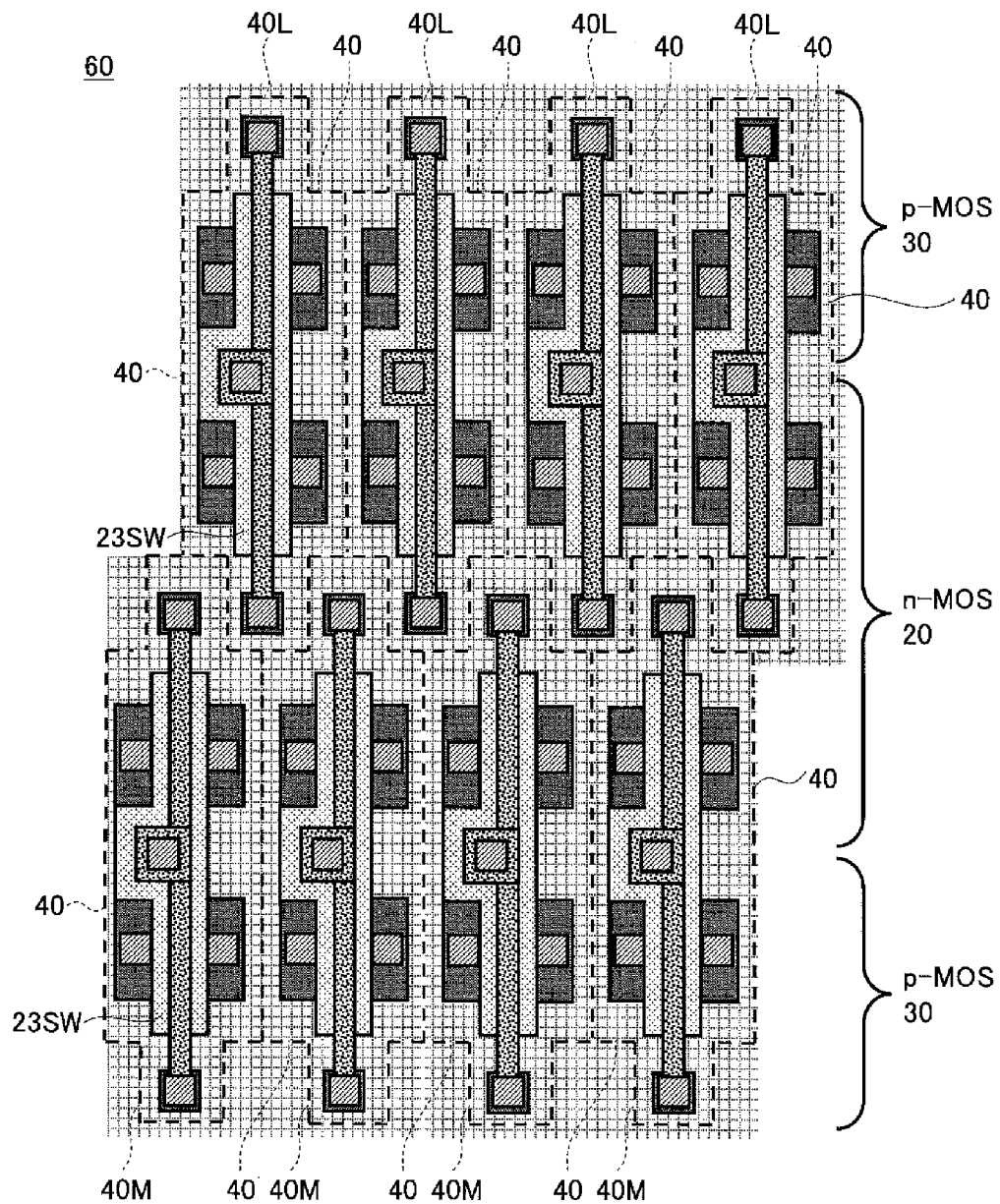
FIG. 38 is a plan view diagram representing a semiconductor integrated circuit device in which the semiconductor devices of FIG. 37 are integrated.
Figure 39:
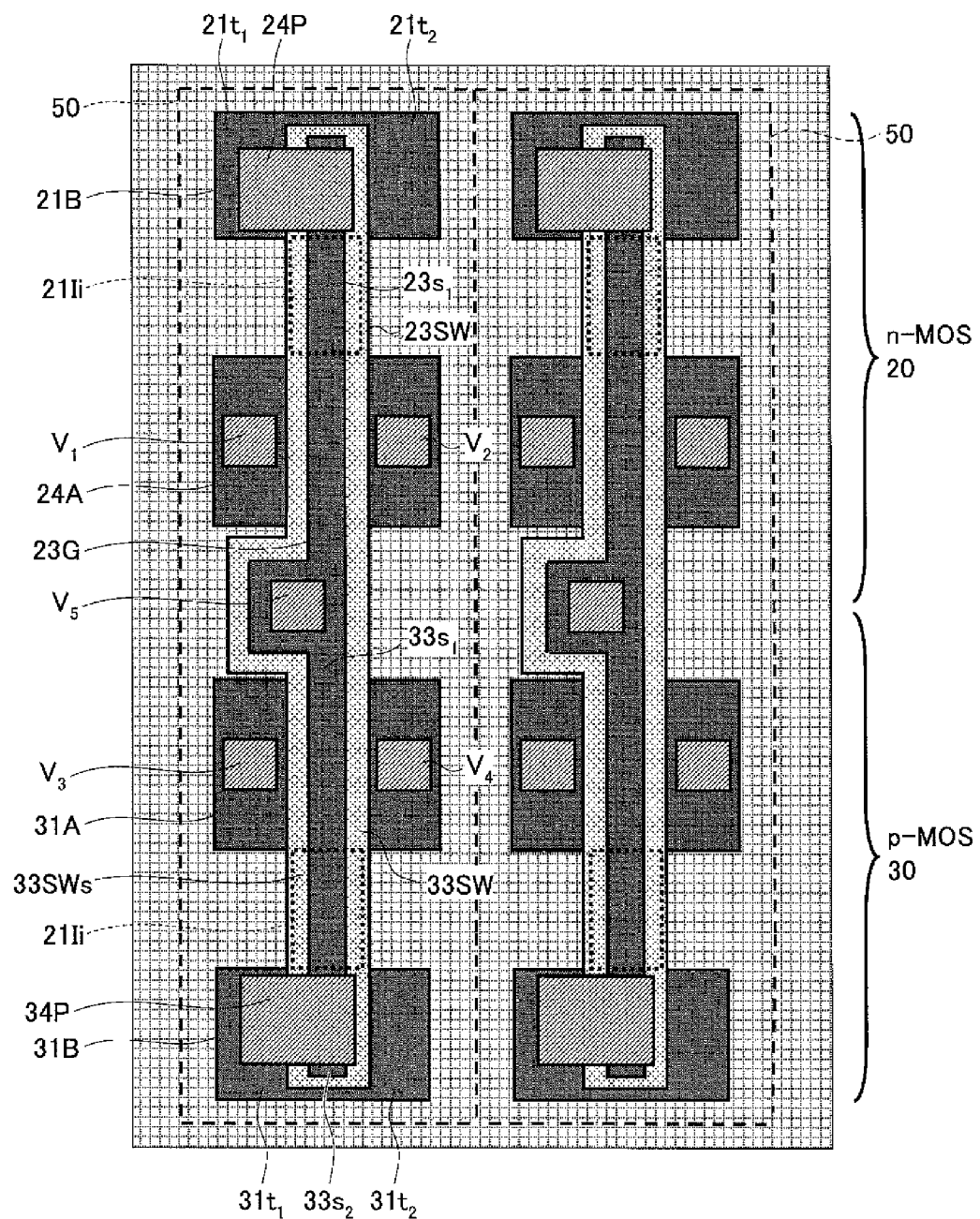
FIG. 39 is a plan view diagram representing a semiconductor integrated circuit device in which the semiconductor devices of the comparative example are integrated.

Because the sidewall insulation films 23SW and 33SW are removed in the gate contact regions 21B and 31B with the present embodiment, it becomes possible to shrink the width of the shared contact plug 24P or 34P as explained in the previous embodiments, and with this, it becomes possible to shrink the overall size of the semiconductor device represented in FIG. 37 by broken lines 40L-40M at both end parts 40L and 40M respectively corresponding to the shared contact plugs 24P and 34P. In FIG. 37, it should be noted that the outline of the semiconductor device 40 represented by the broken lines 40L-40N includes a part of the device isolation region 21I. By setting a width W1 for the end parts 40L and 40M to be ½ or less of the width W2 of a main body 40N of the semiconductor device, it becomes possible to lay down a large number of the semiconductor devices 40 of FIG. 37 on the silicon substrate 21 tightly in a staggered manner without forming gap as represented in FIG. 38, and thus in a manner such that an end part 40L is located between a pair of end parts 40M and such that an end part 40M is located between a pair of end parts 40L. With this, it becomes possible to decrease the area of the semiconductor integrated circuit device 60, in which the semiconductor devices 40 are integrated, by as much as 11%, for example, as compared with the case of integrating semiconductor devices 50 according to a comparative example, which is to be explained below with reference to FIG. 39. Here, it should be noted that FIG. 38 is a plan view diagram representing the semiconductor integrated circuit device 60 of the present embodiment in which the semiconductor devices 40 are integrated, while FIG. 39 is a plan view diagram representing the semiconductor device according to the foregoing comparative example. In the drawings, those parts explained before are designated by the same reference numerals and the description thereof will be omitted.

Referring to FIG. 39, it can be seen that, with the present comparative example, the sidewall insulation films 23SW and 33SW are formed to extend continuously from the gate tap region 21B to the gate tap region 21B along the entire length of the gate electrode 23G. As a result, it is necessary that the shared contact plug 24P extends beyond the sidewall insulation film 23SW in the gate tap region 21B in order to attain a contact with the silicide layer $21t_1$ formed on the gate tap region 21B. Likewise, it is necessary that, in the gate tap region 31B, the shared contact plug 24P extends beyond the sidewall insulation film 33SW in order to attain contact with the silicide layer $31t_1$ formed in the gate tap region 31B. For this, it is necessary that the gate tap region 21B or 31B has a width identical to the width of the device region 21A or 31A, and thus, the area occupied by the semiconductor device 50 takes a rectangular shape as represented in FIG. 39 by broken lines. Thus, the area occupied by the semiconductor integrated circuit device in which the semiconductor devices 50 are laid down on the silicon substrate 21 without forming a gap, becomes larger than the area explained with reference to FIG. 38 by about 12%. Further, in the comparative example of FIG. 39, the shared contact plugs 24P and 34P make a contact with the silicide layers $23s_1$ and $33s_1$ respectively only at the top surface of the gate electrode 23G, and because of this, there is tendency that contact resistance becomes larger as compared with the previous embodiment. Because of this, it should be noted that the comparative example of FIG. 39 increases the area of the contact plugs 24P and 34P.

[Fourth Embodiment]

Figure 40:
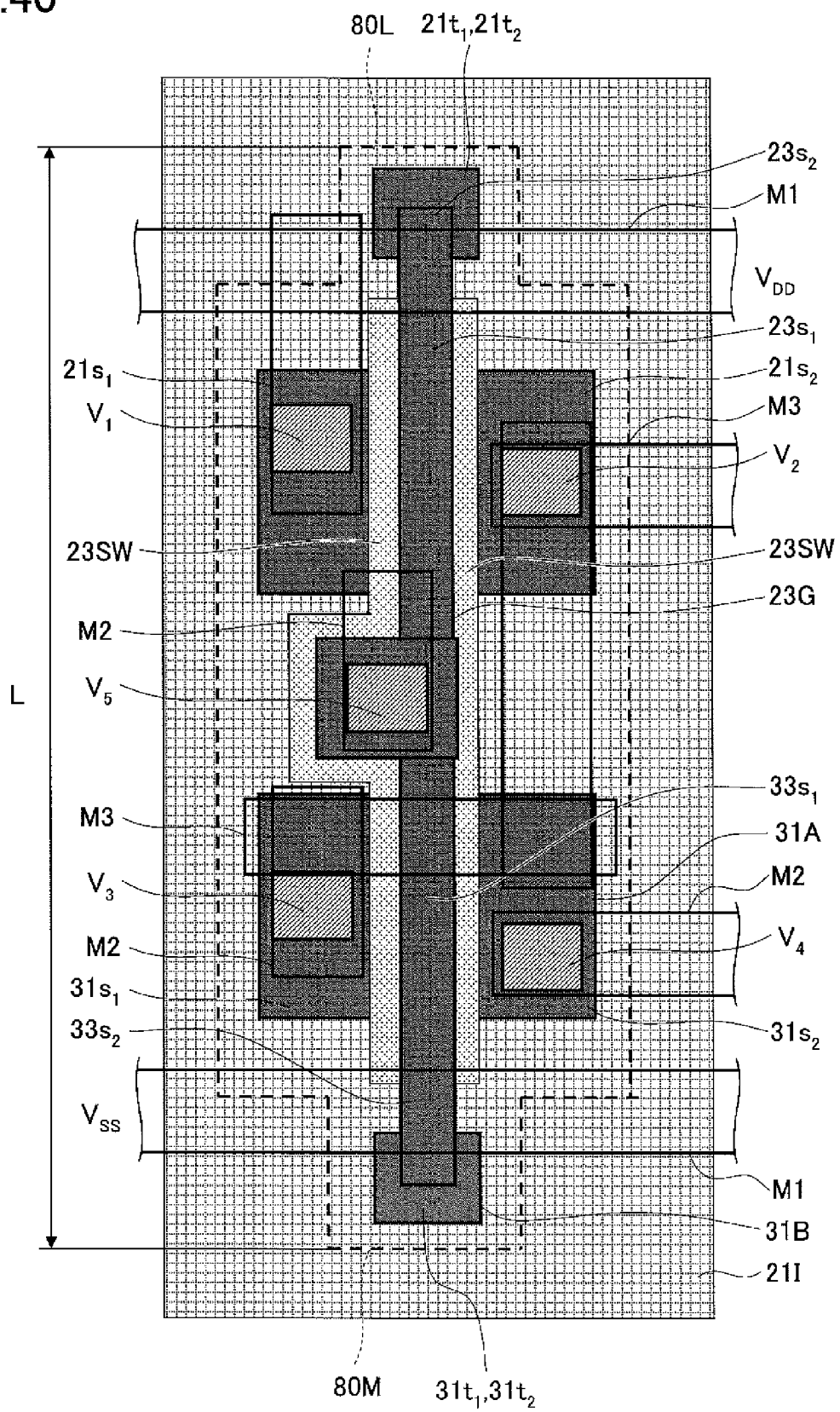
FIG. 40 is a plan view diagram representing the layout of a semiconductor device according to a fourth embodiment.

FIG. 40 is a plan view diagram representing the layout of a semiconductor device 80 according to a fourth embodiment.

Referring to FIG. 40, the semiconductor device 80 is a modification of the semiconductor device 40 of the second embodiment and thus includes the polysilicon gate electrode 23G that extends from the gate contact region 21B of the p+-type to the gate contact region 31B of the n+-type consecutively via the device region 21A and the device region 31A, wherein the sidewall insulation films 23SW or 33SW are formed on the respective sidewall surface of the polysilicon gate electrode 23G in the part between the device region 21A and the device region 21A similarly to the embodiment of FIG. 37. In the part in which the sidewall insulation films 23SW are formed, the polysilicon gate electrode 23G is formed with the silicide layer $23s_1$ on the top surface, while in the part in which the polysilicon gate electrode 23G makes a contact with the gate contact region 21B, the polysilicon gate electrode 23G is formed with the silicide layer $23s_2$ on the top surface and on the respective sidewalls. The silicide layer $23s_2$ on the polysilicon gate electrode 23G and the silicide layers $21t_1$ and $21t_2$ on the gate contact region 21B are contacted with each other by causing the volumetric dilatation, and thus, the gate electrode 23G is electrically connected to the body region 21Bdy of p-type located right underneath the gate electrode 23G in the device region 21A.

Likewise, in the part in which the sidewall insulation films 33SW are formed, the polysilicon gate electrode 23G is formed with the silicide layer $33s_1$ on the top surface, while in the part in which the polysilicon gate electrode 23G makes a contact with the gate contact region 31B, the polysilicon gate electrode 23G is formed with the silicide layer $33s_2$ on the top surface and on the respective sidewalls. The silicide layer $33s_2$ on the polysilicon gate electrode 23G and the silicide layers $31t_1$ and $31t_2$ on the gate contact region 31B are contacted with each other by causing the volumetric dilatation, and thus, the gate electrode 23G is electrically connected to the body region of n-type, which is similar to the body region 21B except for the conductivity type, and located right underneath the gate electrode 23G in the device region 31A.

Figure 41:
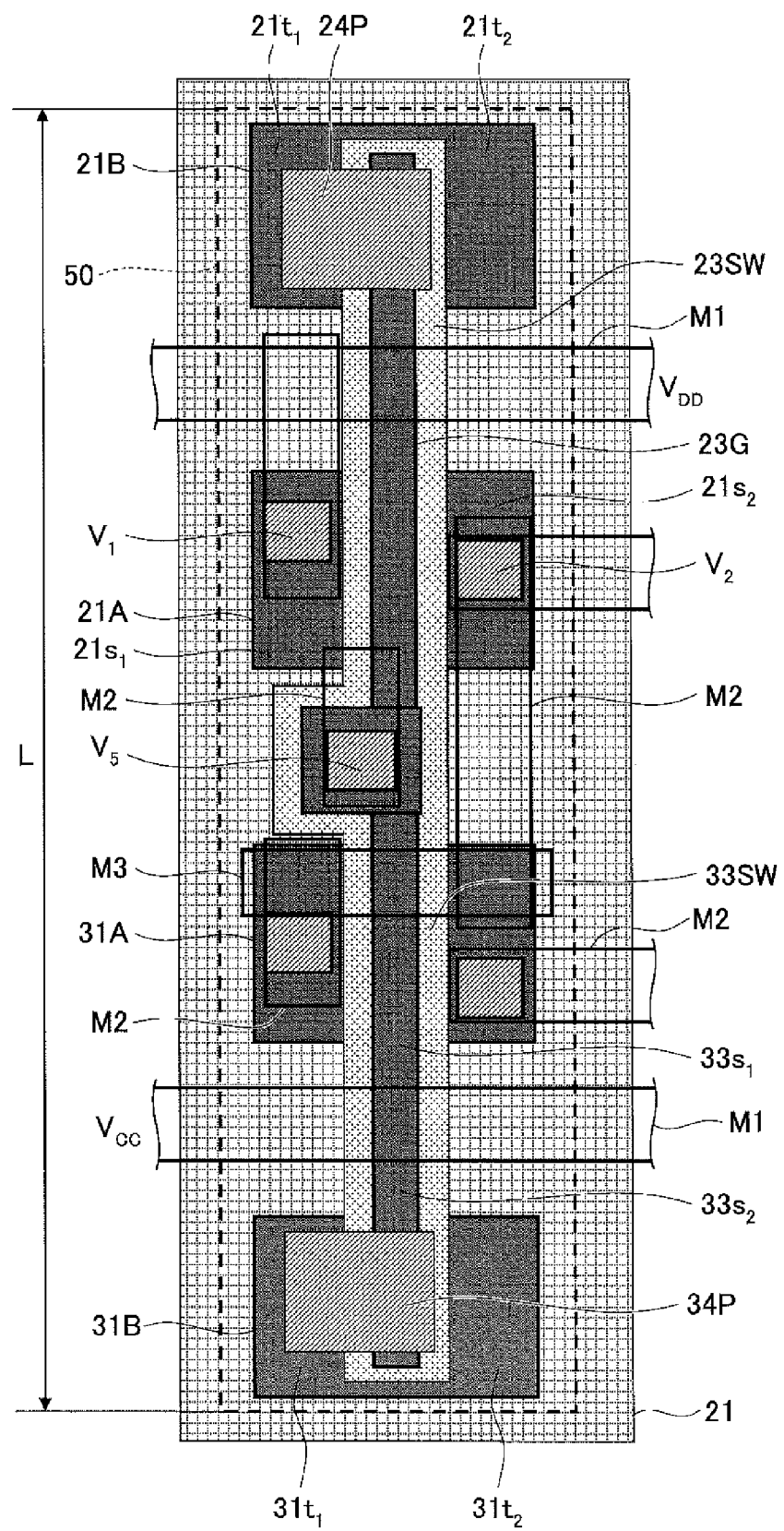
FIG. 41 is a plan-view diagram representing the layout of a semiconductor device according to a comparative example.

FIG. 40 further represents a first layer metal wiring pattern M1, a second layer metal wiring pattern M2 and a third layer metal wiring pattern M3, wherein it can be seen that the first layer metal wiring pattern M1 includes a power wiring $V_{DD}$ or $V_{CC}$ that passes over the gate contact region 21B. The power wiring $V_{DD}$ corresponds to the power wiring pattern $25V_{DD}$ of FIG. 36. Thus, the present embodiment, enabling elimination of the shared contact plugs 24P and 34P in the gate tap regions 21B and 31B, also enables to lay down a wiring pattern such as the power wiring pattern over the gate tap region 21B or 31B without causing contact thereto. Thus, with the present embodiment, it becomes possible to reduce a size L of the semiconductor device in the longitudinal direction by about 6% as compared with the semiconductor device of the construction that uses the shared contact plugs 24P and 34P and represented in Figure as comparative example. It should be noted that the semiconductor device of FIG. 41 is substantially identical with the comparative example of FIG. 39 except that the metal wiring patterns M1, M2 and M3 of FIG. 40 are formed. In FIG. 41, those parts explained before are designated by the same reference numerals and the description thereof will be omitted.

In the plan view of FIG. 40, which represents the outline of the semiconductor device 80 by a broken line, it will be understood that the semiconductor device 80 has a reduced width in the gate tap regions 21B and 31B, and thus, there are formed projections 80L and 80M at the top end and at the bottom end in the plan view of FIG. 40 in correspondence to the projections 40L and 40M of FIG. 37. Further, the size L is defined as a distance from the tip of the projection 80L to the tip end of the projection 80M.

Figure 42:
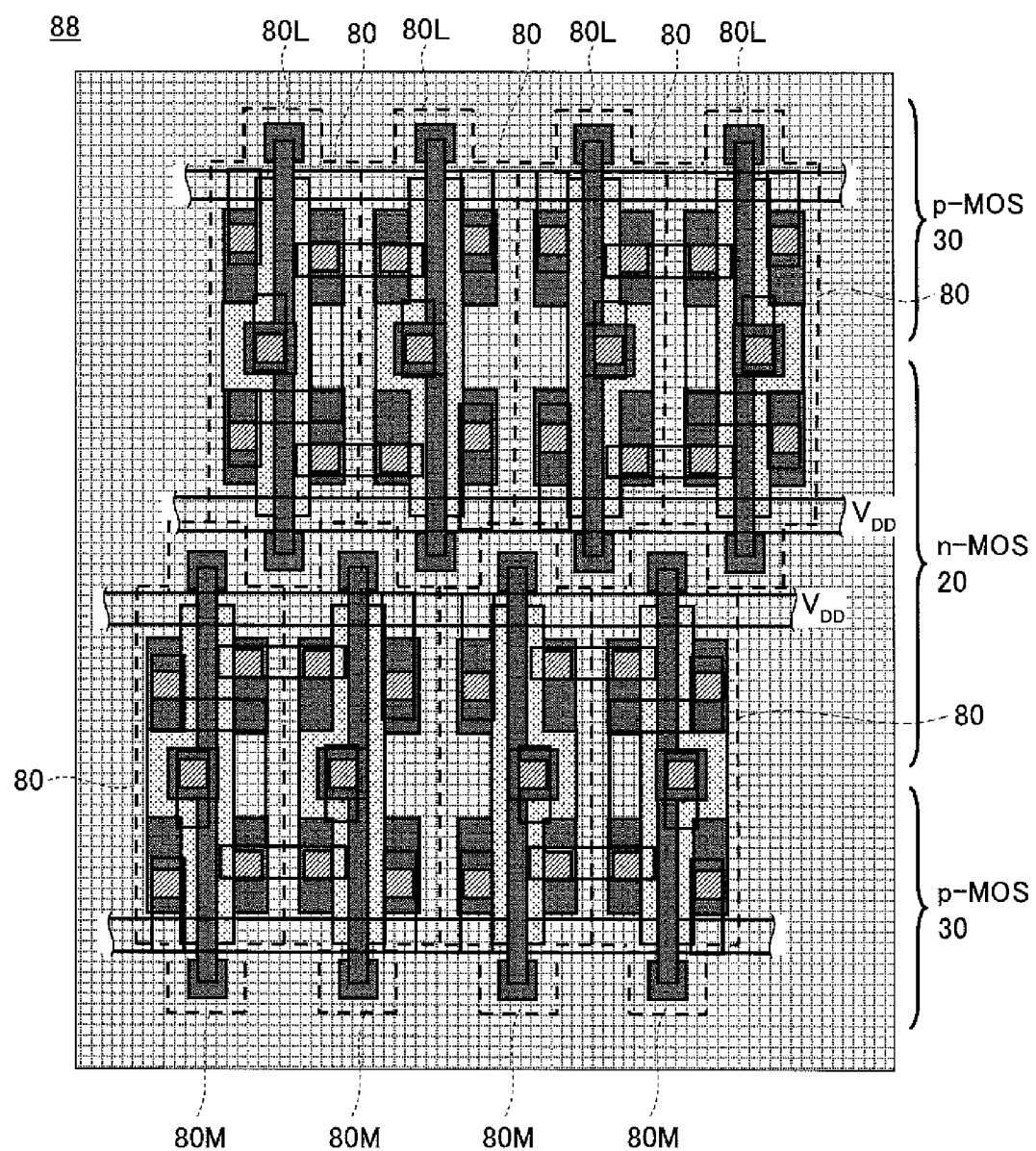
FIG. 42 is a plan view diagram representing the layout of a semiconductor integrated circuit device according to a fourth embodiment.

Further, FIG. 42 represents an example of a semiconductor circuit device 88 in which a large number of semiconductor devices 80 represented in FIG. 40 by the broken lines are laid down on the silicon substrate tightly in a staggered manner without forming a gap, and thus, in a manner such that an end part 80L is located between a pair of end parts 80M and that an end part 80M is located between a pair of end parts 80L.

The semiconductor integrated circuit device 88 constitutes a two-input NAND circuit. With such a construction, it becomes possible to attain a very large shrinkage of the area of about 15%, for example, as compared with the case in which the semiconductor devices of the comparative example of FIG. 41 are laid down tightly without forming a gap.

While the foregoing explanation has been made for the case of a Dt-MOS transistor, the present embodiment is useful also in other semiconductor devices that uses a shared contact plug such as an SRAM.

According to an embodiment of the semiconductor device, it becomes possible to shrink or eliminate the contact plug and it becomes possible to shrink the size of the semiconductor device.

Thus, the present disclosures have been described herein with reference to preferred embodiments. While the present disclosures have been shown and described with particular examples, it should be understood that various changes and modifications may be made to the particular examples without departing from the scope of the broad spirit and scope of the present disclosures as defined in the claims.

All examples and conditional language used herein are intended for pedagogical purposes to aid the reader in understanding the principles of the disclosures and the concepts contributed by the inventor to furthering the art, and are to be construed as being without limitation to such specifically recited examples and conditions, nor does the organization of such examples in the specification relate to a showing of the superiority or inferiority of the disclosures. Although the embodiment of the present disclosures has been described in detail, it should be understood that various changes, substitutions, and alterations could be made hereto without departing from the spirit and scope of the disclosures.

What is claimed is:

1. A semiconductor device comprising:
   a semiconductor substrate including a first area;
   a gate electrode formed over said first area of said semiconductor substrate;
   a first active region formed in said first area of said semiconductor substrate at a lateral side of said gate electrode;
   a first silicide layer formed at least on a sidewall surface of said gate electrode, said first silicide layer being electrically connected to said first active region;
   a second silicide layer, that is electrically connected to said first silicide layer, formed on a surface of said first active region; and
   a contact via-plug formed on said second silicide layer and connected to said first silicide layer and said second silicide layer, wherein
   said sidewall surface includes a first sidewall surface and a second sidewall surface that faces said first sidewall surface, and
   said first silicide layer is formed at said first sidewall surface and said second sidewall surface.

2. A semiconductor device comprising:
   a semiconductor substrate that includes a first area;
   a gate electrode formed over said first area of said semiconductor substrate;
   a first active region formed in said first area of said semiconductor substrate at a lateral side of said gate electrode;
   a first silicide layer formed at least on a sidewall surface of said gate electrode, said first silicide layer being electrically connected to said first active region;
   a second silicide layer, that is electrically connected to said first silicide layer, formed on a surface of said first active region; and
   a gap between said gate electrode and a surface of said semiconductor substrate at respective lateral sides of said gate insulation film,
   wherein said first silicide layer and said second silicide layer are formed continuously, and
   said second silicide layer is formed in said gap.

3. A semiconductor device comprising:
   a semiconductor substrate that includes a first area and a second area;
   a gate electrode, that extends over said first area and second area, formed over said first area of said semiconductor substrate;
   a first active region formed in said first area of said semiconductor substrate at a lateral side of said gate electrode;
   a first silicide layer formed at least on a sidewall surface of said gate electrode, said first silicide layer being electrically connected to said first active region;
   a channel region formed in said second area of said semiconductor substrate in electrical connection with said first active region, said channel region is located under said gate electrode; and
   second active regions formed in said second area of said semiconductor substrate, said channel region is located between said second active regions.

4. The semiconductor device as claimed in claim 2, wherein said gate electrode includes polysilicon and said first silicide layer includes nickel.

5. The semiconductor device as claimed in claim 3, wherein said semiconductor substrate further includes a device isolation region located between said first area and said second area, and
   further comprising:
   a device isolation insulation film formed in said device isolation region of said semiconductor substrate, and
   a conductive region formed in said semiconductor substrate underneath said device isolation insulation film, said channel region being electrically connected to said first active region via said conductive region.

6. The semiconductor device as claimed in claim 3, wherein
   said semiconductor device includes a plurality of transistors each including said first area and said second area,
   said first area has a first width in a first direction,
   said second area has a second width larger than said first width in said first direction,
   said plurality of transistors include a first transistor, a second transistor and a third transistor,
   said first area of said first transistor, said first area of said second transistor and said first area of said third transistor are aligned in said first direction,
   said first area of said third transistor is located between said first area of said first transistor and said first area of said second transistor, said second area of said first transistor and said second area of said second transistor are located with an offset respectively from said first area of said first transistor and said first area of said second transistor in a second direction perpendicular to said first direction on a surface of said semiconductor substrate, and said second region of said third transistor is located with an offset from said first area of said third transistor in a third direction opposite to said second direction.

7. The semiconductor device as claimed in claim 2, further comprising a wiring pattern extending in said first active region over said gate electrode without contacting said gate electrode.

8. The semiconductor device as claimed in claim 7, wherein said wiring pattern is a power wiring pattern.

* * * * *